(12) United States Patent
Zheng

(10) Patent No.: US 11,251,374 B2
(45) Date of Patent: Feb. 15, 2022

(54) NANOTUBE SPECTROMETER ARRAY AND MAKING A NANOTUBE SPECTROMETER ARRAY

(71) Applicant: Government of the United States of America, as represented by the Secretary of Commerce, Gaithersburg, MD (US)

(72) Inventor: Ming Zheng, Rockville, MD (US)

(73) Assignee: GOVERNMENT OF THE UNITED STATES OF AMERICA, AS REPRESENTED BY THE SECRETARY OF COMMERCE, Gaithersburg, MD (US)

(*) Notice: Subject to any disclaimer, the term of this patent is extended or adjusted under 35 U.S.C. 154(b) by 0 days.

(21) Appl. No.: 17/066,565

(22) Filed: Oct. 9, 2020

(65) Prior Publication Data

US 2021/0111349 A1 Apr. 15, 2021
US 2021/0399225 A9 Dec. 23, 2021

Related U.S. Application Data

(60) Provisional application No. 62/913,294, filed on Oct. 10, 2019.

(51) Int. Cl.
*B82Y 20/00* (2011.01)
*H01L 51/00* (2006.01)
(Continued)

(52) U.S. Cl.
CPC ........ *H01L 51/0048* (2013.01); *G01J 3/0294* (2013.01); *G01J 3/2803* (2013.01); *B82Y 20/00* (2013.01)

(58) Field of Classification Search
CPC .... H01L 51/0048; G01J 3/0294; G01J 3/2803
See application file for complete search history.

(56) References Cited

U.S. PATENT DOCUMENTS

| 9,545,584 B2 | 1/2017 | Khripin et al. | |
| 2004/0027889 A1* | 2/2004 | Occhipinti | G11B 9/1472 365/202 |

(Continued)

OTHER PUBLICATIONS

Suoming Zhang,"Bolometric-Effect-Based Wavelength-Selective Photodetectors Using Sorted Single Chirality Carbon Nanotubes", Sep. 23, 2015 (Year: 2015).*

(Continued)

*Primary Examiner* — Maurice C Smith
(74) *Attorney, Agent, or Firm* — Office of Chief Counsel for National Institute of Standards and Technology

(57) ABSTRACT

A nanotube spectrometer array includes: a substrate including block receivers; photodetectors arranged in an array with each photodetector including: a single wall carbon nanotube disposed on the substrate in a block receiver and disposed laterally along the block receiver; a source electrode on the single wall carbon nanotube; a drain electrode on the single wall carbon nanotube, such that the source and drain electrodes are separated from each other by a photoreceiver portion of the single wall carbon nanotube; and a gate electrode disposed on the substrate such that substrate is interposed between the gate electrode and the single wall carbon nanotube. The single wall carbon nanotube in each photodetector is a different chirality so that each photodetector absorbs light with a maximum photon absorptivity at a difference wavelength that is based on the chirality of the single wall carbon nanotube of the photodetector.

15 Claims, 64 Drawing Sheets
Specification includes a Sequence Listing.

(51) Int. Cl.
G01J 3/02 (2006.01)
G01J 3/28 (2006.01)

(56) References Cited

U.S. PATENT DOCUMENTS

| | | | | |
|---|---|---|---|---|
| 2006/0158760 A1* | 7/2006 | Ambrosio | ............ | G11C 13/047 359/883 |
| 2010/0127242 A1* | 5/2010 | Zhou | ...................... | B82Y 10/00 257/24 |
| 2011/0155649 A1* | 6/2011 | Mazur | ................... | B82B 3/0071 209/3 |
| 2012/0186635 A1* | 7/2012 | Eastman | ................ | B82Y 20/00 136/252 |

OTHER PUBLICATIONS

Serhii Shafraniuk,"Multispectral Detector Based On an Array of Carbon-Nanotube Quantum Wells", 2009 (Year: 2009).*
Steve Park, "Significant Enhancement of Infrared Photodetector Sensitivity Using a Semiconducting Single-Walled Carbon Nanotube/C 60 Phototransistor"2014 WILEY-VCH Verlag GmbH & Co. KGaA, Weinheim (Year: 2014).*
Xiaowei He, "Uncooled Carbon Nanotube Photodetectors", Advanced Optical Materials, 2015 (Year: 2015).*
Jun Cao,"Scalable Production of Graphene/Semiconducting Single-Wall Carbon Nanotube Film Schottky Broadband Photodiode Array with Enhanced Photoresponse", Nov. 23, 2018 (Year: 2018).*

* cited by examiner

NANOTUBE SPECTROMETER ARRAY AND MAKING A NANOTUBE SPECTROMETER ARRAY

CROSS REFERENCE TO RELATED APPLICATIONS

The application claims priority to U.S. Provisional Patent Application Ser. No. 62/913,294 filed Oct. 10, 2019, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 20-003US1.

SEQUENCE LISTING

This application contains a Sequence Listing. CD-ROM discs Copy 1 and Copy 2 are identical, contain a copy of the Sequence Listing under 37 CFR Section 1.821 (e), and are read-only memory computer-readable compact discs. Each CD-ROM disc contains a copy of the Sequence Listing in ASCII text format. The Sequence Listing is named "20_003US1 Sequence Listing_ST25.txt." The copies of the Sequence Listing on the CD-ROM discs are hereby incorporated by reference in their entirety.

BRIEF DESCRIPTION

Disclosed is a nanotube spectrometer array comprising: a substrate comprising a plurality of block receivers; a plurality of photodetectors arranged in an array, each photodetector comprising: a single wall carbon nanotube disposed on the substrate in a block receiver, such that the single wall carbon nanotube is disposed laterally along the block receiver; a source electrode disposed on a first terminus of the single wall carbon nanotube; a drain electrode disposed on a second terminus of the single wall carbon nanotube, such that the source electrode and the drain electrode are separated from each other by a photoreceiver portion of the single wall carbon nanotube; and a gate electrode disposed on the substrate such that substrate is interposed between the gate electrode and the single wall carbon nanotube, wherein the single wall carbon nanotube in each photodetector comprises a different chirality, so that each photodetector absorbs light with a maximum photon absorptivity at a difference wavelength that is based on the chirality of the single wall carbon nanotube of the photodetector.

Disclosed is a process for making a nanotube spectrometer array, the process comprising: providing a composition comprising a plurality of nanocomposites disposed in a solvent, individual nanocomposites comprise a single wall carbon nanotube and a surfactant disposed on the single wall carbon nanotube, and the single wall carbon nanotube of the nanocomposites in the composition comprise a plurality of chiralities; subjecting the composition to compositional separation such that the nanocomposites are separated based on chirality of the single wall carbon nanotubes into separate single chirality products, such that each single chirality product: comprises single wall carbon nanotubes consisting essentially of a single chirality disposed in solvent, and has a different chirality of single wall carbon nanotubes; independently, for each or a selected single chirality product: adding single stranded DNA and surfactant solubilizing agent to the single chirality product, wherein a nucleobase sequence of the single stranded DNA added is different for each single chirality product so that each different chirality is present with single stranded DNA that has different nucleobase sequence; removing the surfactant from the single wall carbon nanotube with the surfactant solubilizing agent; and disposing, after removing the surfactant, the single stranded DNA on the single wall carbon nanotube to form ssDNA-wrapped SWCNT comprising the single stranded DNA disposed on the single wall carbon nanotube, such that each different chirality has disposed on the single wall carbon nanotube the single stranded DNA with different nucleobase sequence; making a scaffold that comprises DNA arranged in alternating walls separated by a trench between neighboring walls, the trench bounded by walls and a floor; forming single stranded DNA anchor disposed on the floor; contacting the floor with the single chirality products; hybridizing the ssDNA-wrapped SWCNT to the single stranded DNA anchor when a nucleotide base sequence of the ssDNA-wrapped SWCNT complements a nucleotide base sequence of single stranded DNA anchor; forming a duplex DNA from hybridizing to anchor the ssDNA-wrapped SWCNT to the floor such that the ssDNA-wrapped SWCNT is laterally disposed along the floor in the trench to form a unit cell; such that a DNA nanotube block is formed and comprises an array of unit cells; forming a plurality of photodetectors arranged in array by: disposing the DNA nanotube block on a substrate, the substrate comprising a block receiver; receiving the DNA nanotube block in the block receiver; removing the scaffold and DNA nanotube block from the single wall carbon nanotube to provide the single wall carbon nanotube disposed in the block receiver; forming a source electrode on a first terminus of the single wall carbon nanotube; forming a drain electrode on a second terminus of the single wall carbon nanotube, the first terminus separated from the second terminus by a photoreceiver portion of the single wall carbon nanotube, wherein each photodetector comprises the single wall carbon nanotube, the second terminus, and the drain electrode disposed on the substrate, to make the nanotube spectrometer array that comprises the plurality of photodetectors arranged in the array.

BRIEF DESCRIPTION OF THE DRAWINGS

The following description should not be considered limiting in any way. With reference to the accompanying drawings, like elements are numbered alike.

DETAILED DESCRIPTION

A detailed description of one or more embodiments is presented herein by way of exemplification and not limitation.

It has been discovered that a nanotube spectrometer array and processes disclosed herein provide a plurality of photodetectors that each include single wall carbon nanotubes having unique chirality such that each photodetector in the nanotube spectrometer array detects a unique wavelength of light.

A carbon nanotube (CNT) is a family of one-dimensional (D) molecules with diverse atomic and electronic structures. Each type of CNT has unique properties. Chirality maps for CNTs provide a way of showing structural diversity. Each CNT has a helicity and handedness.

To overcome the diversity of structures in a sample of CNTs through purification, sorting CNTs can be accomplished as disclosed in U.S. Pat. No. 9,545,584 for Fractionating Nanomaterials by A Liquid Multiphase Composition, the disclosure of which is incorporated by reference in its entirety. DNA is a powerful tool for such fractation, wherein interaction of DNA and CNT is dependent on helicity and handedness of CNT and on DNA sequences. Taking advantage of such interaction, CNTs are purified with by handedness and helicity. Moreover, such process purifies both surfactant-coated CNTs and DNA-coated CNTs through a difference in solvation energy or hydrophobicity of different CNTs. For DNA-wrapped CNTs, a solvation energy spectrum for a mixture of CNTs is determined by a sequence of nucleotide bases of the DNA.

The nanotube spectrometer array disclosed herein is also referred to as a photon perceptron array that can operate as a photon perceptron or artificial eye. The photo response of a CNT is related to its absorption spectrum and varies from CNT to CNT. An array of CNTs with known structures can be disposed on a substrate to form a spectrometer in an area, e.g., of one square micron, and such a spectrometer can cover a spectral range, e.g., from UV to near IR and THz with quasi metallic CNTs that have milli-electron volt (meV) band gap. An array of such spectrometers can be disposed on a wafer for spectral imaging and can arise from deterministic placement of CNTs of different chiralities. In this respect, DNA origami technology can be combined with DNA-wrapped CNTs with a DNA block that can place DNA wrapped CNTs in a parallel arrangement with a pitch of separation that is controlled with a nanometer-scale precision. A FET device is made by removing the DNA for electrical contact with CNT.

Figure 1:
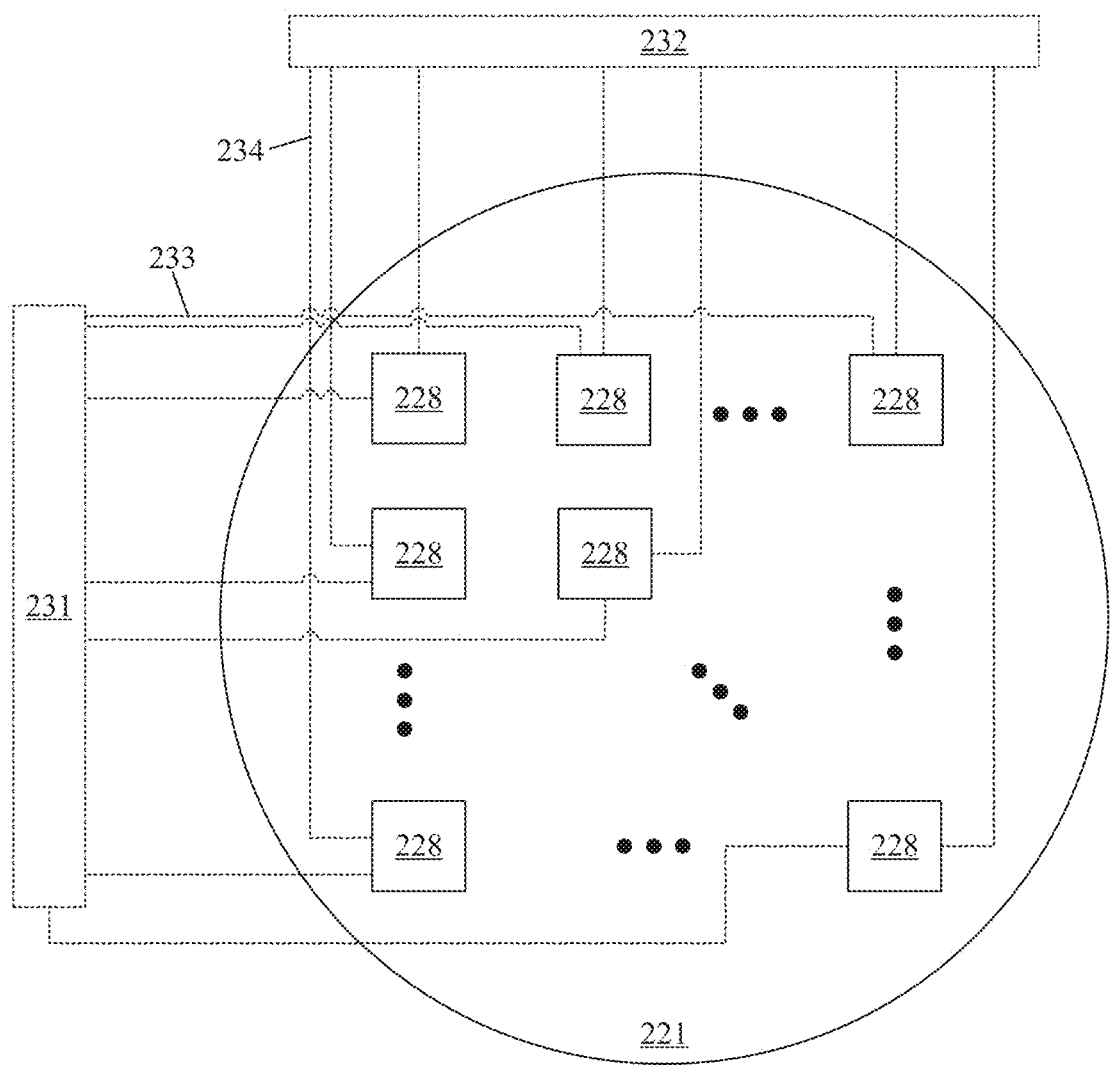
FIG. 1 shows a nanotube spectrometer array.
Figure 2:
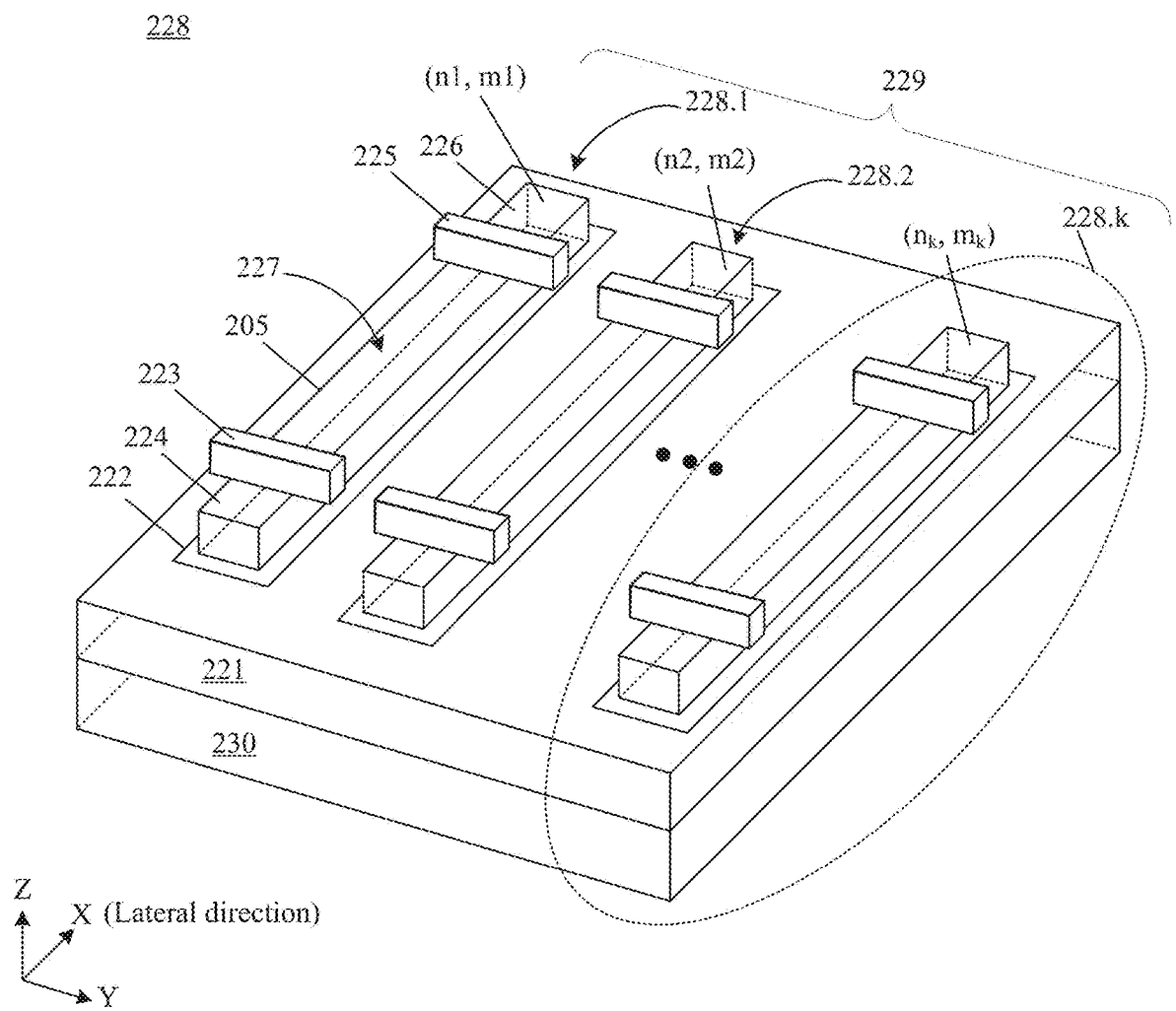
FIG. 2 shows a perspective view of a photodetector.
Figure 3:
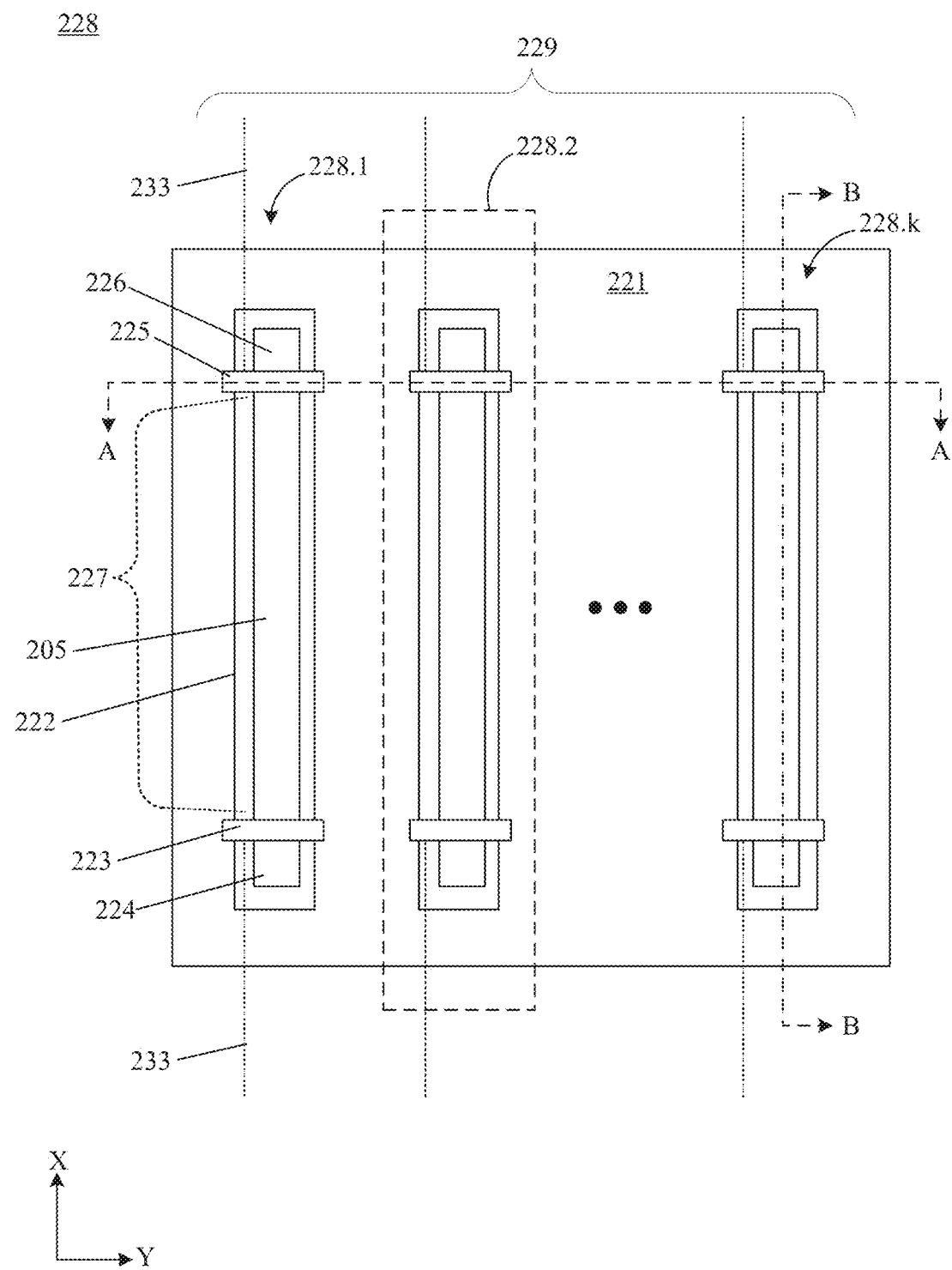
FIG. 3 shows a plan view of the photodetector shown in FIG. 2.
Figure 4:
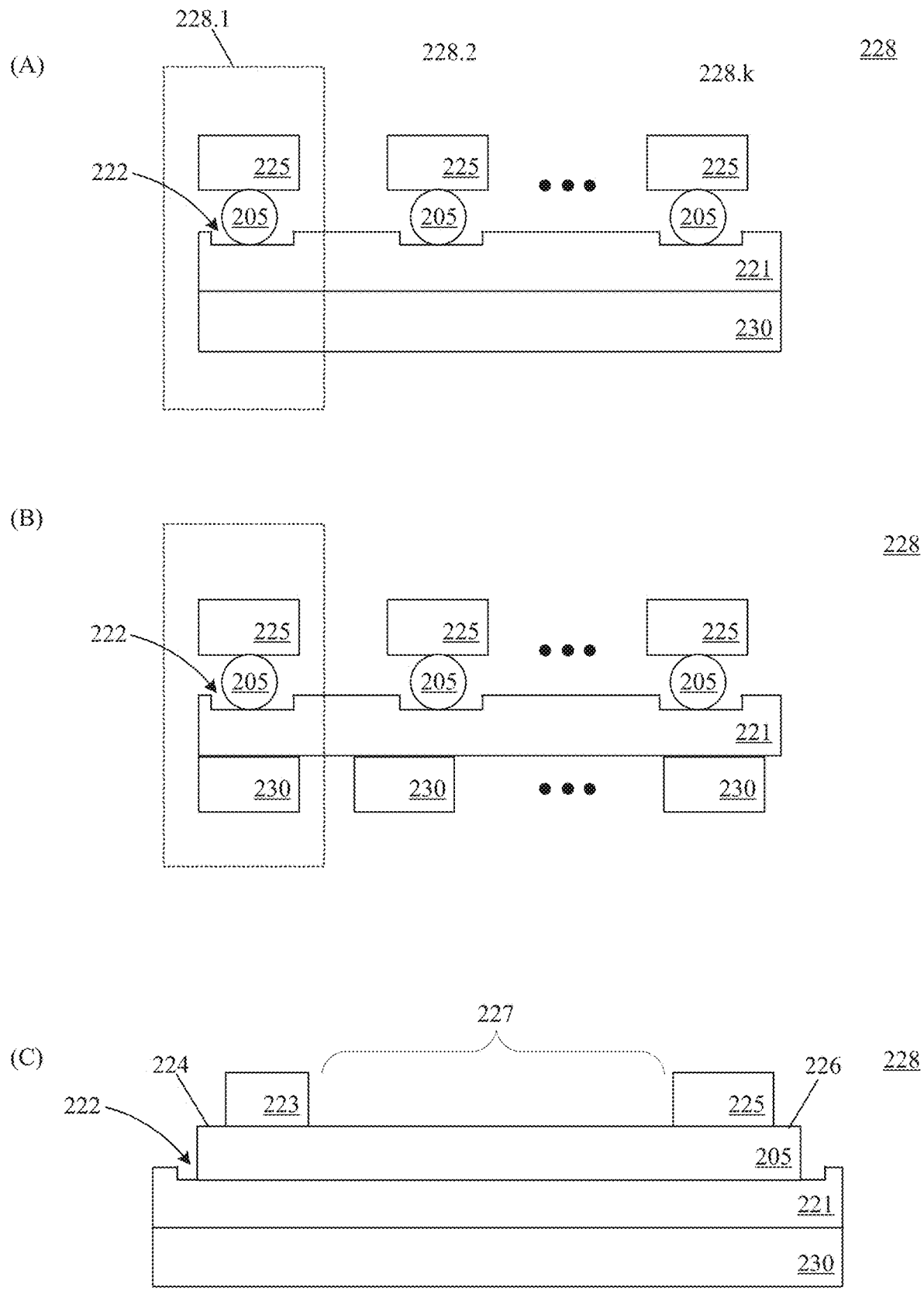
FIG. 4 shows: (A) a cross-section along line A-A of an embodiment of a photodetector shown in FIG. 3; (B)) a cross-section along line A-A of an embodiment of a photodetector shown in FIG. 3; (C) a cross-section along line B-B of the photodetector shown in FIG. 3.
Figure 5:
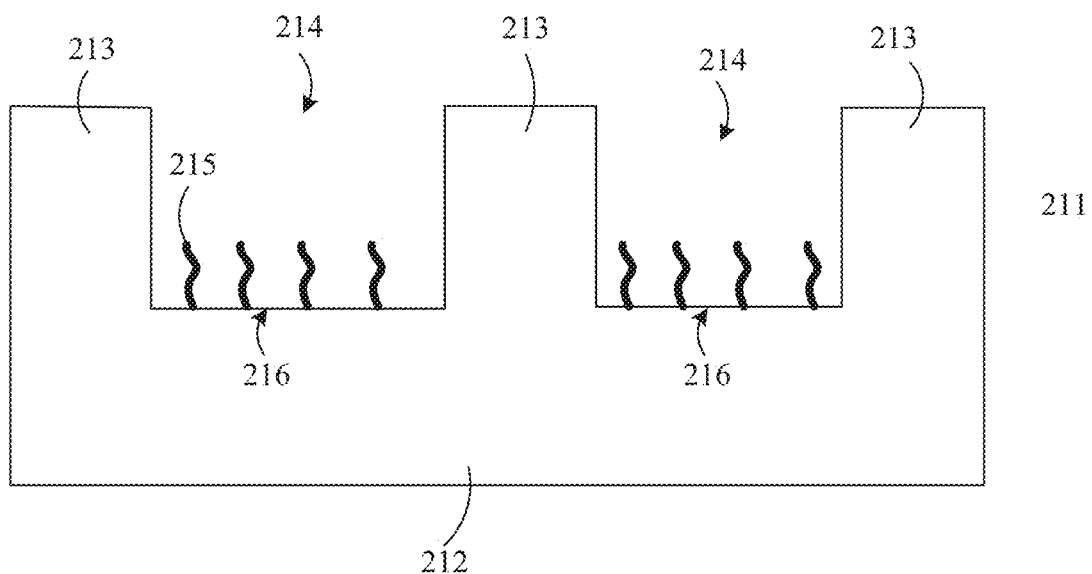
FIG. 5 shows a cross-section of a scaffold.
Figure 6:
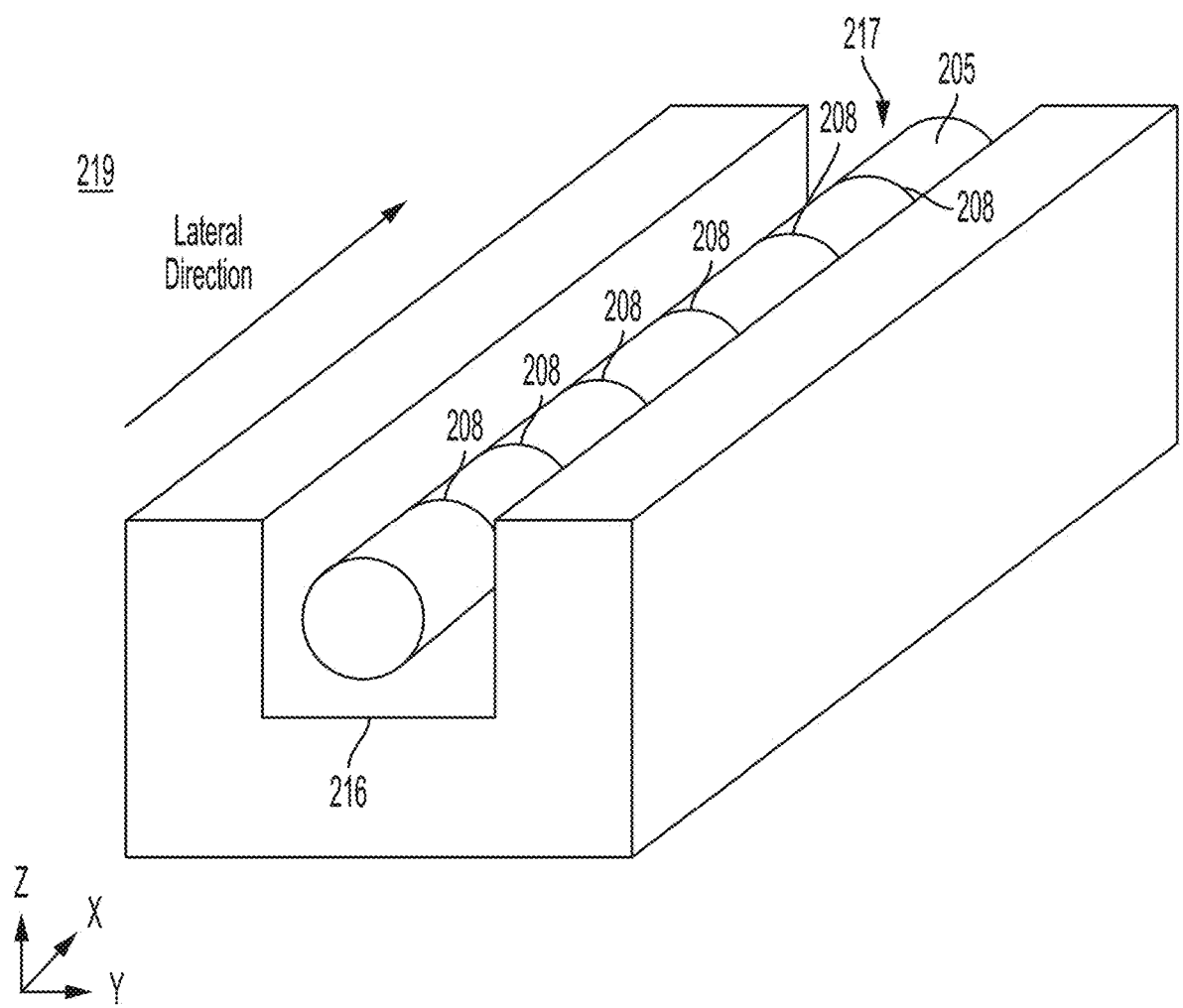
FIG. 6 shows bundles that represent the sidewall and the bottom layer, respectively, within a feature-repeating unit of trench-like DNA templates. Arrows indicate extension directions of the repeating units.
Figure 7:
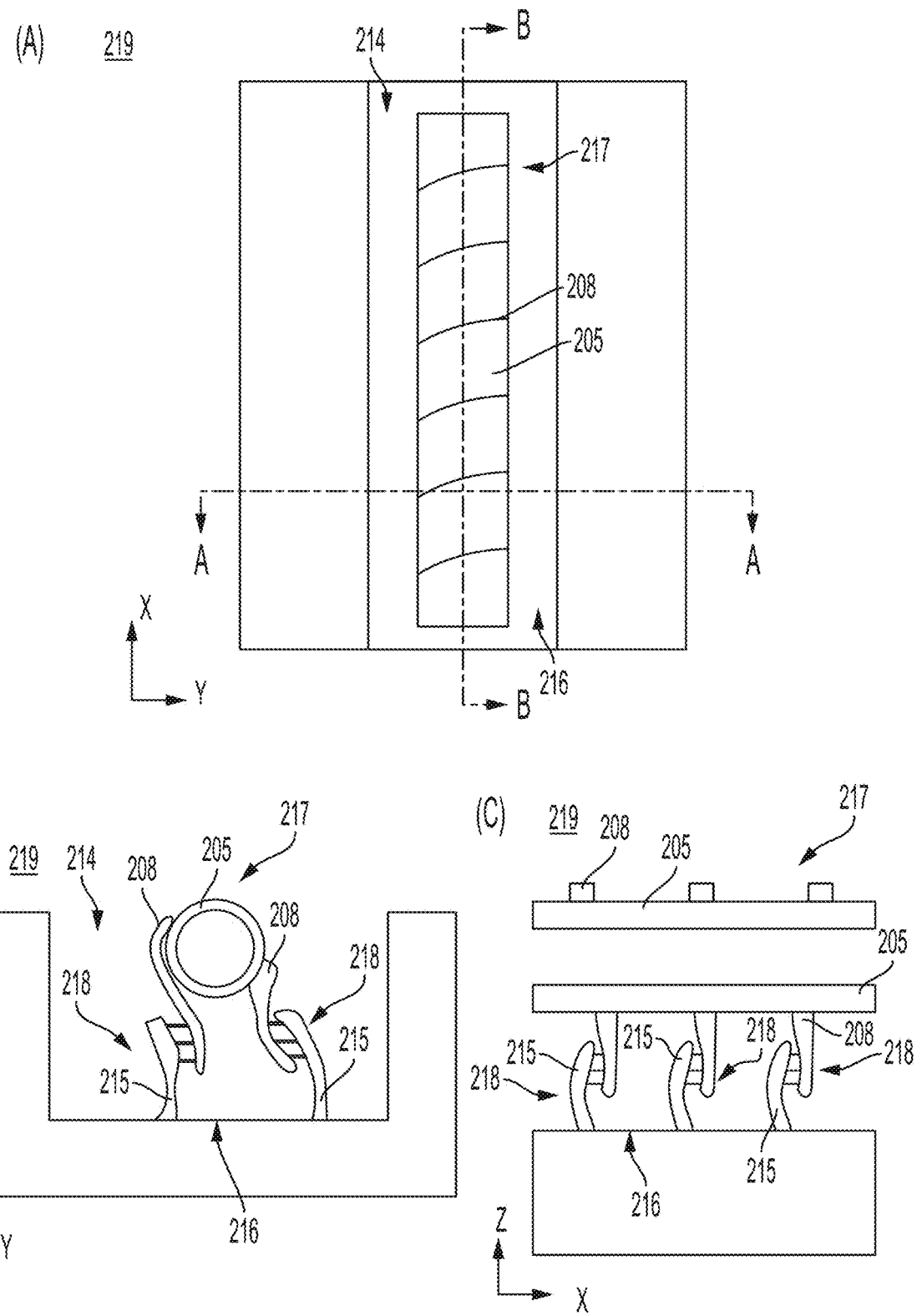
FIG. 7 shows a perspective view of a unit cell for making a nanotube spectrometer array.

Nanotube spectrometer array 200 provides broad spectral absorption for photodetection over a broad range of photon wavelength that can be selected through selectively including specific chiralities of single wall CNTs (SWCNTs). In an embodiment, with reference to FIG. 1, FIG. 2, FIG. 3, and FIG. 4, nanotube spectrometer array 200 includes: substrate 221 comprising a plurality of block receivers 222; a plurality of photodetectors 228 arranged in array 229, each photodetector 228 comprising: single wall carbon nanotube 205 disposed on substrate 221 in block receiver 222, such that single wall carbon nanotube 205 is disposed laterally along block receiver 222; source electrode 223 disposed on first terminus 224 of single wall carbon nanotube 205; drain electrode 225 disposed on second terminus 226 of single wall carbon nanotube 205, such that source electrode 223 and drain electrode 225 are separated from each other by photoreceiver portion 227 of single wall carbon nanotube 205; and gate electrode 230 disposed on substrate 221 such that substrate 221 is interposed between gate electrode 230 and single wall carbon nanotube 205, wherein single wall carbon nanotube 205 in each photodetector 228 comprises a different chirality, so that each photodetector 228 absorbs light with a maximum photon absorptivity at a difference wavelength that is based on the chirality of single wall carbon nanotube 205 of photodetector 228. With reference to FIG. 2, it should be appreciated that single wall carbon nanotubes 205 have different chirality (n, m), wherein a number of single wall carbon nanotubes can be from 1 to k for integer k that can be, e.g., from 1 to 1000, although an upper range of k is not limited but can be selected based on bands of absorption of wavelengths of single wall carbon nanotubes 205 and a range of wavelength detection desired for nanotube spectrometer array 200. Accordingly, for k number of single wall carbon nanotubes 205, chiralities of single wall carbon nanotubes 205 can be (n1, m1), (n2, m2), . . . , ($n_k$, $m_k$). Likewise, for k number of single wall carbon nanotubes 205, nanotube spectrometer array 200 can include k number of photodetectors 228 as shown in FIG. 3.

In an embodiment, photodetector 228 is in electrical communication with drain controller 231 via drain wire 233 and in electrical communication with gate controller 232 via gate wire 234. Here, drain controller 231 provides electrical current to source electrode 223 and receives drain current from drain electrode 225. Gate controller 232 provides an electrical bias to gate electrode 230 to activate single wall carbon nanotube 205 to flow electrical current from absorption of a photon from source electrode 223 to drain electrode 225. According to an embodiment, photodetectors 228 are individually and independently controlled and addressed through drain controller 231 and gate controller 232.

In an embodiment, single wall carbon nanotubes 205 in adjacent photodetectors 228 are arranged parallel to one another but angle between adjacent single wall carbon nanotubes 205 can be arbitrary and selected to effect a desired device response. In an embodiment, single wall carbon nanotubes 205 include an E11 to E44 photoabsorption from 200 nm to 2000 nm. For detecting various ranges of wavelengths by nanotube spectrometer array 200, nanotube spectrometer array 200 can include from 2 to 200 different chiralities of single wall carbon nanotubes 205. For spatial detection of phootons, a separation pitch of single wall carbon nanotubes 205 can be selected; e.g., the separation pitch of single wall carbon nanotubes 205 in adjacent photodetectors 228 can be from 10 nm to 100 nm. Nanotube spectrometer array 200 can include from 2 to 200 different chiralities of single wall carbon nanotubes 205. A size of nanotube spectrometer array 200 can be made for a particular application or environment of application, such as photodetectors 228 covering a surface area from 0.1 $\mu m^2$ to 100 $\mu m^2$.

Components of nanotube spectrometer array 200 can be made from and include various materials. Substrate 221 can be a material on which other elements, e.g., single wall carbon nanotube 205, can be formed. Substrate 221 can include an element from group III, IV, or V of the periodic table such as silicon, germanium, and the like or combination of such elements. To provide a selected electrical conductivity, e.g., to provide electrical insulation between photodetectors 228, substrate 221 can be, e.g., silicon dioxide.

Single wall carbon nanotube 205 are disposed on substrate 221 and independently can absorb photons, such that individual single wall carbon nanotubes 205 absorb different wavelengths of light. To produce purified chiralities of single wall carbon nanotubes 205, a composition that includes single wall carbon nanotube 205 having a plurality of different chiralities of SWCNTs is subjected to fractionation. The fractionatation occurs according to the processes described in U.S. Pat. No. 9,545,584.

According to an embodiment, the composition (also referred to as nanoparticle composition) subject to fractionating includes the first nanoparticles and the second nanoparticles, collectively referred to hereafter as "the nanoparticles" for convenience. In some embodiments, the first nanoparticles and the second nanoparticles are a carbon allotrope, a derivatized carbon allotrope, or a combination comprising at least one of the foregoing. In an embodiment, the nanoparticles are SWCNTs. Moreover, SWCNTs can include metallated CNTs. It should be appreciated that single wall carbon nanotube 205 are tubular fullerene-like structures having open or closed ends and which are inorganic and made entirely or partially of carbon or another atom (e.g., boron, nitrogen, and the like). In an embodiment, single wall carbon nanotube 205 include additional components such as metals or metalloids, which are incorporated into the structure of single wall carbon nanotube 205, included as a dopant, form a surface coating, or a combination of at least one of the foregoing.

As used herein, the term "carbon nanotube" refers to a variety of hollow, partially filled, or filled forms of rod-shaped and toroidal-shaped hexagonal graphite layers. Filled carbon nanotubes include carbon nanotubes that contain various other atomic, molecular, or atomic and molecular species within its interior. A carbon nanotube that has a hollow interior can be filled with a non-carbon material using wet chemistry techniques to produce a filled carbon nanotube.

CNTs can be imagined as a cylindrical, rolled-up rectangular strip of graphene. CNTs can have one of several geometrical arrangements of the lattice carbon atoms In general, single-walled nanotubes are distinguished from each other by a double index (n, m), where n and m are integers that describe how to cut a strip of graphene such that its edges join seamlessly when the strip is wrapped onto a surface of a cylinder. For (n, n)-SWCNTs, the resultant SWCNT is an "arm-chair" SWCNT. The label "arm chair" indicates that, when the SWCNT is cut perpendicularly to the tube axis, only the sides of the hexagons (from the graphene hexagonal carbon lattice) are exposed, and their pattern around a periphery of the tube edge resembles the arm and seat of an arm chair repeated n times. For (n, m=0), the resultant SWNT is "zigzag" or (n,0)-SWNT, and the label "zigzag" indicates that, when the tube is cut perpendicular to the tube axis, the atoms located at the edge of the tube have a zigzag arrangement. For (n≠m, m≠0), the resulting SWCNT has chirality. Chiral SWCNTs have a left-handed or a right-handed screw axis, like DNA. Nanocone SWCNTs have a first end of larger diameter than a diameter of its other end. SWCNTs in which the ends attach to each other form a torus shape referred to as a nanotoroid.

Furthermore, the electronic properties of SWCNTs are dependent on their conformation. It should be appreciated that the electronic properties give rise to electronic transitions and electronic band structures in the SWCNTs that govern absorption of photons and that support electrical current conduction. Allowed electronic wave functions of SWCNTs are different from an infinite two-dimensional electronic system of graphene or a hexagonal graphite monolayer. A periodic boundary condition exists in SWCNTs for propagation of electrons around the circumference of the SWCNT. As such, SWCNTs have a different electronic band structure for different conformations of SWCNTs. Consequently, SWCNTs are either metallic (which are highly electrically conductive) or are semiconducting (which have a bandgap from a few millielectron volts (meV) to one electron volt (eV)). For n=m or n–m a multiple of three, the SWCNT is metallic. For any other n, m combination, the SWCNT is semiconducting. Accordingly, armchair single wall carbon nanotube 205 are metallic and have an extremely high electrical conductivity.

Carbon atoms in single wall carbon nanotube 205 can be displaced or substituted by another element. In an embodiment, single wall carbon nanotube 205 can include a metal or metalloid oxide such as silica, alumina, titania, tungsten oxide, iron oxides, combinations thereof, or the like, a metal or metalloid carbide such as tungsten carbide, silicon carbide, boron carbide, or the like; a metal or metalloid nitride such as titanium nitride, boron nitride, silicon nitride, or the like; or a combination comprising at least one of the foregoing.

In some embodiments, single wall carbon nanotube 205 can include a metal such as an alkali metal, an alkaline earth metal, an inner transition metal (a lanthanide or actinide), a transition metal, or a post-transition metal. Examples of such metals include magnesium, aluminum, iron, tin, titanium, platinum, palladium, cobalt, nickel, vanadium, chromium, manganese, cobalt, nickel, zirconium, ruthenium, hafnium, tantalum, tungsten, rhenium, osmium, alloys thereof, or a combination comprising at least one of the foregoing. In other embodiments, single wall carbon nanotube 205 include those coated with one or more layers of metals such as iron, tin, titanium, platinum, palladium, cobalt, nickel, vanadium, alloys thereof, or a combination including at least one of the foregoing.

According to an embodiment, single wall carbon nanotube 205 are a carbon allotrope, a derivatized carbon allotrope, or a combination comprising at least one of the foregoing. Derivatized single wall carbon nanotube 205 include functionalized carbon allotropes or carbon atom deletion or substitution with another atom, e.g., a nonmetal (e.g., O, N, P, S, F, and the like), a metal, a metalloid, a poor metal, and the like. Single wall carbon nanotube 205 can be derivatized to include a variety of different functional groups such as, for example, carboxy (e.g., carboxylic acid groups), epoxy, ether, ketone, amine, hydroxy, alkoxy, alkyl, aryl, aralkyl, alkaryl, lactone, functionalized polymeric or oligomeric groups, and the like. In an embodiment, single wall carbon nanotubes 205 include a combination of derivatized single wall carbon nanotubes 205 and underivatized single wall carbon nanotubes 205. For example, the surface or edges of single wall carbon nanotube 205 is derivatized to increase dispersibility in or interaction with the polymers. The derivatized single wall carbon nanotube 205 can be hydrophilic, hydrophobic, oxophilic, lipophilic, or can possess a combination of these properties to provide a balance of desirable net properties by incorporation of a functional group. According to an embodiment, single wall carbon nanotube 205 is derivatized to include a functional group that is hydrophilic, hydrophobic, oxophilic, lipophilic, or oleophilic.

In an exemplary embodiment, single wall carbon nanotube 205 is derivatized by, e.g., amination to include amine groups, where amination may be accomplished by nitration followed by reduction, or by nucleophilic substitution of a leaving group by an amine, substituted amine, or protected amine, followed by deprotection as necessary. In another embodiment, single wall carbon nanotube 205 is derivatized by oxidative methods to produce an epoxy, hydroxy group or glycol group using a peroxide, or by cleavage of a double bond by for example a metal mediated oxidation such as a permanganate oxidation to form ketone, aldehyde, or carboxylic acid functional groups.

Where the functional groups are alkyl, aryl, aralkyl, alkaryl, functionalized polymeric or oligomeric groups, or a combination of these groups, the functional groups are attached through intermediate functional groups (e.g., carboxy, amino) or directly to the derivatized nanoparticle by a carbon-carbon bond without intervening heteroatoms, a carbon-oxygen bond (where the nanoparticle contains an oxygen-containing functional group such as hydroxy or carboxylic acid), or by a carbon-nitrogen bond (where the nanoparticle contains a nitrogen-containing functional group such as an amine or an amide). In an embodiment, the nanoparticle can be derivatized by metal mediated reaction with a C6-30 aryl or C7-30 aralkyl halide (F, Cl, Br, I) in a carbon-carbon bond forming step, such as by a palladium-mediated reaction such as the Stille reaction, Suzuki coupling, or diazo coupling or by an organocopper coupling reaction.

In another embodiment, single wall carbon nanotube 205 is directly metallated by reaction with e.g., an alkali metal such as lithium, sodium, or potassium, followed by reaction with a C1-30 alkyl or C7-30 alkaryl compound with a leaving group such as a halide (Cl, Br, I) or other leaving group (e.g., tosylate, mesylate, etc.) in a carbon-carbon bond forming step. The aryl or aralkyl halide (or the alkyl or alkaryl compound) can be substituted with a functional group such as hydroxy, carboxy, ether, or the like. Exemplary groups include hydroxy groups, carboxylic acid groups, alkyl groups such as methyl, ethyl, propyl, butyl, pentyl, hexyl, octyl, dodecyl, octadecyl, and the like; aryl groups including phenyl and hydroxyphenyl; alkaryl groups such as benzyl groups attached via the aryl portion, such as in a 4-methylphenyl, 4-hydroxymethylphenyl, or 4-(2-hydroxyethyl)phenyl (also referred to as a phenethylalcohol) group, or the like, or aralkyl groups attached at the benzylic (alkyl) position such as found in a phenylmethyl or 4-hydroxyphenyl methyl group, at the 2-position in a phenethyl or 4-hydroxyphenethyl group, or the like.

In another embodiment, single wall carbon nanotube 205 is further derivatized by grafting certain polymer chains to the functional groups. For example, polymer chains such as acrylic chains having carboxylic acid functional groups, hydroxy functional groups, or amine functional groups; polyamines such as polyethyleneamine or polyethyleneimine; or poly(alkylene glycols) such as poly(ethylene glycol) and poly(propylene glycol) can be included by reaction with functional groups.

The degree of functionalization varies from 1 functional group for every 5 carbon centers to 1 functional group for every 100 carbon centers, depending on the functional group, and the method of functionalization.

Single wall carbon nanotube 205 can be produced by chemical vapor deposition such as high-pressure carbon monoxide conversion (HiPco), laser ablation, arc discharge, plasma torch, coalescence, or a catalytic processes. Synthetic methods for producing carbon nanotubes can produce single-walled and multi-walled carbon nanotubes with a distribution of chiralities and diameters. Certain nanoparticle syntheses produce multi-walled carbon nanotubes having an outer wall diameter from 0.9 nm to 100 nm and single-walled carbon nanotubes having a diameter from 0.5 nm to 3 nm. As such, many nanoparticle compositions include a plurality of different carbon nanotubes and carbonaceous impurities. Advantageously, the process for fractionating the composition separates single wall nanoparticles from other constituents in a mixture and also separates the single wall carbon nanotubes by chirality.

In an embodiment, the composition includes single wall carbon nanotubes 205 that have a different property including a length, chirality, handedness, (n,m) index, metallicity, or a combination including at least one of the foregoing. In some embodiments, single wall carbon nanotubes 205 include a functional group, which includes carboxy, epoxy, ether, ketone, amine, hydroxy, alkoxy, alkyl, aryl, aralkyl, alkaryl, lactone, a functionalized polymeric or oligomeric group, or a combination including at least one of the foregoing.

Various solvents can be used in the composition as described in U.S. Pat. No. 9,545,584.

Source electrode 223 and drain electrode 225 are electrically conductive and can be a metal (e.g., gold), an electrically conductive dopant disposed in a supporting matrix (e.g., an electrically conductive polymer disposed in polymer, glass, and the like), or thin film such as indium tin oxide. Gate electrode 230 can be disposed on substrate 221 to mediate electrical current conductivity across single wall carbon nanotube 205 from source electrode 223 to drain electrode 225. Gate electrode 230 can include an element from group III, IV, or V of the periodic table of elements or a combination thereof, e.g., silicon, binary semiconductors, ternary semiconductors and the like. Wires (e.g., drain wire 233, gate wire 234) interconnect electrodes (223, 225, 230) to controllers (e.g., 231, 232) for controlling independent operation of. Wire are electrically conductive and can be, e.g., gold. In an embodiment, as shown in panel A of FIG. 4, gate electrode 230 can be a continuous layer so that each photodetector 228 (e.g., first photodetector 228.1, second photodetector 228.2, . . . , k-th photodetector 228.k) are controlled by a common gate electrode 230. In an embodiment, as shown in panel B of FIG. 4, gate electrode 230 can be a segmented layer so that each photodetector 228 (e.g., first photodetector 228.1, second photodetector 228.2, . . . , k-th photodetector 228k) is independently controlled by a different gate electrode 230.

Nanotube spectrometer array 200 can be made in various ways. In an embodiment, with reference to FIG. 5, FIG. 6, FIG. 7, and FIG. 8, a process for making nanotube spectrometer array 200 includes: providing composition 201 including a plurality of nanocomposites 202 disposed in a solvent, individual nanocomposites 202 include single wall carbon nanotube 205 and surfactant 203 disposed on single wall carbon nanotube 205, and single wall carbon nanotube 205 of nanocomposites 202 in composition 201 include a plurality of chiralities; subjecting composition 201 to compositional separation such that nanocomposites 202 are separated based on chirality of single wall carbon nanotubes 205 into separate single chirality products, such that each single chirality product: includes single wall carbon nanotubes 205 consisting essentially of a single chirality disposed in solvent 204, and has a different chirality of single wall carbon nanotubes 205 than other single chirality products; independently, for each or a selected single chirality product: adding single stranded DNA 208 and a surfactant solubilizing agent to the single chirality product, wherein a nucleobase sequence of single stranded DNA 208 added is different for each single chirality product so that each different chirality is present with single stranded DNA 208 that has a different nucleobase sequence; removing the surfactant from single wall carbon nanotube 205 with the surfactant solubilizing agent; and disposing, after removing the surfactant, single stranded DNA 208 on single wall carbon nanotube 205 to form ssDNA-wrapped SWCNT 217 including single stranded DNA 208 disposed on single wall carbon nanotube 205, such that each different chirality has disposed on single wall carbon nanotube 205 the single stranded DNA 208 with the different nucleobase sequence; making scaffold 211 that includes DNA 212 arranged in alternating walls 213 separated by trench 214 between neighboring walls 213, trench 214 bounded by walls 213 and floor 216; forming single stranded DNA anchor 215 disposed on floor 216; contacting floor 216 with the single chirality products; hybridizing ssDNA-wrapped SWCNT 217 to single stranded DNA anchor 215 when a nucleotide base sequence of the ssDNA-wrapped SWCNT 217 complements a nucleotide base sequence of single stranded DNA anchor 215; forming duplex DNA 218 from hybridizing ssDNA-wrapped SWCNT 217 to single stranded DNA anchor 215 to anchor ssDNA-wrapped SWCNT 217 to floor 216 through duplex DNA 218, such that ssDNA-wrapped SWCNT 217 is laterally disposed along floor 216 in the trench 214 to form unit cell 219; such that DNA nanotube block 220 is formed and includes an array of unit cells 219; forming a plurality of photodetectors 228 arranged in array 229 by: disposing DNA nanotube block 220 on substrate 221, substrate 221 including block receiver 222; receiving DNA nanotube block 220 in block receiver 222; removing scaffold 211 and DNA nanotube block 220 from single wall carbon nanotube 205 to provide single wall carbon nanotube 205 disposed in block receiver 222; forming (e.g., by electron beam lithography) source electrode 223 on first terminus 224 of single wall carbon nanotube 205; forming (e.g., by electron beam lithography) drain electrode 225 on second terminus 226 of single wall carbon nanotube 205, first terminus 224 separated from second terminus 226 by photoreceiver portion 227 (that can have a length that is e.g., from 100 nm to 1000 nm along a lateral length of single wall carbon nanotube 205) of single wall carbon nanotube 205, wherein each photodetector 228 comprises single wall carbon nanotube 205, source electrode 223, and drain electrode 225 disposed on substrate 221, to make nanotube spectrometer array 200 that includes the plurality of photodetectors 228 arranged in array 229.

The process for making nanotube spectrometer array 200 also can include repetitively removing individual portions of the composition and independently collecting the single chirality products that include single wall carbon nanotubes 202 that include a single chirality as individual single chirality nanotubes disposed in a solvent.

Nanotube spectrometer array 200 and processes disclosed herein have numerous beneficial uses including imaging, dispersed absorption, time resolution studies, and the like. Advantageously, nanotube spectrometer array 200 overcomes limitations of technical deficiencies of conventional compositions in terms of spectrometer size, spatial resolution, and spectral range.

Beneficially, nanotube spectrometer array 200 includes the plurality of photodetectors 228, wherein each spectrometer 228 makes use of wavelength multiplexing for spectral reconstruction. Photodetectors 228 includes photodiodes of SWCNTs having different structures covering an optical response, e.g., from 200 nm to 2000 nm or greater (e.g., to a THz frequency). A footprint of a single spectrometer 228 can be one micrometer, which can be two orders of magnitude smaller than conventional spectrometers. Moreover, nanotube spectrometer array 200 provides high-density array of spectrometers 228. By selecting SWCNT 205 of proper handedness, nanotube spectrometer array 200 can perform circular dichroism measurements by each spectrometer 228. Nanotube spectrometer array 200 can be integrated with high-density SWCNT logic circuits to provide on-chip spectral measurement and signal processing. Moreover, fabrication of nanotube spectrometer array 200 can occur via purification of ~50 distinct single-chirality SWCNT species whose $E_{11}$ to $E_{44}$ van Hove transitions (or even higher-order van Hove transitions) absorption peaks span the range from 200 nm to 2000 nm. Length uniformity of purified SWCNTs can be controlled, and endohedral filling or covalent modification can be introduced to enhance optoelectronic response of purified SWCNTs. It is further contemplated that quasi-metallic SWCNTs can provide a THz photodetector 228. Moreover, spatial distribution of wavelength absorption along a surface of nanotube spectrometer array 200 can be accomplished by coating each single-chirality SWCNT species by a unique ssDNA sequence such that during disposition of ssDNA-wrapped SWCNT 217 in block receiver 222 is done site specifically with regard to an absorption spectrum of individual single wall carbon nanotubes 205 along a surface of nanotube spectrometer array 200. In this manner, design DNA brick or other types of DNA origami structures make DNA/SWCNT complexes as DNA nanotube blocks 220. Within each complex, DNA origami structures serve as the substrate to hold 50 SWCNTs of different (n, m) in parallel, e.g., with 20 nm tube-tube separation. This forms a basic unit of spectrometer 222 with a dimension of ~1 μm×1 μm. As a result, spectral imaging can be performed with so that cross-analysis of spectral and spatial information provides decomposition of detected photons. Due to its high-density and broad spectral coverage, nanotube spectrometer array 200 provides spectral imaging for many fields of science and technology and can be an artificial eye with full spectral response for artificial visual perception and object reconstruction with full chromaticity.

Nanotube spectrometer array 200 and processes herein unexpectedly exceed a minimum size limit achievable by conventional microfabrication process and conventional photo-detecting materials and provides much higher spatial resolution for spectral imaging.

The articles and processes herein are illustrated further by the following Examples, which are non-limiting.

EXAMPLES

Example 1. Precise Pitch-Scaling of Carbon Nanotube Arrays within Three-Dimensional DNA Nanotrenches Semiconducting carbon nanotubes (CNTs) are an attractive platform for field-effect transistors (FETs) because they potentially can outperform silicon as dimensions shrink. Challenges to achieving superior performance include creating highly aligned and dense arrays of nanotubes as well as removing coatings that increase contact resistance. Sun et al. aligned CNTs by wrapping them with single-stranded DNA handles and binding them into DNA origami bricks that formed an array of channels with precise intertube pitches as small as 10.4 nanometers. Zhao et al. then constructed single and multichannel FETs by attaching the arrays to a polymer-templated silicon wafer. After adding metal contacts across the CNTs to fix them to the substrate, they washed away all of the DNA and then deposited electrodes and gate dielectrics. The FETs showed high on-state performance and fast on-off switching.

Precise fabrication of semiconducting carbon nanotubes (CNTs) into densely aligned evenly spaced arrays is required for ultra-scaled technology nodes. We report the precise scaling of inter-CNT pitch using a supramolecular assembly method called spatially hindered integration of nanotube electronics Specifically, by using DNA brick crystal-based nanotrenches to align DNA-wrapped CNTs through DNA hybridization, we constructed parallel CNT arrays with a uniform pitch as small as 10.4 nanometers, at an angular deviation<2° and an assembly yield>95%.

Although conventional transistor lithography successfully scales the channel pitch (spacing between two adjacent channels within individual transistor) of bulk materials (that is, Si), the performance drops for patterning one-dimensional (1D) semiconductors, such as carbon nanotubes (CNTs), at ultra-scaled technology nodes. The projected channel pitches [~10 nm or less (I)] for multichannel CNTs are smaller than the fabrication feasibility of current lithography. Alternatively, thin-film approaches, which use physical forces, or chemical recognition to assemble CNTs, provide a density exceeding 500 CNTs/µm. However, assembly defects, including crossing, bundling (i.e., multiple CNTs aggregated side by side), and irregular pitches (11), are widely observed in such CNT thin films.

Structural DNA nanotechnology, in particular DNA origami and DNA bricks, can produce user-prescribed 2D or 3D objects at 2-nm feature resolution Self-assembled DNA structures have been used to pattern diverse materials, including oxides, graphene, plasmonic materials, polymers, and CNTs. Despite these demonstrations, unconfined surface rotation still limits the precise pitch scaling achieved within a DNA template. Additionally, CNT arrays assembled by using double-stranded DNAs (dsDNAs) contain only a small number of CNTs per single-orientation domain (2.4 on average), less than the desired value of six CNTs.

Figure 8:
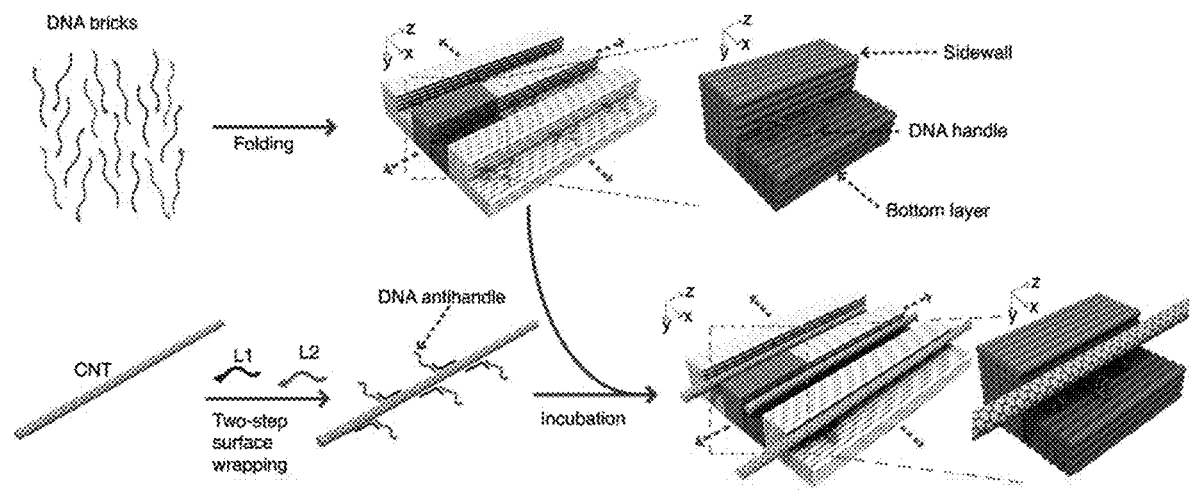
FIG. 8 shows: (A) a plan view of the unit cell shown in FIG. 7, (B) a cross-section along line A-A of the unit cell shown in panel A, and (C) a cross-section along line B-B of the unit cell shown in panel A.

By using nanotrenches based on DNA brick crystals to spatially confine the DNA hybridization-mediated CNT alignment, we developed a spatially hindered integration of nanotube electronics (SHINE) method for building evenly spaced CNT arrays (FIG. 8). DNA hybridizations between single-stranded handles within the nanotrenches and the antihandles (sequences complementary to the DNA handles) on CNTs compensated for the electrostatic repulsions during assembly. DNA nanotrenches also confined the orientation of individual CNTs precisely along their longitudinal axis.

Figure 24:
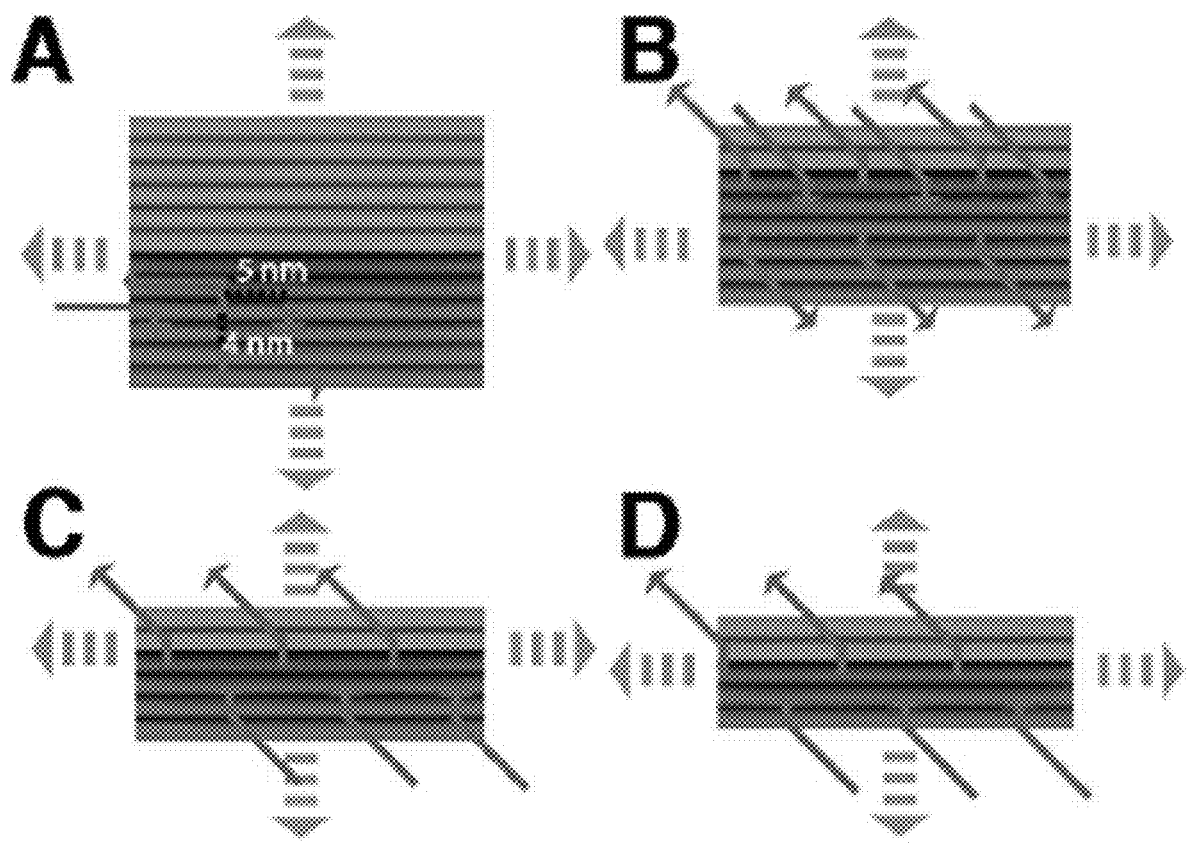
FIG. 24 shows designs of DNA handles on DNA brick crystals. Bundles represent a feature-repeating unit of designed DNA brick crystals with 25.3-nm (A), 16.8-nm (B), 12.7-nm (C), and 10.6-nm (D) trench periodicity along x direction. Some bundles are the sidewalls of DNA nanotrench; and some bundles are the bottom layer of DNA nanotrench. Some arrows denote the DNA handles. Some arrows show growth directions of the crystal template. Numbers indicate the spacing between DNA handles in A.

Programming the DNA trench periodicity thus rationally scaled the inter-CNT pitch from 24.1 to 104 nm Misaligned CNTs could not access the DNA handles and were repelled from the DNA templates by electrostatic repulsion. The pitch precision, indicative of array uniformity, improved when compared to the values for CNT thin films. The design for SHINE began by constructing parallel nanotrenches along the x direction (FIG. 8). The feature-repeating unit of DNA brick crystal template (17) contained 6768 base pairs. The sidewall and the bottom layer within the unit consisted of 6 helices by 8 helices by 94 base pairs and 6 helices by 4 helices by 94 base pairs along the x and y and z directions, respectively. At the top surface of the bottom layer, we introduced four 14-nucleotide (nt) single-stranded DNA (ssDNA) handles by extending the 3' or 5' ends of four selected DNA bricks (FIG. 24). Extending the repeating units along the x and z directions yielded DNA templates with parallel nanotrenches.

Figure 11:
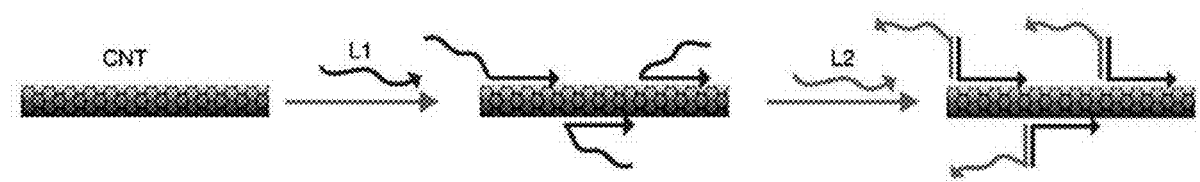
FIG. 11 shows two-step DNA wrapping around CNTs.

The micrometer-scale DNA templates were folded through a multistage isothermal reaction. Next, DNA antihandles were wrapped onto CNTs through noncovalent interactions (FIG. 11). Finally, under mild conditions, the hybridization between the DNA handles and the antihandles mediated CNT assembly within the DNA nanotrenches at the prescribed inter-CNT pitch.

Figure 9:
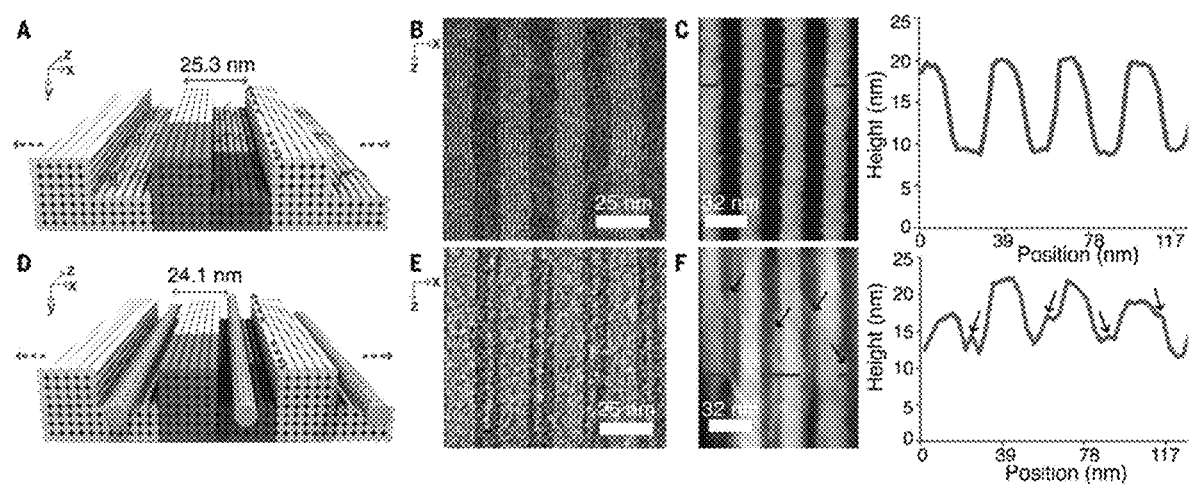
FIG. 9 shows assembling CNT arrays with 24-nm inter-CNT pitch; designs (A and D), zoomed-in TEM images along the x and z projection direction (B and E), liquid-mode AFM images along the x and z projection direction (C and F) (left), and height profiles (C and F) (right) for the DNA template (A to C) and the assembled CNT array (D to F), respectively. Dashed lines [in (C) and (F), left] represent the locations for the height profile. Arrows in the AFM image (F) indicate assembled CNTs. The orientation of the assembled CNTs in (F) may be distorted by AFM tips during imaging.
Figure 12:
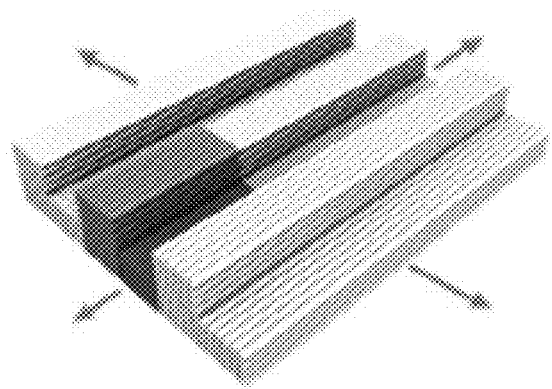
FIG. 12 shows: design (A), zoomed-out (B), and zoomed-in (C) TEM images of the DNA brick crystal with 25.3-nm trench periodicity along x direction. Feature-repeating unit of the designed crystal is denoted using colored bundles. Arrows in A represent the growth directions of the crystal template. DNA brick crystals are diluted 500 folds prior to imaging. The scale bar in B is 10 μm. The scale bar in C is 500 nm.
Figure 12:
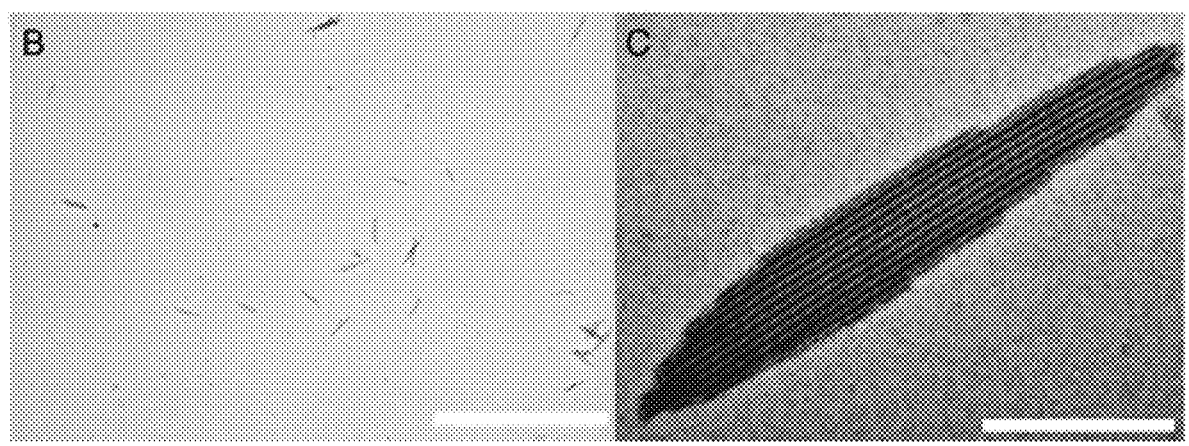
Figure 13:
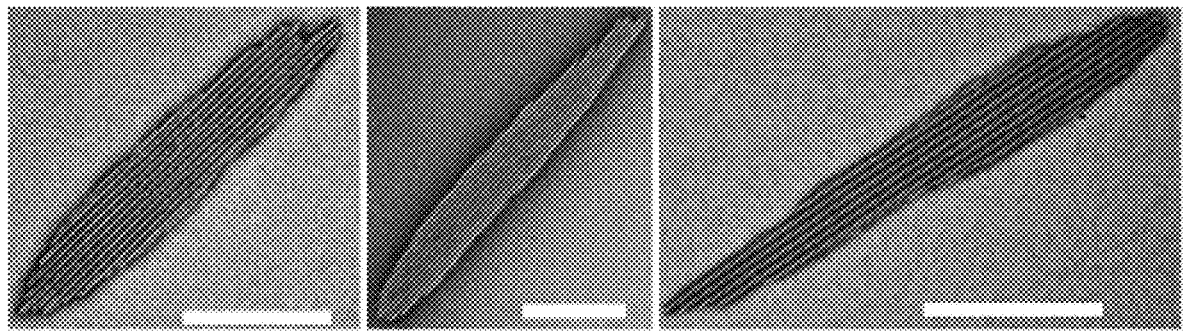
FIG. 13 shows TEM images of typical DNA brick crystals with 25.3-nm trench periodicity along x direction. The scale bars are 500 nm.
Figure 26:
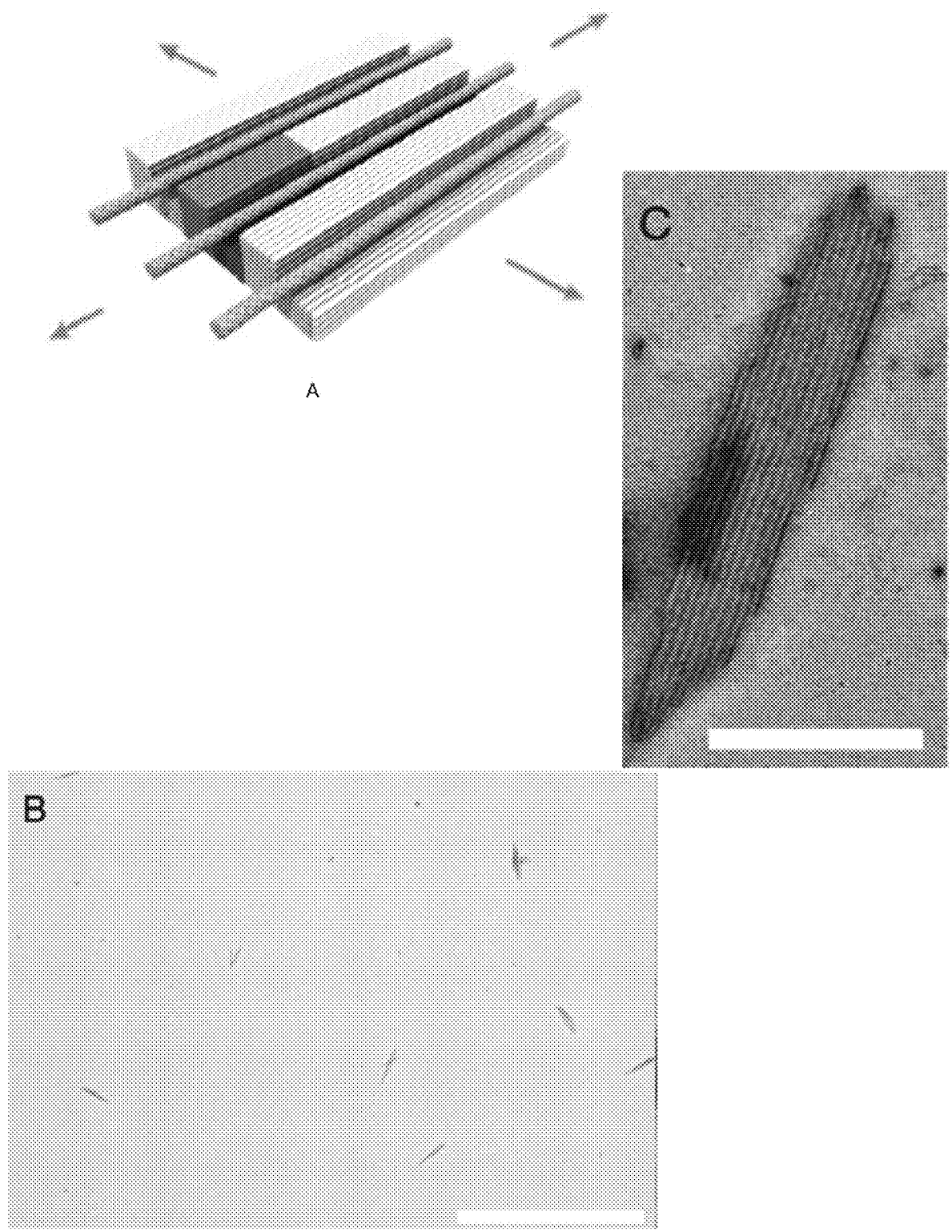
FIG. 26 shows design (A), zoomed-out (B) and zoomed-in (C) TEM images of the CNT arrays assembled on DNA brick crystal with 24.1-nm trench periodicity along x direction. Feature-repeating unit of the designed brick crystal template is denoted using colored bundles (blue and orange). Rods denote the CNTs. Arrows in A represent the growth directions of the crystal template. CNT-decorated DNA brick crystals are diluted 6 folds prior to imaging. The scale bar in B is 10 μm. The scale bar in C is 500 nm.
Figure 27:
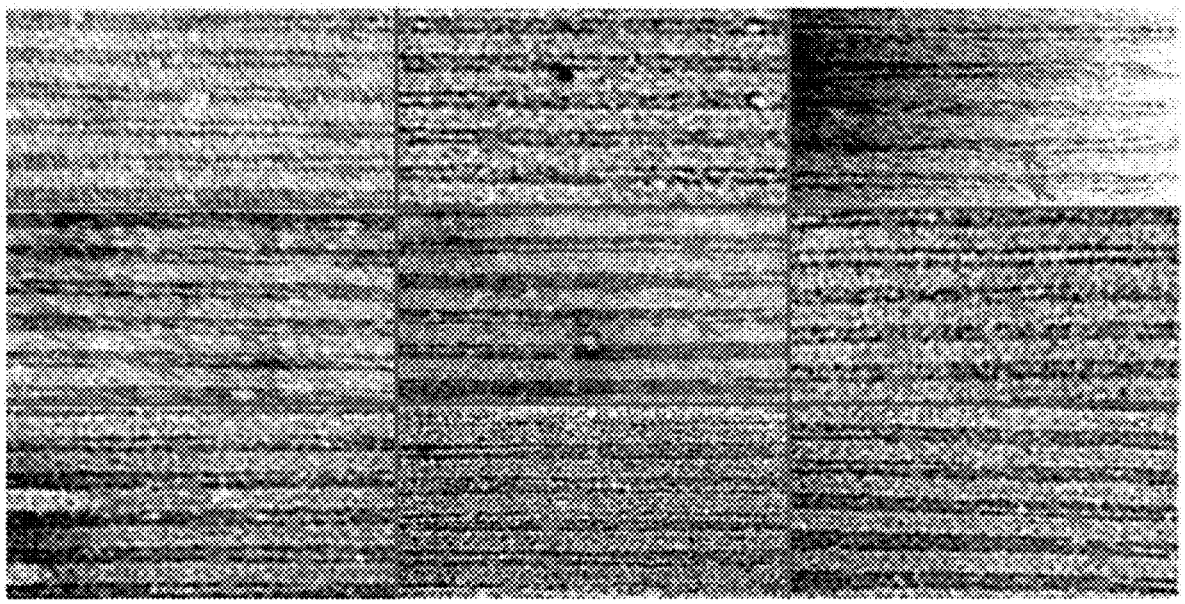
FIG. 27 shows zoomed-in TEM images for 9 randomly selected CNT arrays assembled on DNA brick crystals with 24.1-nm trench periodicity along x direction. Arrows indicate the CNTs within the DNA nanotrenches. The scale bar is 100 nm.

Transmission electron microscopy (TEM) imaging confirmed the successful formation of the designed DNA templates (FIGS. 9, A and B, and FIGS. 12 to 14), as well as the confined assembly of evenly spaced CNT arrays within the DNA nanotrenches (FIGS. 9, E and F, and FIGS. 26 and 27). In the zoomed-out TEM images (FIGS. 12 and 13), the assembled DNA templates exhibited wide dimensional distributions. One typical DNA template (FIG. 9C) exhibited the maximal dimensions of 1.3 µm by 200 nm in the x and z directions. In the zoomed-in TEM images, DNA templates exhibited alternative dark (bottom layer)-bright (sidewall) regions (FIG. 9B and FIG. 27), and each region corresponded to six-layered DNA helices along the x direction as designed (FIG. 9A). The measured nanotrench periodicity was 25.3±0.3 nm (N=50 nanotrenches from 10 different templates) along the x direction after drying on the surface (corresponding to 2.1 nm diameter per dehydrated dsDNA). The ssDNA handles were not visible in the negatively stained TEM images.

Figure 25:
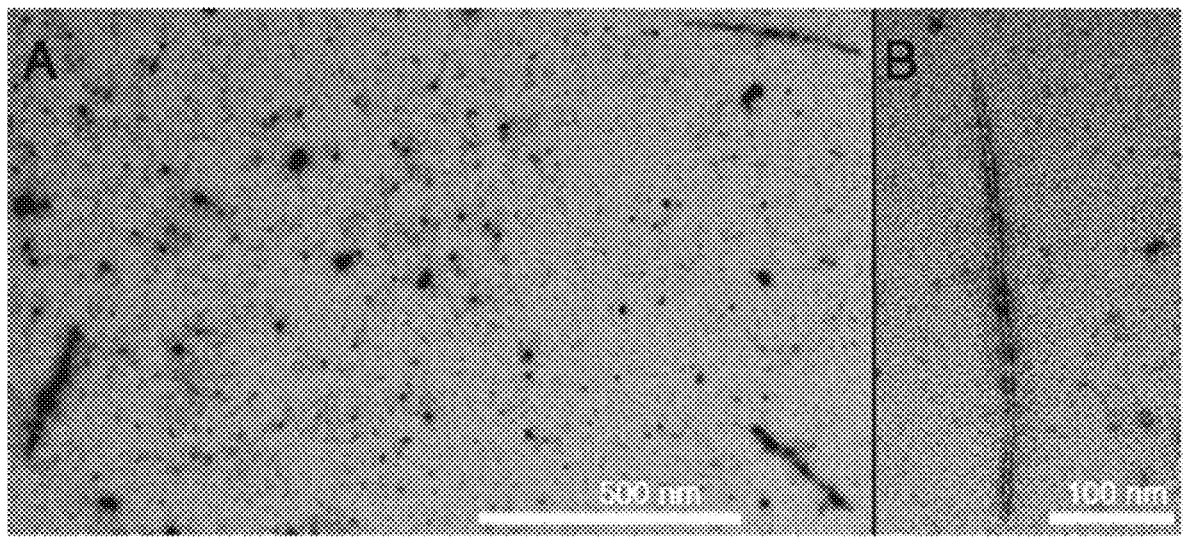
FIG. 25 shows zoomed-out (A) and zoomed-in (B) TEM images of the DNA-wrapped CNTs. The scale bar in A is 500 nm. The scale bar in B is 100 nm.

After CNT assembly, we found bright parallel lines that appeared exclusively on the dark bottom regions, indicative of the aligned CNTs along the longitudinal axis of the nanotrenches (FIGS. 9, D and E, and FIGS. 26 and 27) The relatively larger diameter of CNTs as compared with the unwrapped CNTs was caused by the stained dsDNA layer around CNTs (FIG. 25). Despite a few local twists in individual CNTs, we did not observe crossing or bundling CNT defects within the DNA nanotrenches. The measured inter-CNT pitch was 24.1±1.7 nm (N=50 CNTs from 10 different templates. For every two neighboring CNTs, we measured three different positions along the longitudinal axis of CNT). Slightly smaller inter-CNT pitch, compared to the x-direction periodicity of the DNA templates, was the result of statistical variance of the small sample size. The integrity of the DNA templates was not affected by CNT assembly, as indicated by the consistent six-layered DNA helices (along the x direction) in both the DNA sidewall and bottom layer (FIG. 9E).

To evaluate the pitch precision, we calculated (i) the standard deviation, (ii) the range value, (iii) the percent relative range, and (iv) the index of dispersion for count value (IDC value) for inter-CNT pitch. The range of inter-CNT pitch variation, defined as the difference between the maximum and the minimum pitch values, was 7.8 nm. The percent relative range of the inter-CNT pitch, defined as the range of inter-CNT pitch divided by the average value of inter-CNT pitch (24.1 nm), was 32%. For comparison, on a flat substrate, a range>30 nm and a percent relative range>140% have been reported for CNT arrays with similar average pitch.

The IDC value [defined as the standard deviation squared divided by the average pitch squared] for CNT arrays (~40 CNTs/pm) from SHINE was 0.005, two orders of magnitude smaller than for CNT arrays of similar density fabricated from thin-film approaches Hence, by limiting the rotation of CNTs with DNA sidewalls, SHINE provided higher precision for assembling ultra-dense CNT arrays than flat substrate-based assembly. Similarly, SHINE produced a smaller angular deviation (less than 2°, defined as the longitudinal-axis difference between CNTs and the DNA nanotrenches) than previously obtained on flat DNA template, where >75% CNTs exhibited angular deviations>5°.

Because both DNA templates (FIGS. 12 and 13) and CNTs (FIG. 25) exhibited uneven widths and lengths, we observed a variable number of CNTs (ranging from 4 to 15) on different templates, as well as z-direction offset for CNTs from trench to trench (FIG. 27). Notably, although the width of the DNA nanotrench (12 nm) was larger than the diameter of individual CNTs, we did not observe CNT bundling within individual trenches.

Figure 35:
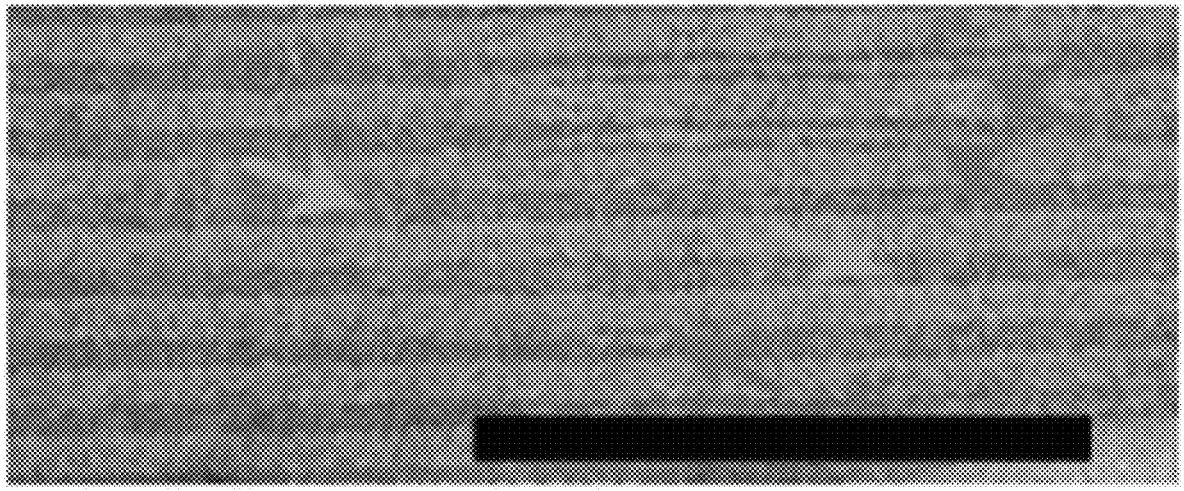
FIG. 35 shows TEM image for the assembly defect. Some arrows indicate the CNTs within the DNA nanotrenches. Some arrows indicate the empty DNA nanotrenches, which are counted as the assembly defects. The stoichiometry between CNTs and the DNA brick crystals is one third of the optimal value (that is, off-stoichiometry product). The scale bar is 200 nm.

We further analyzed the assembly yield of aligned CNTs by TEM counting (FIG. 12) The assembly yield was defined as the total number of inner nanotrenches occupied by correctly assembled parallel CNT arrays divided by the total number of inner DNA nanotrenches. Partially formed DNA nanotrenches on the boundaries were excluded A>95% assembly yield was observed for 10 randomly selected DNA templates (more than 50 inner trenches were counted, FIG. 9E and FIG. 27), and <5% of inner nanotrenches were unoccupied by CNTs (FIG. 35).

Figure 28:
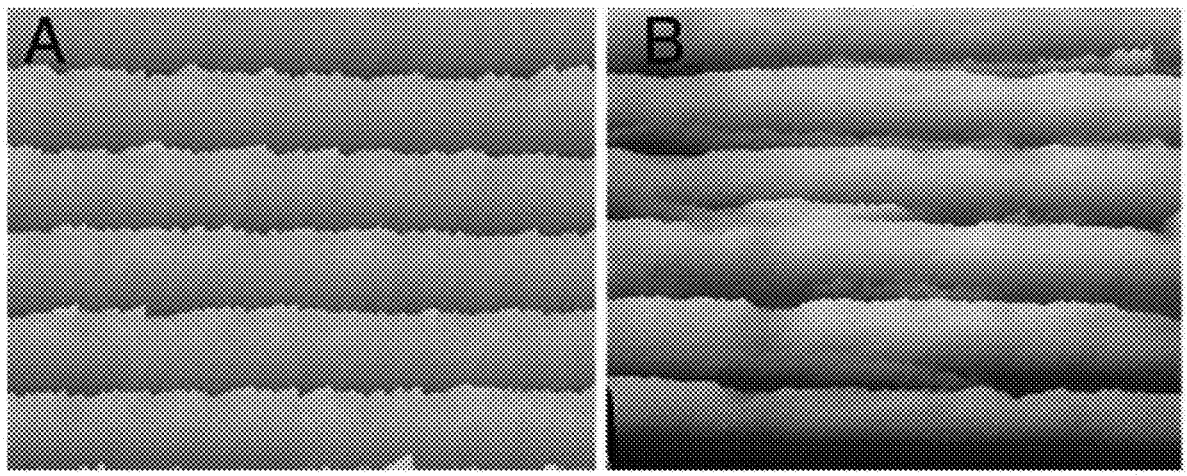
FIG. 28 shows tilted AFM images for DNA brick crystals before (A) and after (B) CNT assembly.
Figure 29:
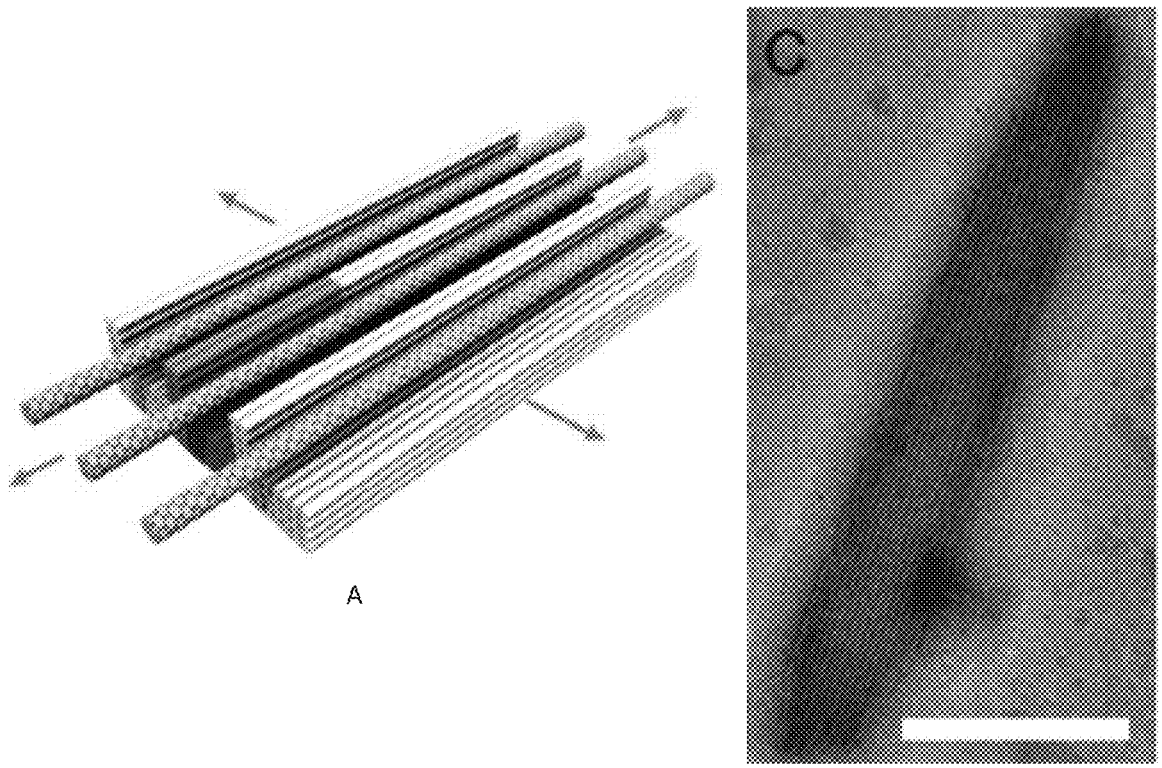
FIG. 29 shows design (A), zoomed-out (B) and zoomed-in (C) TEM images of the CNT arrays assembled on DNA brick crystal with 16.8-nm trench periodicity along x direction. Feature-repeating unit of the designed brick crystal template is denoted using bundles. Rods denote the CNTs. Arrows in A represent the growth directions of the crystal template. CNT-decorated DNA brick crystals are diluted 6 folds prior to imaging. The scale bar in B is 10 μm. The scale bar in C is 500 nm.
Figure 29:
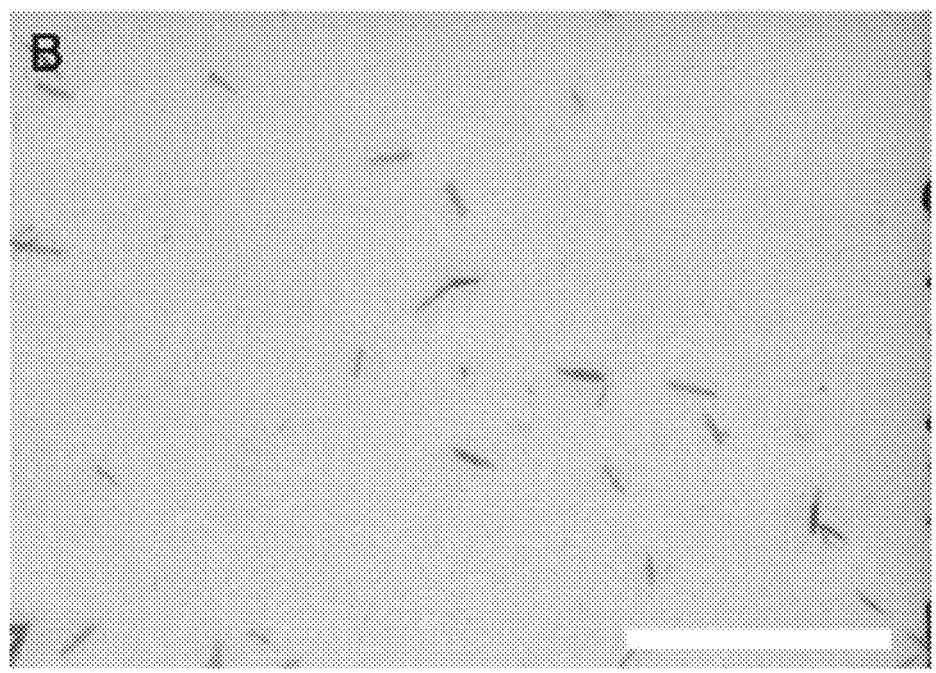

In liquid-mode atomic force microscopy (AFM) images (FIG. 9F and FIG. 28), we observed new peaks (with heights ~15 to 17 nm) within the nanotrenches (FIG. 28) after CNT assembly. The height changes of the new peaks (5 to 7 nm), relative to the height of the bottom layer beneath (~10 nm in height, FIG. 9C), approximated the sum of dsDNA handle length (3 to 5 nm, depending on different conformations) and DNA-wrapped CNT diameter (~1 to 3 nm, FIG. 25). Therefore, only single-layer CNTs were assembled. The ssDNA handles were not visible in the AFM images. We observed wider inter-CNT pitch (~32 nm) in liquid-mode AFM when compared with that from the TEM images. The pitch change was ascribed to the larger diameter of hydrated dsDNAs (2.6-nm diameter per helix) in liquid condition than of the fully dehydrated dsDNAs (2.1-nm diameter per helix under vacuum). The 32-nm inter-CNT pitch on the hydrated DNA templates could shrink to ~24 nm after dehydration under heat.

Figure 10:
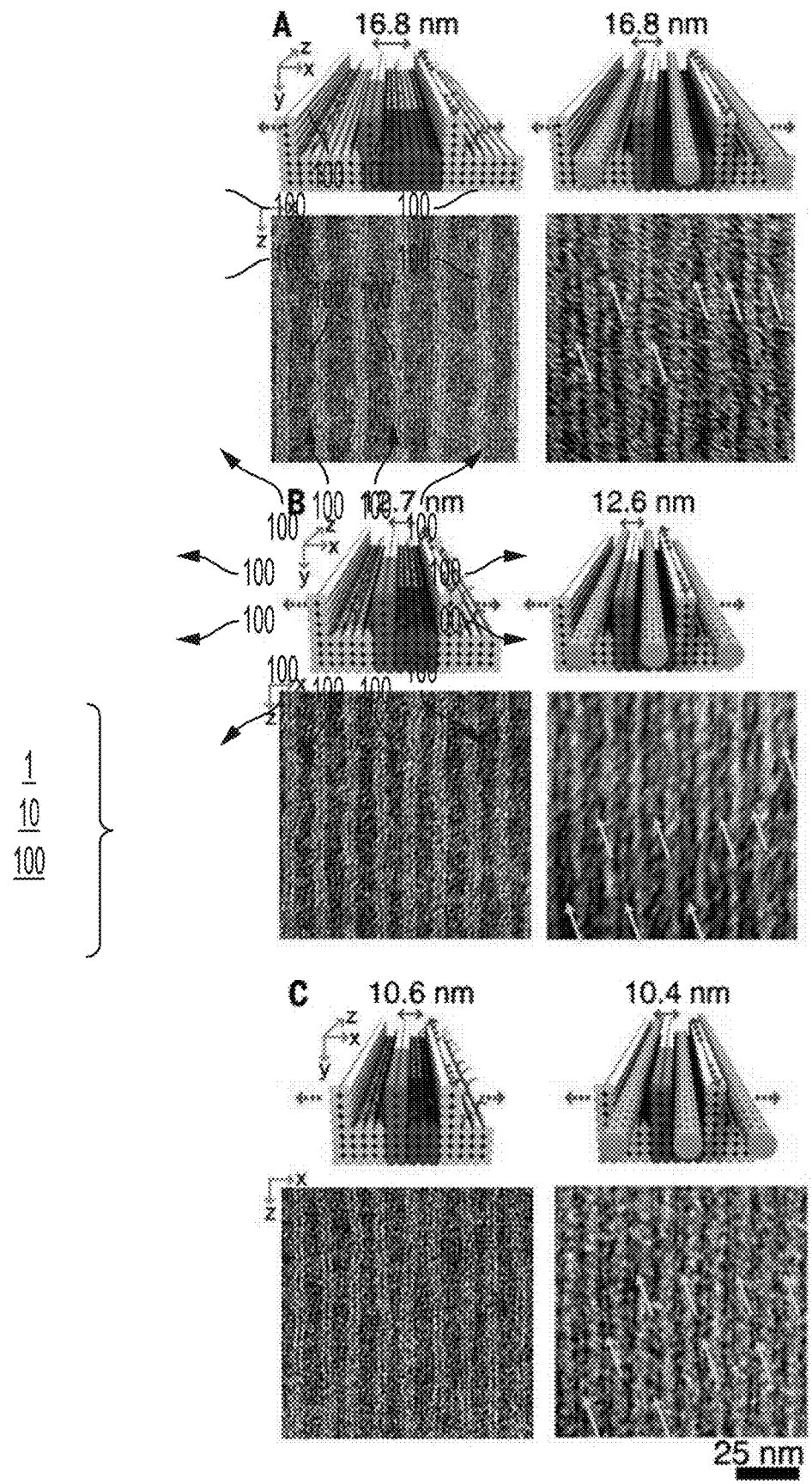
FIG. 10 shows programming inter-CNT pitches with DNA brick crystal templates. (A to C) Designs (top row) and zoomed-in TEM images along the x and z projection direction (bottom row) for the DNA templates (left) and the assembled CNT arrays (right) at 16.8 nm (A), 12.6 nm (B), and 10.4 nm (C) inter-CNT pitches, respectively. Arrows in the TEM images indicate the assembled CNTs.

By programming DNA nanotrenches with different trench periodicities along the x direction, we further demonstrated prescribed scaling of inter-CNT pitches at 16.8, 12.6, and 10.4 nm (FIG. 10) Within the feature-repeating units of the small-periodicity DNA templates, we used 2 helices by 8 helices by 94 base pairs for the nanotrench sidewalls (FIG. 10, A to C, top left). In the bottom layers, 6 helices by 4 helices by 94 base pairs, 4 helices by 4 helices by 94 base pairs, and 3 helices by 4 helices by 94 base pairs were used for different nanotrench periodicities.

We assembled DNA templates and CNT arrays using approaches similar to those in FIG. 8. Assembled DNA templates exhibited measured nanotrench periodicities of 16.8+0.4 nm, 12.7±0.2 nm, and 10.6±0.1 nm (N=50 to 300 nanotrenches from 10 individual templates for each design) along x direction (FIG. 10, A to C, bottom left, and FIGS. 15 to 23). Notably, we observed slightly twisted nanotrench sidewalls after drying in vacuum, probably because of the relatively low structural stiffness of the two-layer DNA sidewalls. However, the average periodicities were not affected by the twisting of the DNA sidewalls. In the zoomed-out view, different template designs showed typical dimensions of ~1.3 µm by 300 nm along the x and z directions (FIGS. 15, 16, 18, 19, 21, and 22).

After CNT assembly, parallel CNTs were aligned within the DNA nanotrenches (designs in FIG. 10, A to C, top right; TEM images in FIG. 10, A to C bottom right; FIGS. 29 to 34). The inter-CNT pitches varied from 16 8±1.5 nm to 12.6±0 6 nm to 10.4±0.4 nm, respectively (N=50 to 300 CNTs from 10 individual templates for each design). Both the 10.4-nm pitch value and 0.4-nm standard deviation (smaller than the diameter of individual CNTs) were beyond current lithography-defined channel pitches.

Figure 14:
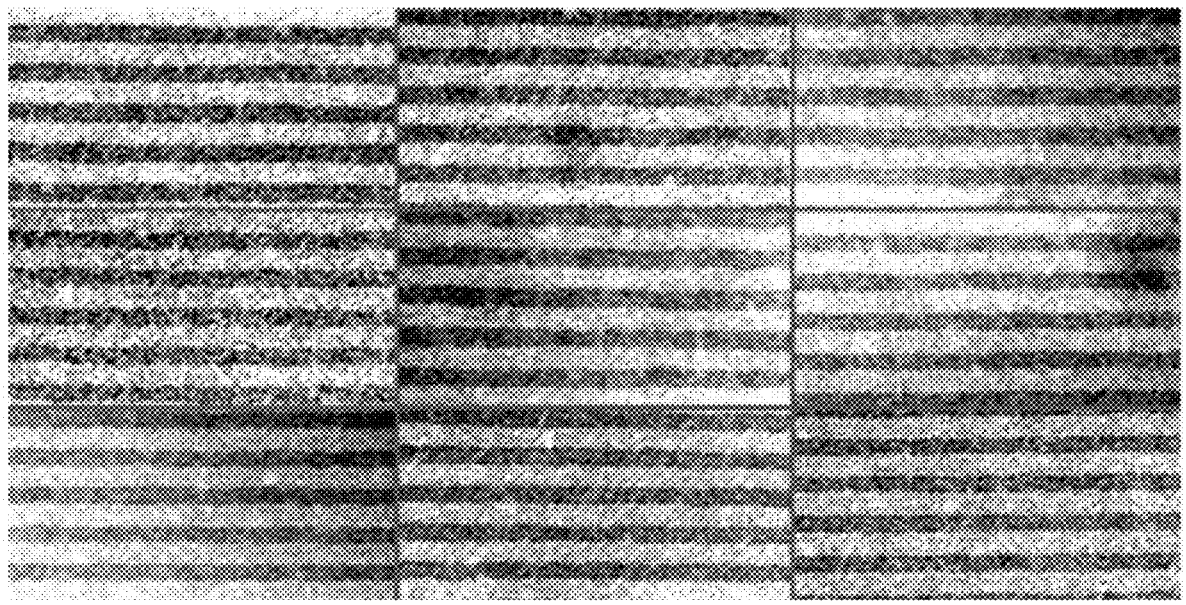
FIG. 14 shows zoomed-in TEM images for 9 randomly selected DNA brick crystals with 25.3-nm trench periodicity along x direction. The scale bar is 100 nm.
Figure 15:
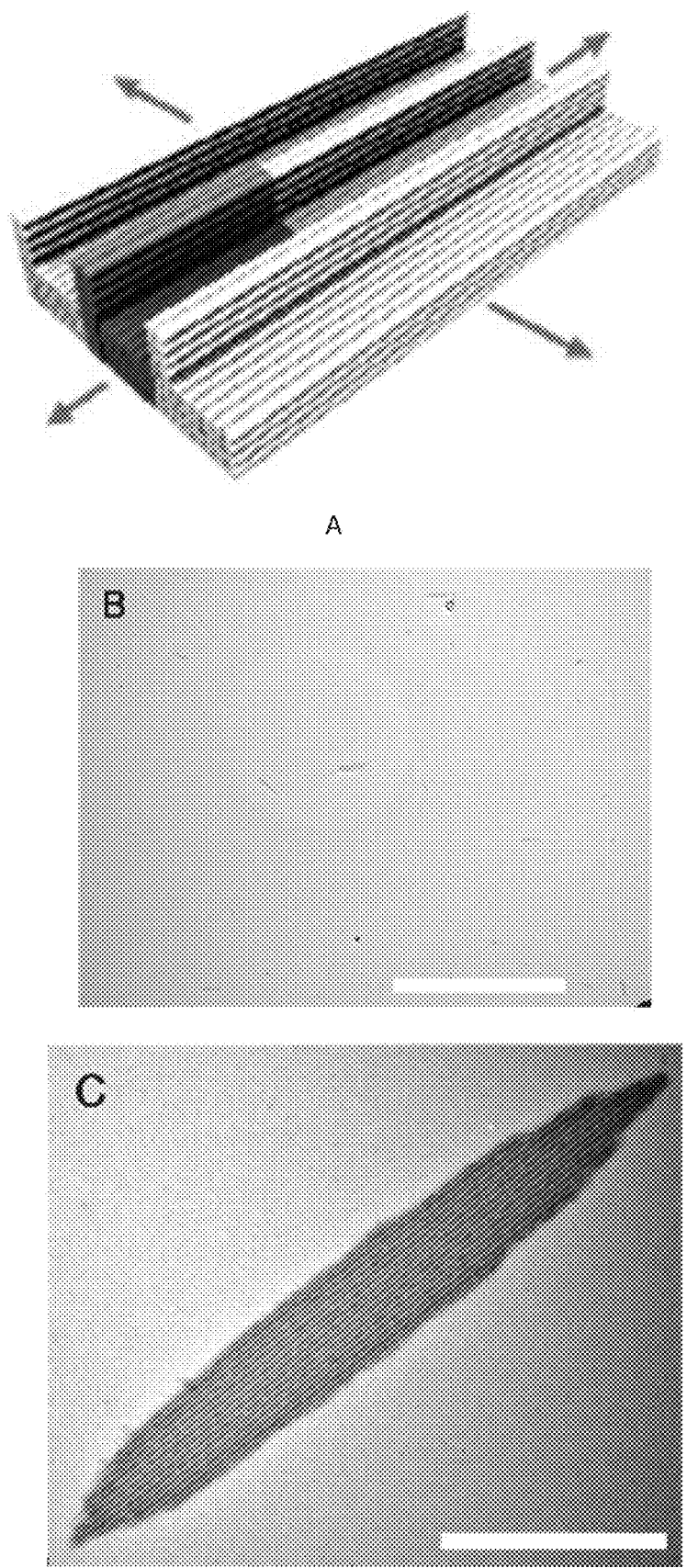
FIG. 15 shows design (A), zoomed-out (B), and zoomed-in (C) TEM images of the DNA brick crystal with 16.8-nm trench periodicity along x direction. Feature-repeating unit of the designed crystal is denoted using colored bundles. Arrows in A represent the growth directions of the crystal template. DNA brick crystals are diluted 500 folds prior to imaging. The scale bar in B is 10 μm. The scale bar in C is 500 nm.
Figure 16:
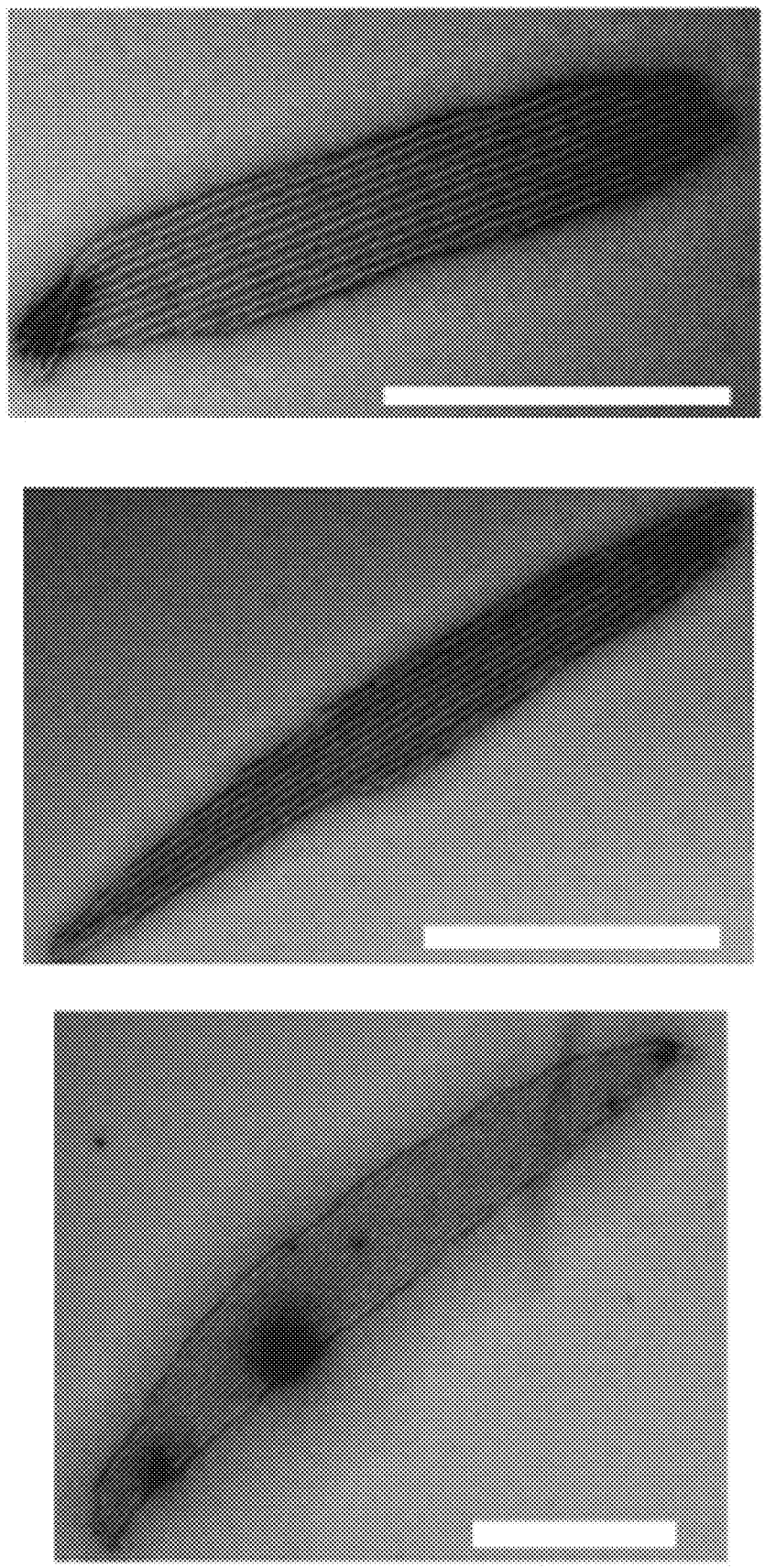
FIG. 16 shows TEM images of typical DNA brick crystals with 16.8-nm trench periodicity along x direction. The scale bars are 500 nm.
Figure 17:
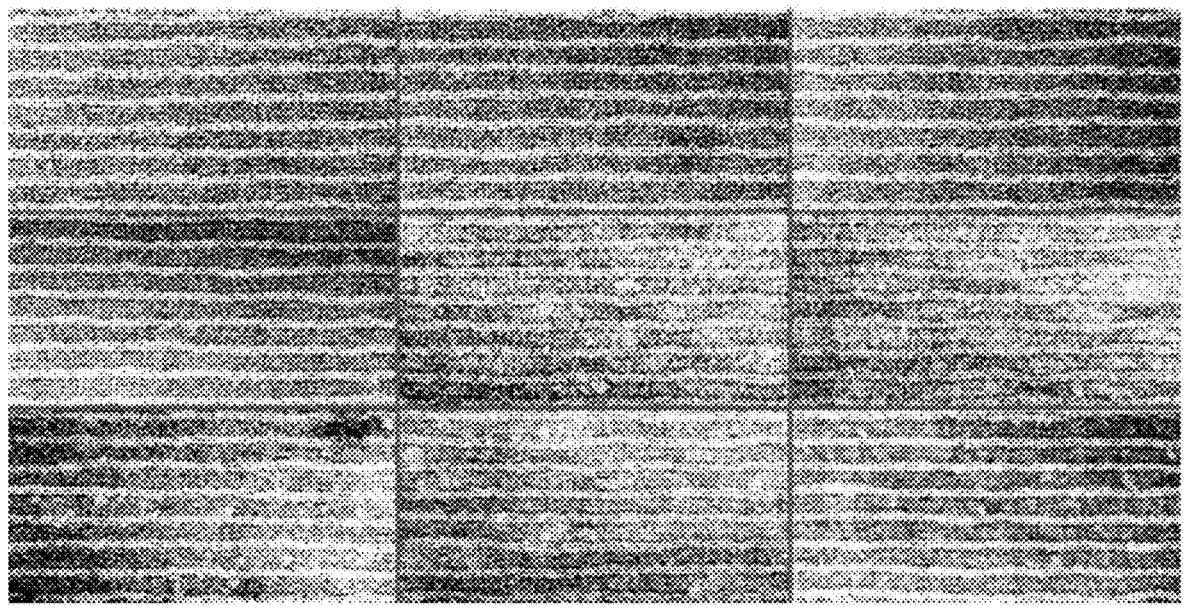
FIG. 17 shows zoomed-in TEM images for 9 randomly selected DNA brick crystals with 16.8-nm trench periodicity along x direction. The scale bar is 100 nm.
Figure 18:
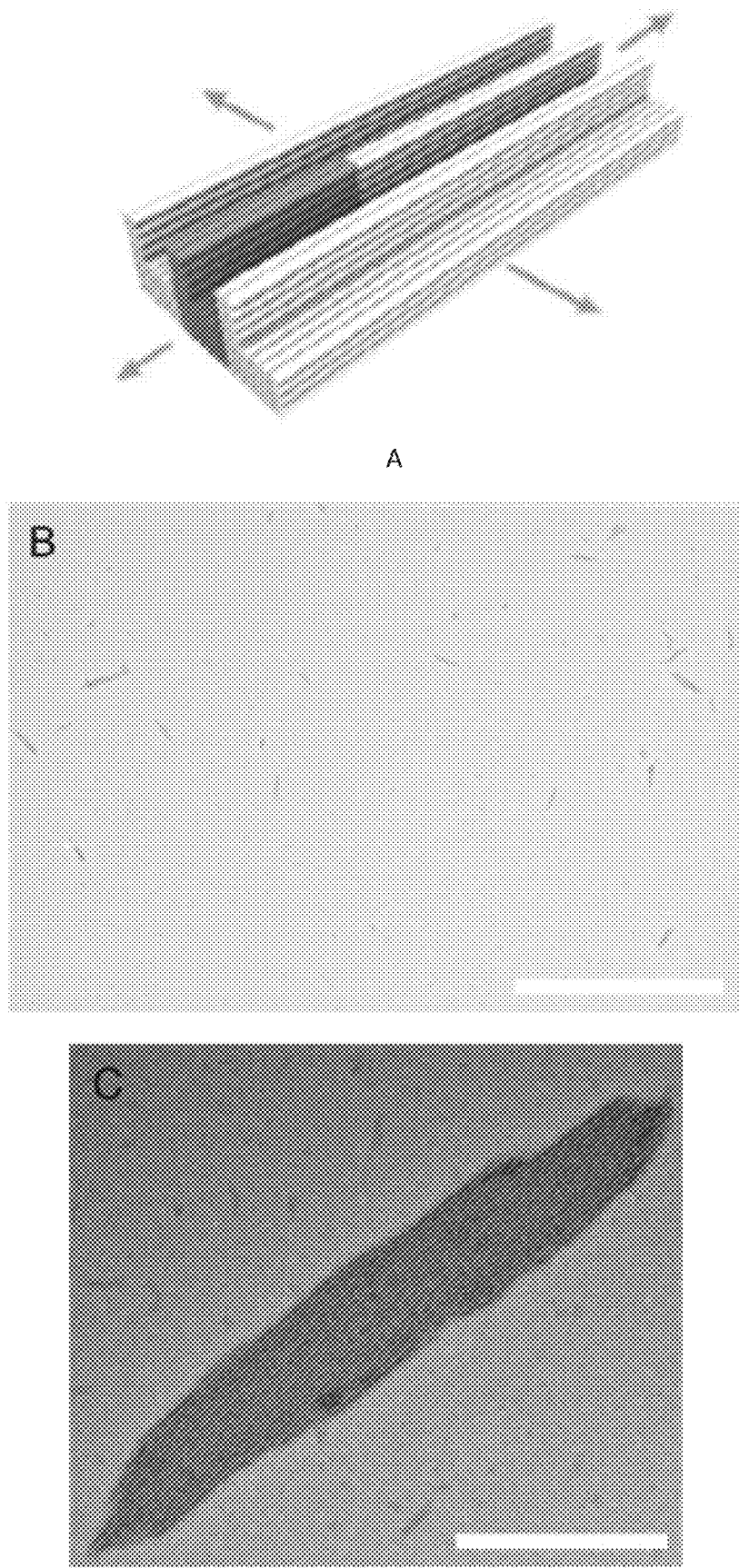
FIG. 18 shows design (A), zoomed-out (B), and zoomed-in (C) TEM images of the DNA brick crystal with 12.7-nm trench periodicity along x direction. Feature-repeating unit of the designed crystal is denoted using colored bundles. Arrows in A represent the growth directions of the crystal template. DNA brick crystals are diluted 500 folds prior to imaging. The scale bar in B is 10 μm. The scale bar in C is 500 nm.
Figure 19:
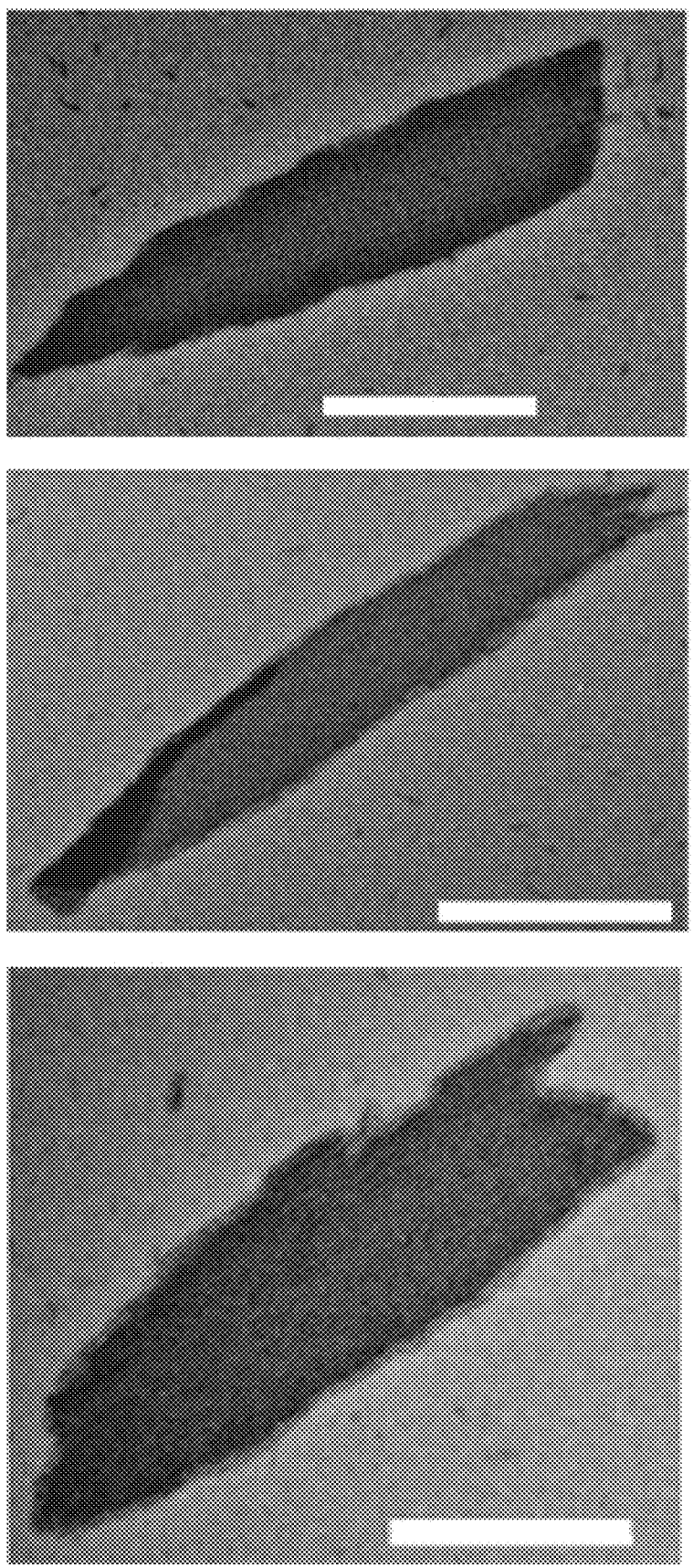
FIG. 19 shows TEM images of typical DNA brick crystals with 12.7-nm trench periodicity along x direction. The scale bars are 500 nm.
Figure 20:
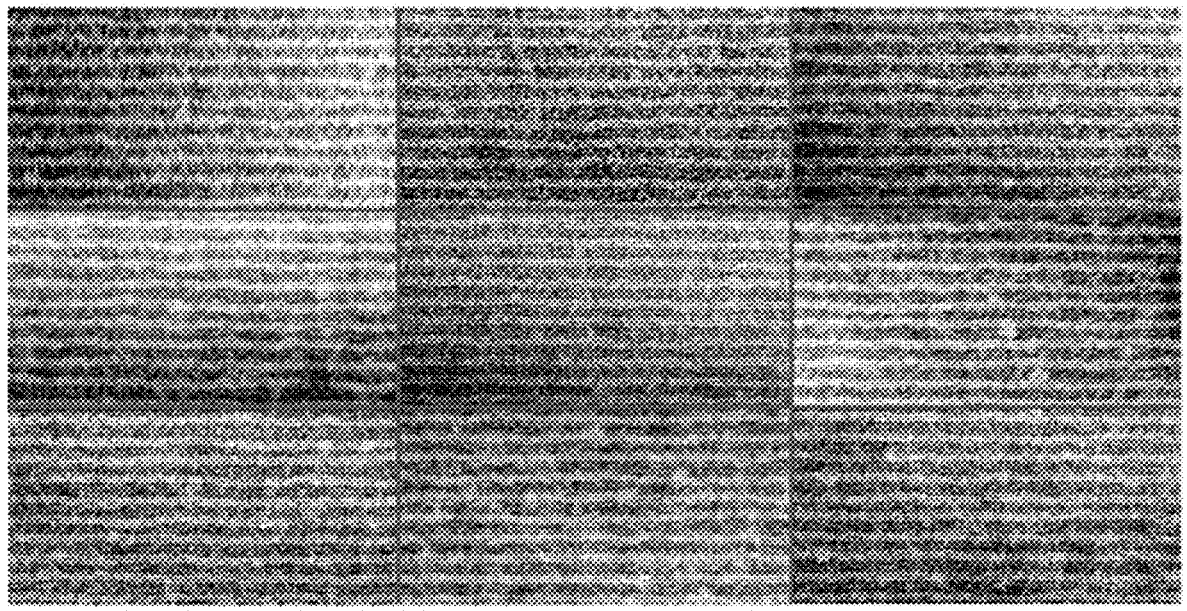
FIG. 20 shows zoomed-in TEM images for 9 randomly selected DNA brick crystals with 12.7-nm trench periodicity along x direction. The scale bar is 100 nm.
Figure 21:
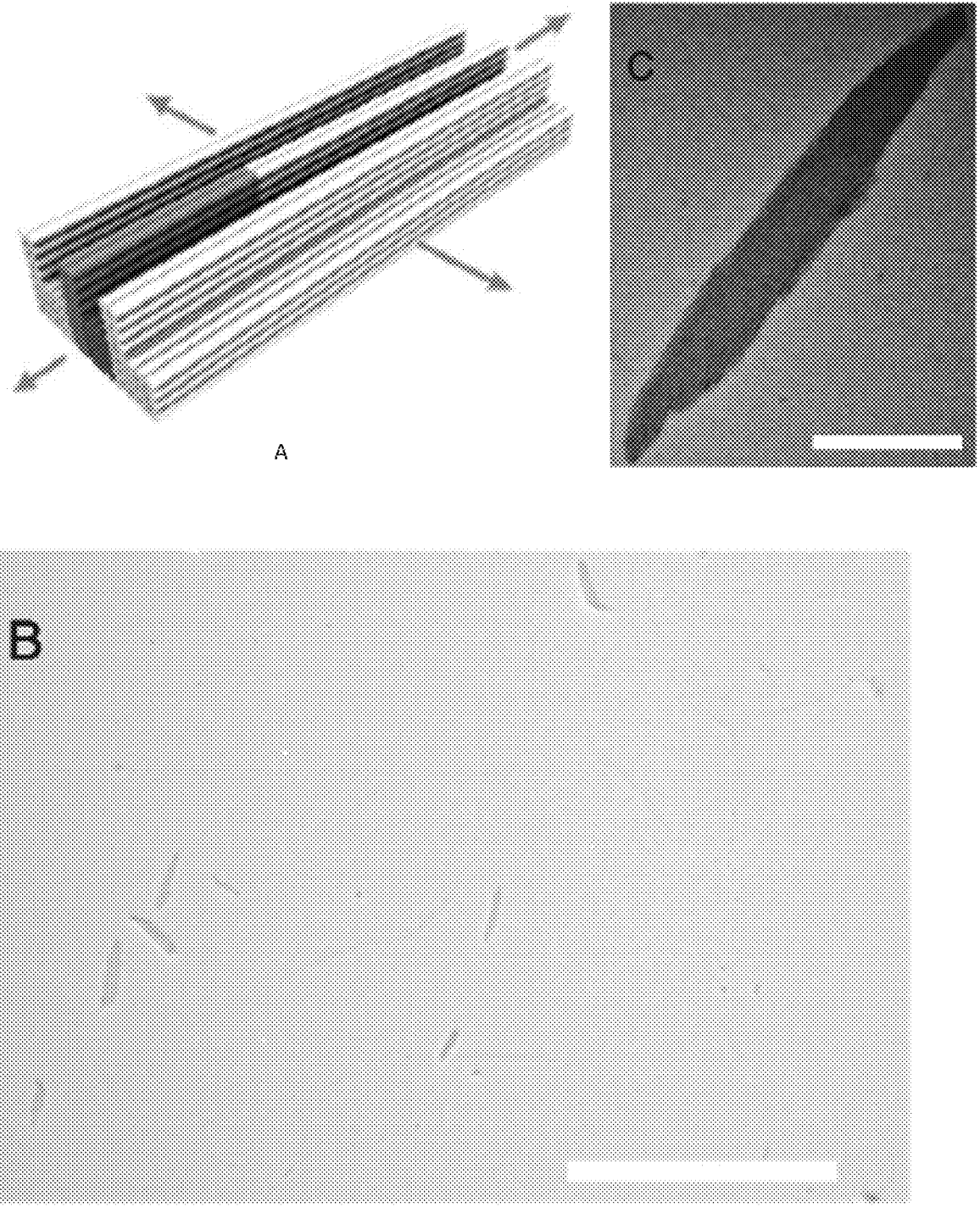
FIG. 21 shows design (A), zoomed-out (B), and zoomed-in (C) TEM images of the DNA brick crystal with 10.6-nm trench periodicity along x direction. Feature-repeating unit of the designed crystal is denoted using colored bundles. Arrows in A represent the growth directions of the crystal template. DNA brick crystals are diluted 500 folds prior to imaging. The scale bar in B is 10 μm. The scale bar in C is 500 nm.
Figure 22:
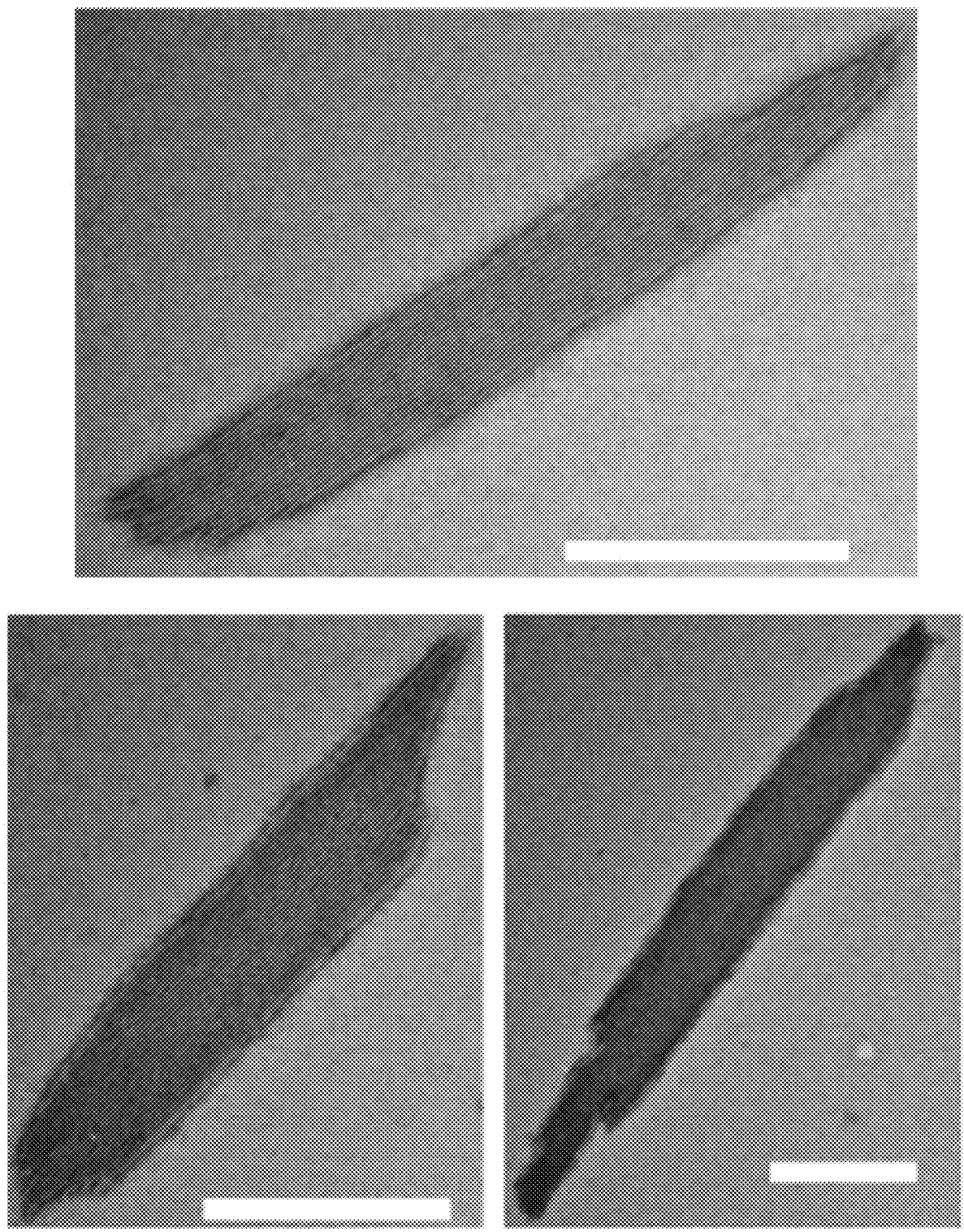
FIG. 22 shows TEM images of typical DNA brick crystals with 10.6-nm trench periodicity along x direction. The scale bars are 500 nm.
Figure 23:
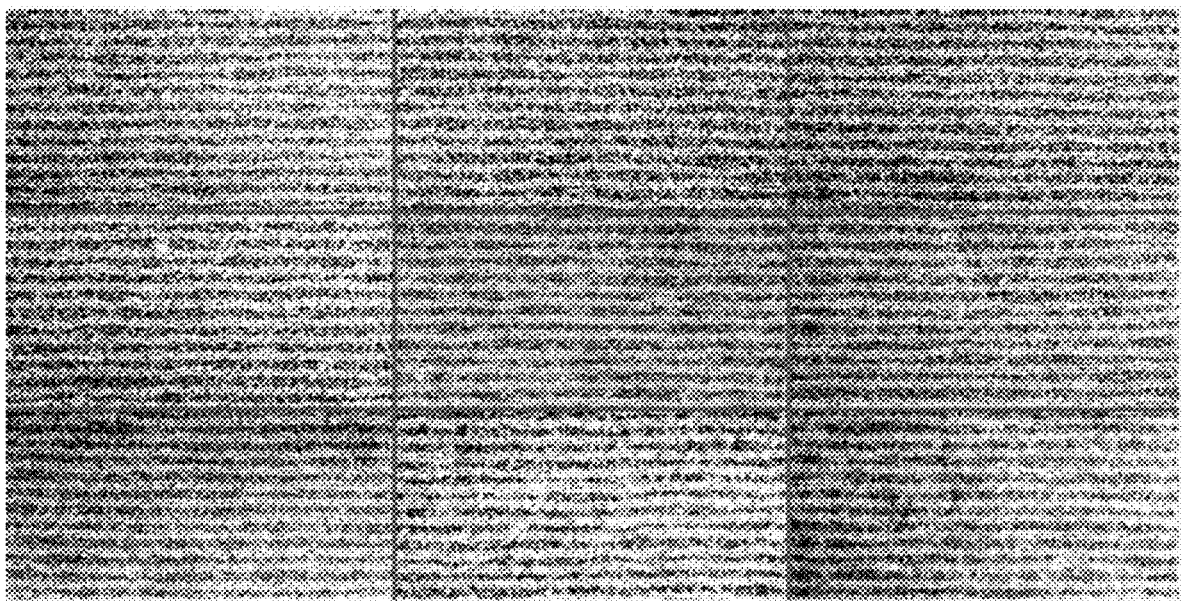
FIG. 23 shows zoomed-in TEM images for 9 randomly selected DNA brick crystals with 10.6-nm trench periodicity along x direction. The scale bar is 100 nm.
Figure 30:
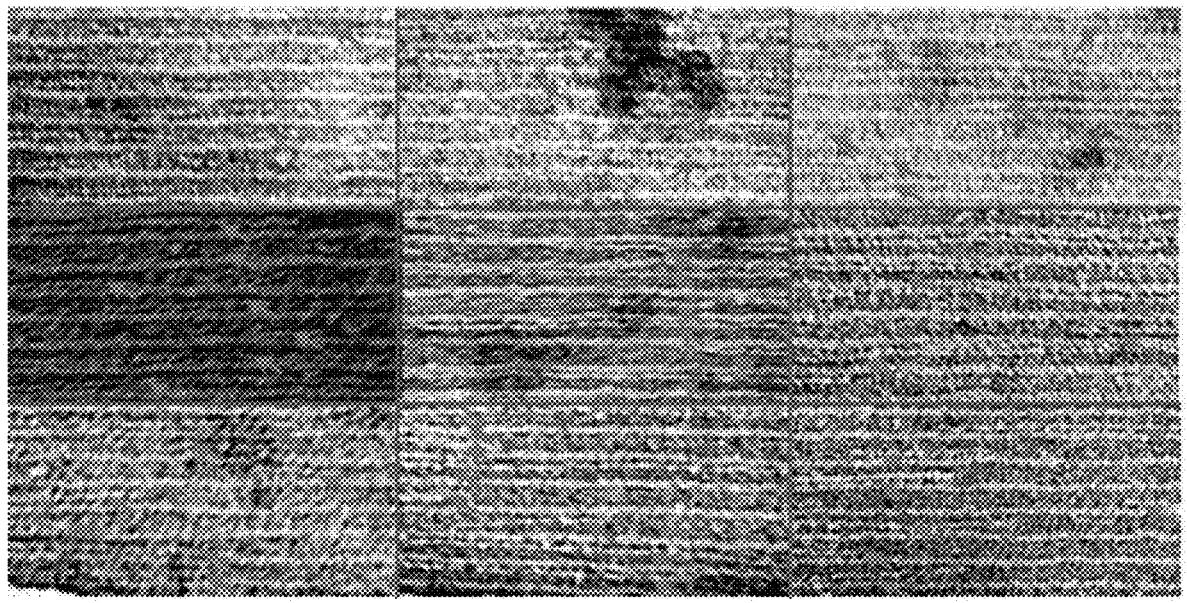
FIG. 30 shows zoomed-in TEM images for 9 randomly selected CNT arrays assembled on DNA brick crystals with 16.8-nm trench periodicity along x direction. Arrows indicate the CNTs within the DNA nanotrenches. The scale bar is 100 nm.
Figure 31:
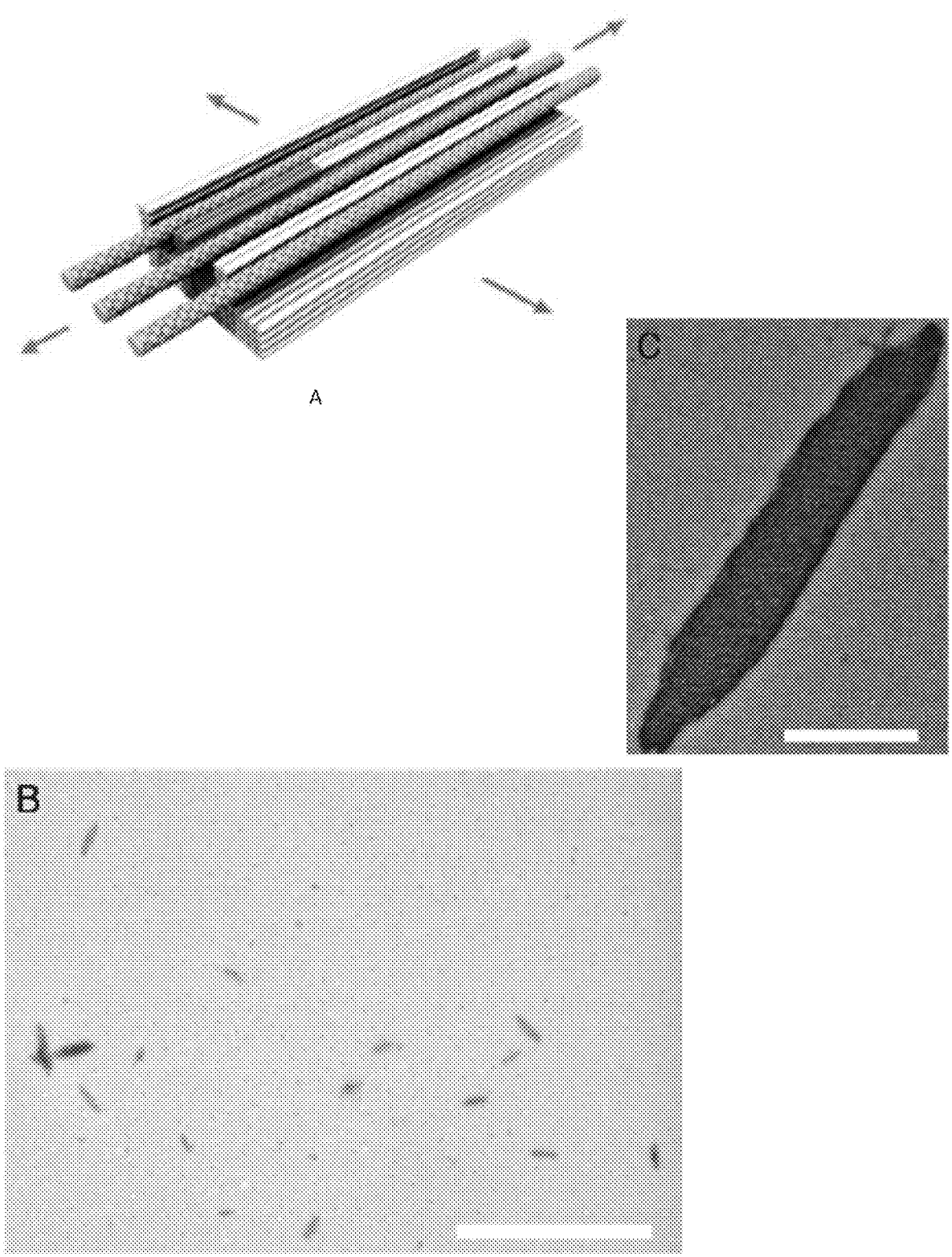
FIG. 31 shows design (A), zoomed-out (B) and zoomed-in (C) TEM images of the CNT arrays assembled on DNA brick crystal with 12.6-nm trench periodicity along x direction. Feature-repeating unit of the designed crystal is denoted using bundles. Rods denote the CNTs. Arrows in A represent the growth directions of the crystal template. CNT-decorated DNA brick crystals are diluted 6 folds prior to imaging. The scale bar in B is 10 μm. The scale bar in C is 500 nm.
Figure 32:
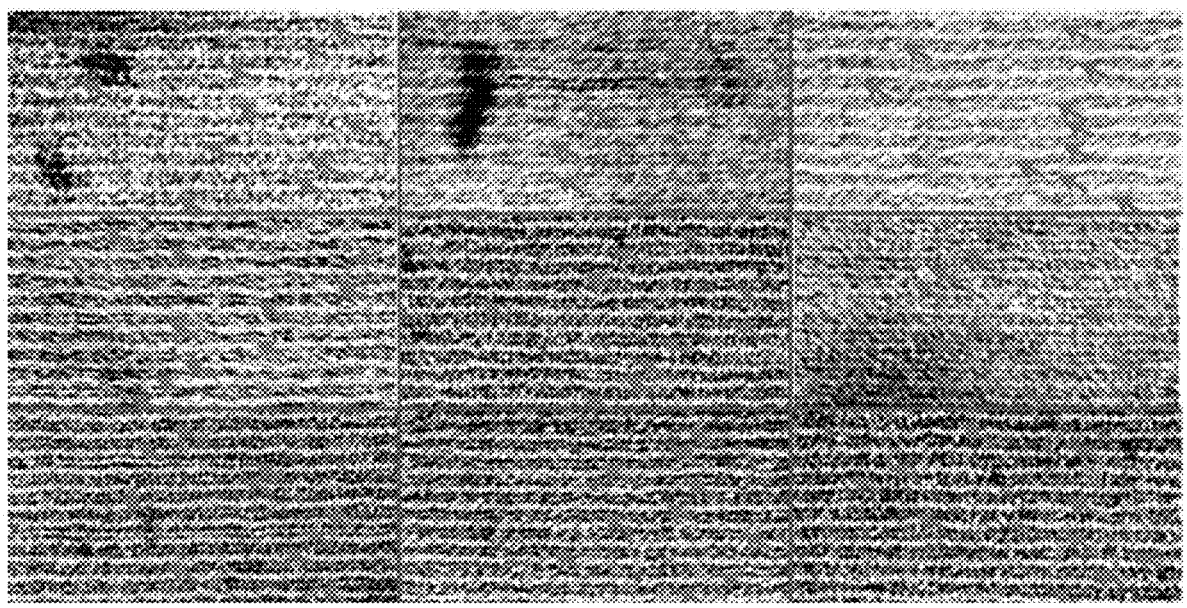
FIG. 32 shows zoomed-in TEM images for 9 randomly selected CNT arrays assembled on DNA brick crystals with 12.6-nm trench periodicity along x direction. Arrows indicate the CNTs within the DNA nanotrenches. The scale bar is 100 nm.
Figure 33:
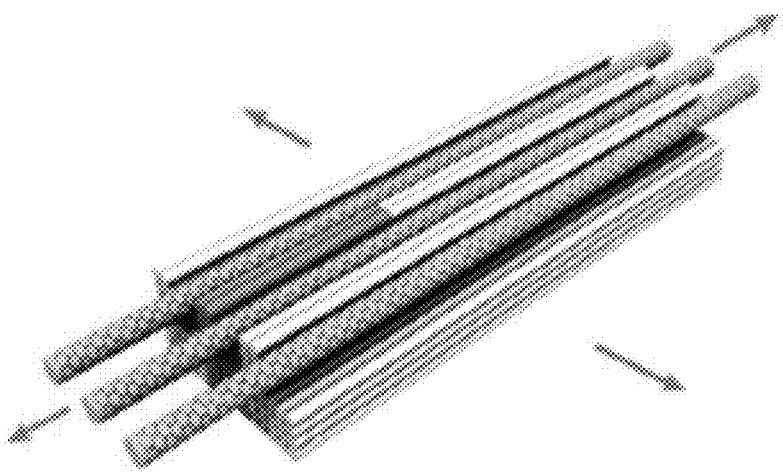
FIG. 33 shows design (A), zoomed-out (B) and zoomed-in (C) TEM images of the CNT arrays assembled on DNA brick crystal with 10.4-nm trench periodicity along x direction. Feature-repeating unit of the designed crystal is denoted using bundles. Rods denote the CNTs. Arrows in A represent the growth directions of the crystal template. CNT-decorated DNA brick crystals are diluted 6 folds prior to imaging. The scale bar in B is 10 μm. The scale bar in C is 500 nm.
Figure 33:
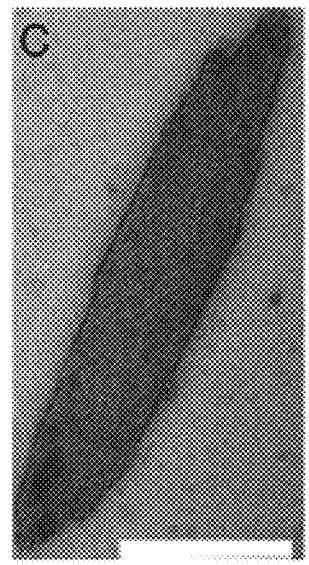
Figure 33:
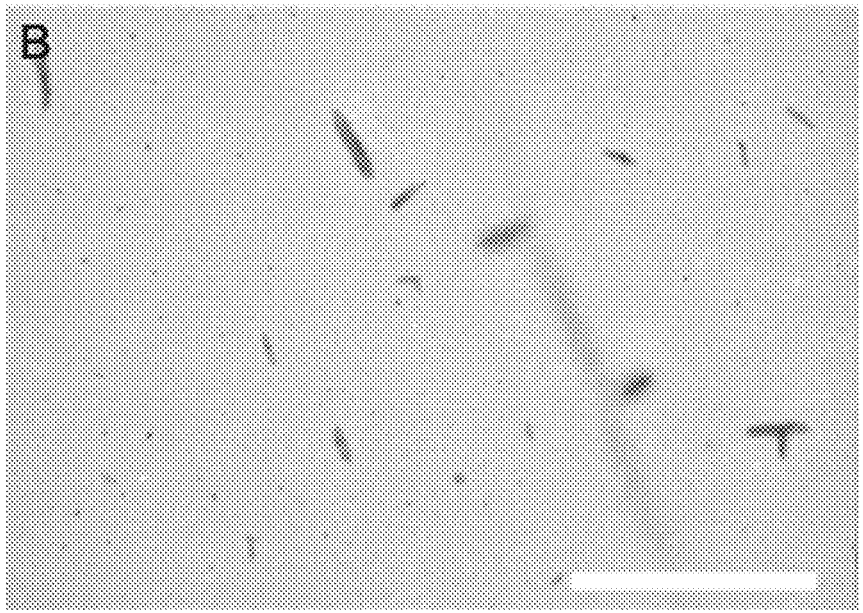
Figure 34:
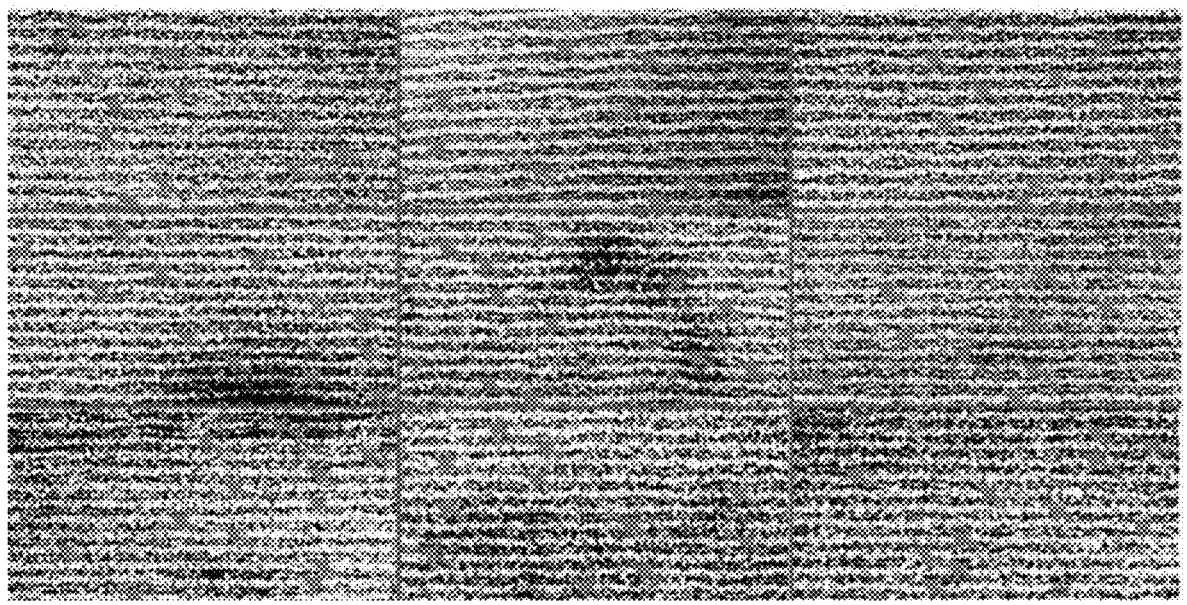
FIG. 34 shows zoomed-in TEM images for 9 randomly selected CNT arrays assembled on DNA brick crystals with 10.4-nm trench periodicity along x direction. Arrows indicate the CNTs within the DNA nanotrenches. The scale bar is 100 nm.
Figure 36:
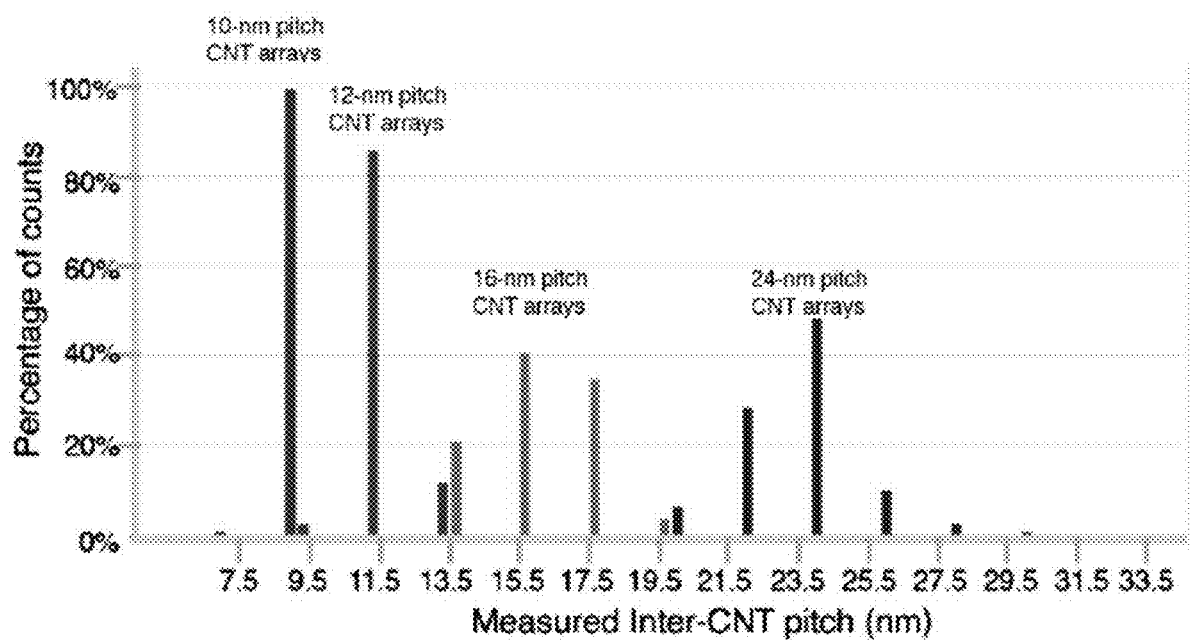
FIG. 36 shows distribution of inter-CNT pitches. At each prescribed inter-CNT pitch, the percentage of counts indicated the distribution of experimentally observed pitch values along x direction. The inter-CNT pitch was measured from the TEM images of 10 randomly selected DNA brick crystals. For each prescribed inter-CNT pitch, the numbers of total counted CNTs were around 50-300. Because the DNA brick crystals exhibited uneven width, the CNT counts varied from template to template. And at similar crystal width, DNA brick crystals with smaller pitch (i.e. 10.4 nm) had more CNT counts than that at larger pitch (i.e. 25.2 nm). For every two neighboring CNTs, we measured three different positions along the longitudinal axis of CNTs. The distribution of inter-CNT pitches revealed the assembly precision of CNTs within DNA nanotrenches. When the trench width was 6 nm, we noticed that the majority (>95%) of CNTs exhibited pitch variation less than 1 nm, indicative of sub-2 nm positioning precision within the narrow DNA nanotrenches.

The IDC values were 0.008, 0.002, and 0.001, respectively-orders of magnitude smaller than those from thin-film approaches (FIG. 14). The range and the percent relative range of the inter-CNT pitch variation were 5.9 nm and 36%, 2.7 nm and 24%, and 1.9 nm and 18% for 16.8-, 12.6-, and 10.4-nm inter-CNT pitches, respectively Narrower DNA nanotrenches improved the precision of CNT assembly (FIG. 36). When the width of DNA nanotrenches was decreased to ~6 nm (in 10.4-nm pitch CNT arrays), the range value of inter-CNT pitch was decreased to <2 nm and the IDC value (0.001) improved by eightfold, compared to a 5.9-nm range value and IDC value of 0.008 in 12-nm DNA trench width (in 16.8-nm pitch CNT arrays). The angular deviations for the assembled CNTs were less than 2°. Under the optimized buffer conditions (supplementary text S1.4), the assembly yields were over 95% (FIGS. 30, 32, and 34).

The synergy between electrostatic repulsions and DNA hybridization, enabled by the spatial confinement of nanotrenches, helped to eliminate the CNT assembly disorders. In the absence of DNA hybridization, CNTs could not be assembled within the DNA nanotrenches because of the electrostatic repulsions between the negatively charged CNTs and nanotrench sidewalls. The hybridization between DNA handles within the nanotrenches and the DNA anti-handles wrapping around CNTs stabilized CNTs within the DNA nanotrenches and resulted in an assembly yield >95%. The absence of effective DNA hybridizations in misaligned CNTs eliminated the assembly disorder by the electrostatic repulsions. The correctly assembled CNTs spatially shielded the DNA handles beneath from being accessed by other CNTs and repelled one another because of negative surface charge. Even for DNA nanotrenches (width from 6 to 12 nm) more than twofold larger than the diameter of single CNTs, we did not observe CNT bundling within individual trenches and achieved an IDC value of 0.001.

Figure 37:
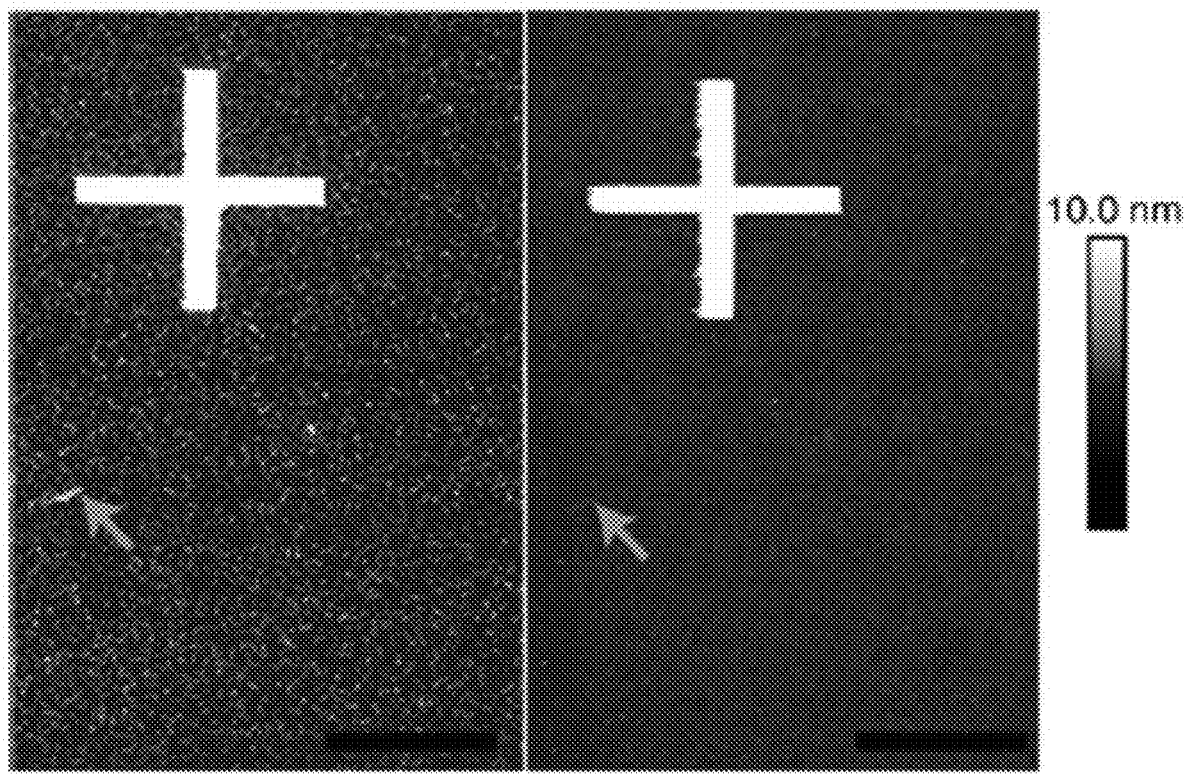
FIG. 37 shows zoomed-out AFM images for the deposited substrate before (left) and after (right) the liftoff process to remove salt residues and surface DNAs. Both images are scanned at the identical regions on the substrate. The bright cross shapes on both images are the fine alignment fiducial markers written with e-beam lithography. The scale bars are 3 μm. The bright spots in the left AFM image are salt residues. The arrows indicate the CNT-decorated DNA brick crystal before (left) and after (right) the liftoff process. After the liftoff process, most of salt residues (bright spots in the left) and surface DNAs (green arrow in the left) with height higher than 8 nm were removed (evidenced by the absence of bright spots and lowered heights of DNA area in the right image). The residual height was around 1 nm, as indicated by the height change in AFM.
Figure 38:
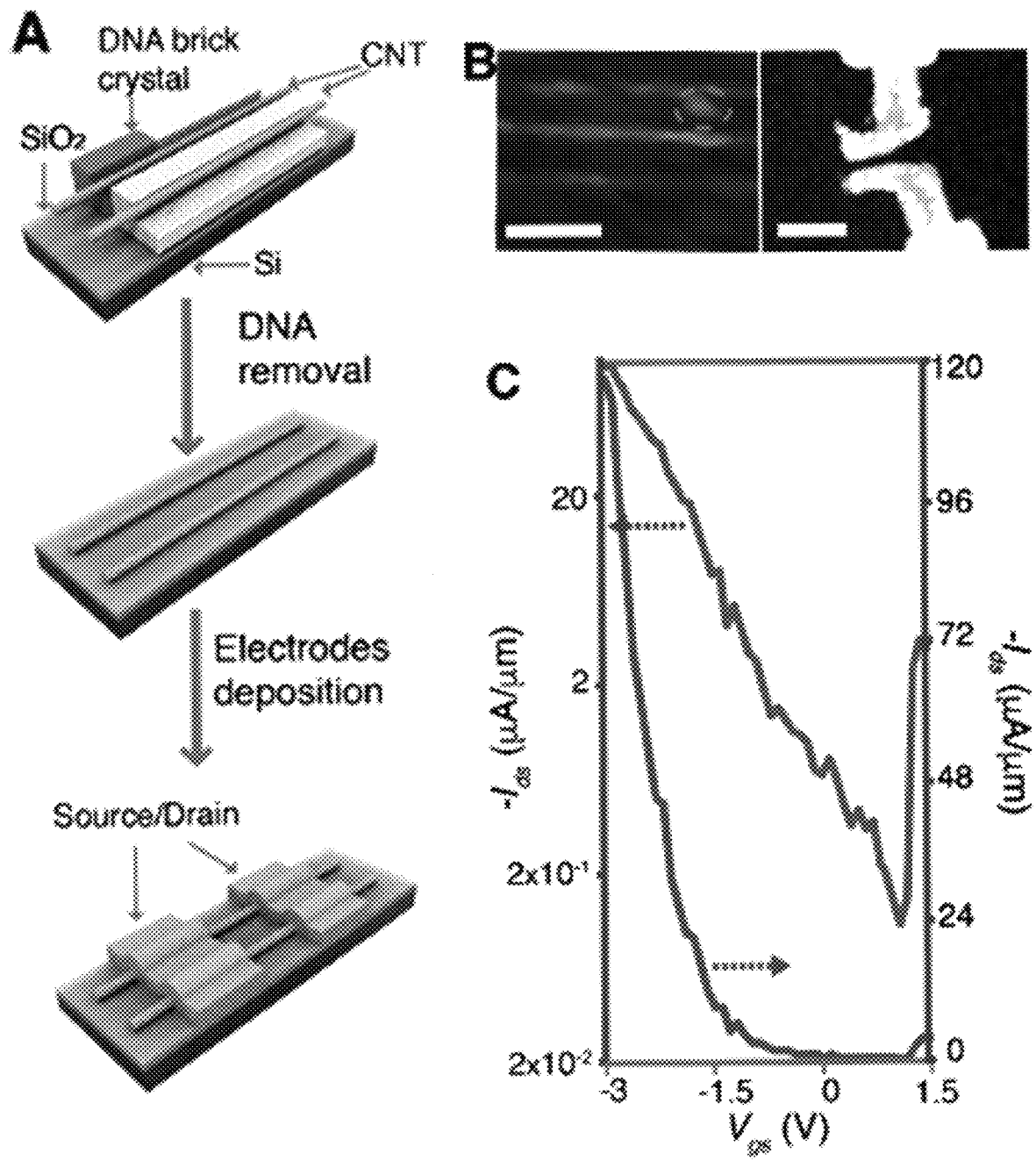
FIG. 38 shows constructing bottom-gated CNT FETs at 24-nm inter-CNT pitch. (A) Design schematic for DNA removal and depositing the source or drain electrodes. Bundles are a structural repeating unit of DNA brick crystals with 24 nm periodicity along the x direction. Rods are CNTs. Electrodes are shown. (B) Left, AFM image of the assembled CNT arrays after DNA removal. The scale bar is 50 nm. The circle indicates one residue after DNA removal. Right, AFM image of the fabricated FET. The scale bar is 300 nm. CNTs are not visible in the AFM image due to their small diameter compared to the electrode thickness. (C) The $I_{ds}$-$V_{gs}$ curve plotted in both logarithmic (left axis) and linear (right axis) scales at $V_{ds}$ of −0.5 V for a dual-channel CNT FET. $I_{ds}$ is normalized to the inter-CNT pitch.

Microliter assembly solution at sub-10 pM template concentration simultaneously provided millions of assembled CNT arrays at evenly spaced pitches, demonstrating the scalability of SHINE. We further tested using thermal annealing to remove DNA templates (FIGS. 37 and 38) and constructed proof-of-concept transistors from parallel CNT arrays (FIG. 38). The thermal decomposition of DNAs produced residual contaminations around CNTs that adversely affected the transistor performance. Thus, both low on-state current and large subthreshold swing values were recorded. By contrast, improving interface cleanliness for SHINE promotes transport performance comparable with chemical vapor deposition-grown or polymer-wrapped CNT arrays in a follow-up study. Additionally, using purer semiconducting CNTs may further improve performance.

Assembly of the designed DNA templates followed a multistage isothermal reaction. In brief, 90 µL mixture of unpurified DNA bricks (IDTDNA Inc., pH 7.9, containing 300-600 nM of each brick, without careful adjustment of each brick stoichiometry), 5 mM Tris, 1 mM EDTA, and 40 mM $MgCl_2$ was incubated at 80° C. for 15 min, 44° C. for 12 h, 39° C. for 72 h, and 31° C. for 8 h sequentially. The as-synthesized DNA templates were used without further purification.

With regard to wrapping CNTs with DNA, semiconducting CNT-enriched powder was used. The labeled purity for semiconducting CNTs was 95%, and the powder was used without further purification. Wrapping single-stranded DNAs onto CNT surface followed previous reports.

First, strand L1 (25 pM, sequence: GATGCGAGGCTAT-TCTGTGTGTGTGTGTGTGTGTGTGTGTGTGTGT-GTGTGTGT (Sequence ID No. 1)) was mixed with CNT powder (0.1 mg) in buffer (1×TBE and 100 mM NaCl at pH 8.3). The mixture was sonicated for 1 h, followed by high-speed centrifuge at 16,000 g for 30 min to remove aggregates. The supernatant solution was then purified using 100 kD Amicon filter (EMD Millipore) to get rid of excessive DNAs. Strand L2 (10 μM, sequence: AGAATAGCCTCGCATCCCACTTACCACTTA (Sequence ID No. 2)) was added to the purified CNT-L1 sample and annealed from 37° C. to 23° C. within 2 h, followed by incubation at 23° C. for 16 h. L2-wrapped CNTs were used without further purification. Notably, all the CNTs used in the manuscript exhibited irregular lengths.

We also tested using the electric arc CNTs (CNT powder, containing both metallic and semiconducting CNTs, were purchased from Carbon Solutions, Inc.). Semiconducting CNTs were purified and enriched using previously published method. The purity for the enriched semiconducting CNTs was ~95%. The method for wrapping DNAs onto the enriched semiconducting CNTs was identical to the method above. Note, after wrapping L1, we purified the L1-wrapped CNTs by a surfactant/DNA exchange process according to the previous published method.

With regard to, assembly of CNT arrays on DNA templates, L2-wrapped CNTs (0.4 μL) were mixed with 0.4 μL diluted DNA templates (10× dilution into 15 mM MgCl2 solution) into 6 μL final solution containing 10 mM MgCl2 and 400 mM NaCl (for 24-nm inter-CNT pitch sample) or 10 mM MgCl2, 300 mM NaCl, and 300 mM LiCl (for 16-/12-/10-nm inter-CNT pitch sample). The reaction buffer was incubated at 33° C. for 9 h, and then stored at 4° C. without further purification.

For the assembly of DNA brick crystals and DNA-wrapped CNTs, the buffer solutions were used according to previous reports. For the assembly of CNTs on DNA brick crystals with 24 nm inter-CNT pitch, we used a buffer solution containing 10 mM MgCl2 and 400 mM NaCl. Without NaCl, DNA-wrapped CNTs may aggregate during the incubation at 33° C. For 16-/12-/10-nm pitch DNA brick crystals, we further introduced lithium ion (300 mM) into the buffer to lower the electrostatic repulsions between the negatively charged DNA helices and CNTs.

Here, 0.6 μL as-prepared (without purification) DNA templates solution or CNT-decorated DNA templates solution was diluted into 5 μL water and adsorbed onto glow discharged carbon-coated TEM grids for 4 min. Then the remaining solution was wiped away, followed by negative staining using 6 μL 2% aqueous uranyl formate solution (7 sec) and a quick water rinsing. Imaging was performed using an JEOL 1200 operated at 80 kV.

A 7 μL as-prepared DNA templates solution or CNT-decorated DNA templates solution was deposited onto a 1-cm2 sized silicon chip followed by stepwise rinsing in 50%, 95%, and 99.5% ethanol. The sample was imaged on a multimode SPM via tapping mode.

The following five-step fabrication process is used to remove surface DNA, clean the substrate, and construct the electrodes onto CNTs: (1) a low resolution (>912 magnification) SEM imaging (LEO 1550) at 10 keV to identify the suitable areas for device fabrication; (2) fabricating fine alignment markers with e-beam lithography around the selected CNT arrays; (3) thermal annealing of the Si substrate at 550-C under Argon to clean the substrate and to reduce the DNA thickness; (4) using AFM (peak force mode) for precise registration of the assembled CNTs with respect to the fiducial markers; and (5) two-step e-beam lithography for fabricating the contact electrodes onto the assembled CNT arrays and electrical pads. Notably, after step 3, the surface roughness of the substrate is reduced from 1 nm before cleaning to 0.3 nm after cleaning. And the thickness of the DNA residues is reduced to less than 1 nm.

A 200-nm thick PMMA layer is spun onto the Si wafer and the fine alignment marker pattern is written using an ebeam tool (a current of 0.5 nA at a dose of 1800 μC/cm2). The alignment marker pattern is developed in a 1:3 mixture of MIBK and IPA. A 10-nm thick titanium film is deposited using thermal evaporation in a homebuilt evaporator. Liftoff is performed at room temperature in acetone without sonication followed by an IPA rinse and the sample is dried with Nitrogen. Finally, thermal annealing is performed using rapid thermal annealing tool with 20 psi Argon at 1 slm/min flow rate under 550° C. for 30 minutes. Notably, writing the markers before or after DNA deposition does not significantly affect the effectiveness of DNA removal.

A 200-nm thick PMMA is spun onto the Si wafer and the fine electrical contact pattern is written using Leica ebeam VB6 HR tool (a current of 0.5 nA at a dose of 1800 μC/cm2). The contact pattern is developed in a 1:3 mixture of MIBK and IPA, and then dried with compressed Nitrogen. To remove any residual DNA prior to metal deposition, sample is dipped in DNA Exitus Plus (AppliChem) solution for 15 sec followed by a DI water rinse and a quick dip (2 sec) in HCl followed by DI water rinse, then dried with Nitrogen. A stacking metal film of 1-nm thick titanium, 20-nm thick palladium, and 10-nm thick gold is deposited using thermal evaporation on a homebuilt evaporator. Liftoff is performed at room temperature in acetone without sonication, followed by an IPA rinse, and the sample is dried with Nitrogen.

For large electrical contact pads connecting to the fine electrical contacts, a 450-nm thick PMMA is spun onto the sample. Proximity corrected contact pad pattern is exposed using Leica ebeam VB6 HR tool with a current of 5 nA and dose depending on the area within the pattern. The contact pads pattern are developed in a 1:3 mixture of MIBK and IPA, then dried with compressed Nitrogen. A stacking metal film of 5-nm thick titanium and 50-nm thick gold is deposited using thermal evaporation on a homebuilt evaporator. Liftoff is performed at room temperature in acetone without sonication, followed by an IPA rinse, and the sample is dried with Nitrogen.

The electrical measurements on the constructed CNT FETs are performed at room temperature in a vacuum probe station connected to an Agilent B1500A Semiconductor Device Analyzer.

Assembly yield was estimated using TEM images. Assembly yield was defined as the total inner nanotrenches occupied by the correctly formed parallel CNT arrays over the total numbers of inner DNA nanotrenches. Two peripheral DNA nanotrenches on the boundaries were excluded considering the incomplete crystal formation on the growing edges. CNTs on 10 randomly selected DNA brick crystals were counted.

In the TEM images, the following occupation status for DNA nanotrenches were observed: (1) DNA trench contains one CNT, aligned along the longitudinal axis of the nanotrench, (2) DNA trench contains multiple CNTs, aligned along the longitudinal axis of the nanotrench, and CNTs are in the end-to-end conformation, (3) empty DNA trench. In our calculation, both (1) and (2) were considered as the trenches correctly occupied by the aligned CNTs.

$$\text{Assembly Yield} = \frac{\text{Number Trenches with aligned } CNTs}{Number Total \text{ inner trenches}}$$

Crossing or the bundling of CNTs within the DNA trenches was not shown, and the assembly yield does not include these typical misalignment defects. Hence, the definition of assembly yield does not over-estimate the yield for forming the uniform parallel CNT arrays.

CNT orientation was estimated using TEM images. The angular deviation of CNTs was defined as the difference between the longitudinal axis of CNT and the longitudinal axis of DNA nanotrenches. CNTs on 10 randomly selected DNA brick crystals were analyzed.

The range of inter-CNT pitch variation was defined as the difference between the maximum and minimum pitch values of adjacent CNTs. And the percent relative range of the inter-CNT pitch, defined as the range of inter-CNT pitch divided by the average value of inter-CNT pitch. The inter-CNT pitch was measured on TEM images. And CNTs on 10 randomly selected DNA brick crystals were measured. For every two neighboring CNTs, we measured three different positions along the longitudinal axis of CNT.

Mathematically, CNT arrays with 10-nm inter-CNT pitch exhibit local density of 100 CNTs/pm. However, CNT density does not reflect the array uniformity. Different from the uniform inter-CNT pitch demonstrated in the manuscript, other approaches for preparing CNT arrays with 100 CNTs/pm or higher density, including the repeated transfers (11), directional growth, and Langmuir-Schaefer approach, exhibit irregular array morphologies. Uneven inter-CNT pitch (ranging from 2 nm to a few micrometers in the same array) or random CNT orientation and the resulted crossing CNTs are often observed in these thin-film approaches.

It has been reported that IDC value (representative of CNT disorder) impacts the gate delay and the energy increase per cycle at 16 nm node. Their simulations indicate that, simply by reducing the IDC value from 0.5 to 0.1, both the gate delay and the energy increase per cycle improve by more than 50%. So smaller IDC values (higher array uniformity) lead to better device performance. However, many previous reports on the high-density CNT arrays exhibit IDC values higher than 0.5.

At ultra-scaled technology nodes, semiconductor industry typically has a high standard on the uniformity of the semiconductor channels. In Si CMOS at 14 nm technology node, the fin pitch variation is typically less than 3 nm, leading to an IDC value smaller than 0.01 This value is comparable to our demonstration for CNT channels.

Based on the discussions above, when using the parallel CNT arrays in the ultra-scaled technology nodes, the maximum allowed pitch variation and the IDC value should be similar to our demonstration.

Example 2. DNA-Directed Nanofabrication of High-Performance Carbon Nanotube Field-Effect Transistors Semiconducting carbon nanotubes (CNTs) are an attractive platform for field-effect transistors (FETs) because they potentially can outperform silicon as dimensions shrink. Challenges to achieving superior performance include creating highly aligned and dense arrays of nanotubes as well as removing coatings that increase contact resistance. Sun et al aligned CNTs by wrapping them with single-stranded DNA handles and binding them into DNA origami bricks that formed an array of channels with precise intertube pitches as small as 10.4 nanometers Zhao et al. then constructed single and multichannel FETs by attaching the arrays to a polymer-templated silicon wafer. After adding metal contacts across the CNTs to fix them to the substrate, they washed away all of the DNA and then deposited electrodes and gate dielectrics. The FETs showed high on-state performance and fast on-off switching.

Biofabricated semiconductor arrays exhibit smaller channel pitches than those created using existing lithographic methods. However, the metal ions within biolattices and the sub micrometer dimensions of typical biotemplates result in both poor transport performance and a lack of large-area array uniformity. Using DNA-templated parallel carbon nanotube (CNT) arrays as model systems, we developed a rinsing-after-fixing approach to improve the key transport performance metrics by more than a factor of 10 compared with those of previous biotemplated field-effect transistors. We also used spatially confined placement of assembled CNT arrays within polymethyl methacrylate cavities to demonstrate centimeter-scale alignment. At the interface of high-performance electronics and biomolecular self-assembly, such approaches may enable the production of scalable biotemplated electronics that are sensitive to local biological environments.

In projected high-performance, energy-efficient field-effect transistors (FETs), evenly spaced small-pitch (where pitch refers to the spacing between two adjacent channels within an individual FET) semiconductor channels are often required. Smaller channel pitch leads to higher integration density and on-state performance, but it has the risk of enhanced destructive short-range screening and electrostatic interactions in low-dimensional semiconductors, such as carbon nanotubes (CNTs). Evenly spaced alignment minimizes the channel disorder that affects the switching between on and off states. Therefore, although high-density CNT thin films exhibit on-state performance comparable to that of Si FETs, degraded gate modulation and increased subthreshold swing are observed because of the disorder in the arrays.

Biomolecules such as DNAs can be used to organize CNTs into prescribed arrays. On the basis of the spatially hindered integration of nanotube electronics (SHINE), biofabrication further scales the evenly spaced channel pitch beyond lithographic feasibility. However, none of the biotemplated CNT FETs have exhibited performance comparable to that of those constructed with lithography or thin-film approaches. Additionally, during the surface placement of biotemplated materials, broad orientation distributions prevent their large-scale alignment.

In this Example, small regions of nanometer-precise biomolecular assemblies can be integrated into the large arrays of solid-state high-performance electronics. We used the parallel semiconducting CNT arrays assembled through SHINE as model systems. At the FET channel interface, we observed lower on-state performance induced by high concentrations of DNA and metal ions Using a rinsing-after-fixing approach, we eliminated the contamination without degrading CNT alignment. On the basis of the uniform inter-CNT pitch and clean channel interface, we constructed solid-state multichannel PMOS (p-channel metal-oxide semiconductor) CNT FETs that displayed high on-state performance and fast on-off switching simultaneously. Using lithography-defined polymethyl methacrylate (PMMA) cavities to spatially confine the placement of the CNT-decorated DNA templates, we demonstrated aligned arrays with prescribed geometries over a 0.35-$cm^2$-area substrate. Building high-performance, ultra-scaled devices at the biology-electronics interface may enable diverse applications in the post-Si era, such as multiplexed biomolecular sensors and three-dimensional (3D) FETs with nanometer-to-centimeter array scalability.

Figure 44:
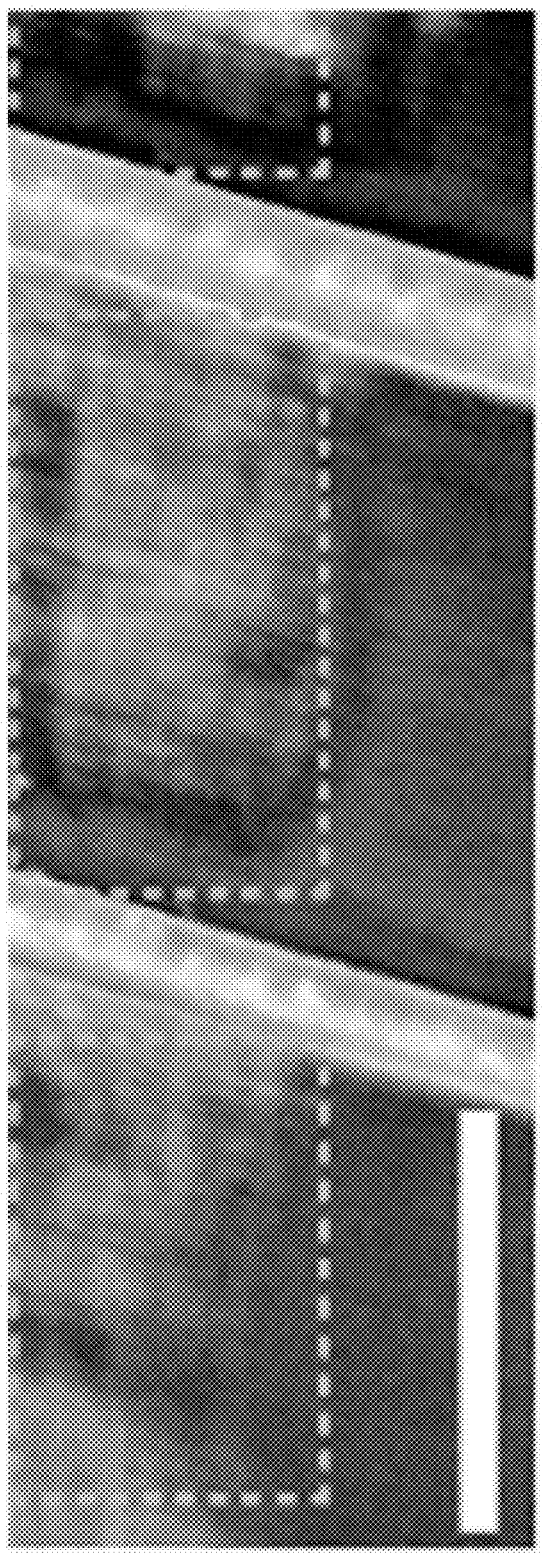
FIG. 44 shows SEM image of fixed CNT array after DNA removal. In the circle area, both ends of CNTs were fixed by two metal bars, and used for FET construction. In other circle areas, the unfixed CNT ends may be disturbed during DNA removal, and were not used for FET construction. The scale bar is 500 nm.
Figure 45:
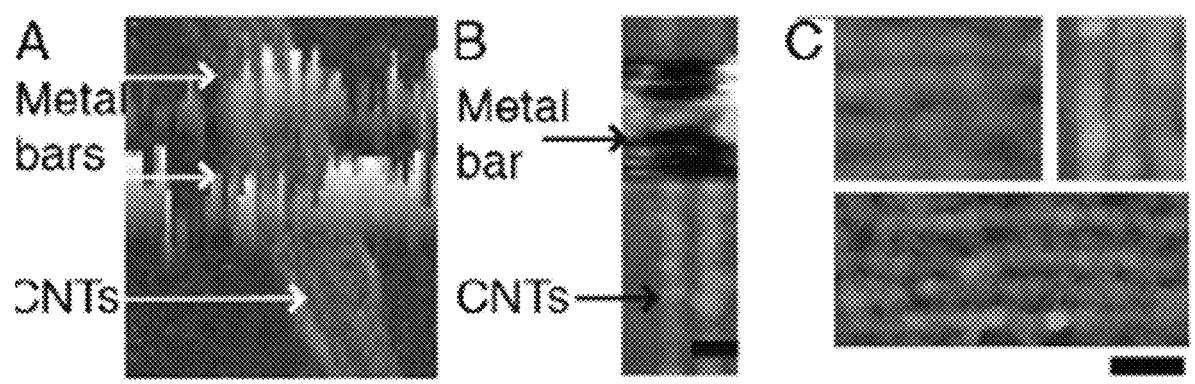
FIG. 45 shows AFM images of the fixed CNT arrays after DNA removal. (A) 3D zoomed-out view of the CNT arrays fixed by two metal bars. (B) zoomed-in view of CNTs fixed by metal bar. The scale bar is 25 nm. (C) more zoomed-in AFM images of the fixed CNT arrays after DNA removal. The scale bar is 50 nm.
Figure 46:
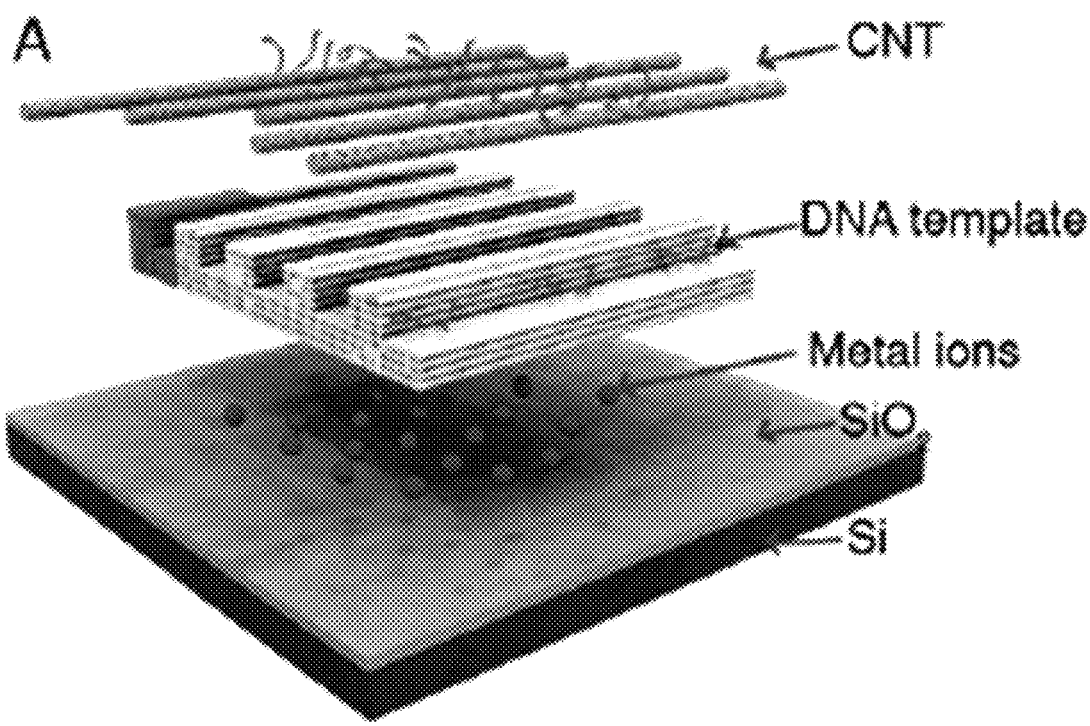
FIG. 46 shows schematics for different compositions at channel interface. (A) after assembly and (B) after removing DNA templates and metal ions.
Figure 46:
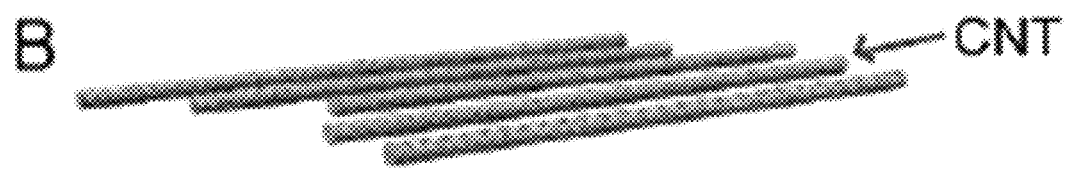
Figure 46:
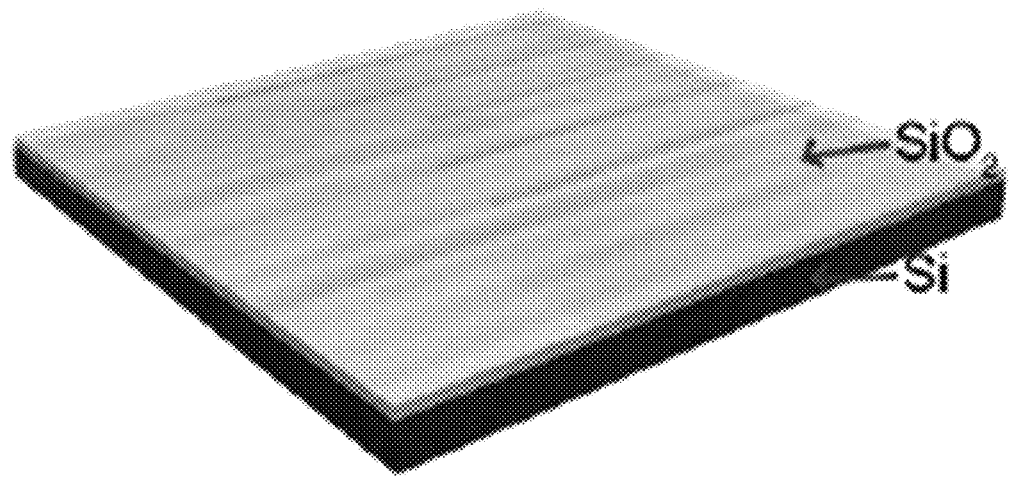

We assembled DNA-templated CNT arrays using DNA-based SHINE. We applied a rinsing-after-fixing approach (FIG. 39A) to remove the DNA templates. Starting from the surface-deposited DNA-templated CNT arrays, both ends of the DNA-templated CNT arrays were first fixed onto a Si wafer with deposited metal bars (first step in FIG. 39A). DNA templates and high-concentration metal salts (1 to 2 M) within the DNA helices were gently removed through sequential rinsing with water and low-concentration $H_2O_2$ (second step in FIG. 39A and FIG. 46). The inter-CNT pitch and the alignment quality of the assembled CNTs were not degraded during the rinsing process (FIG. 39B and FIGS. 44 and 45).

Figure 39:
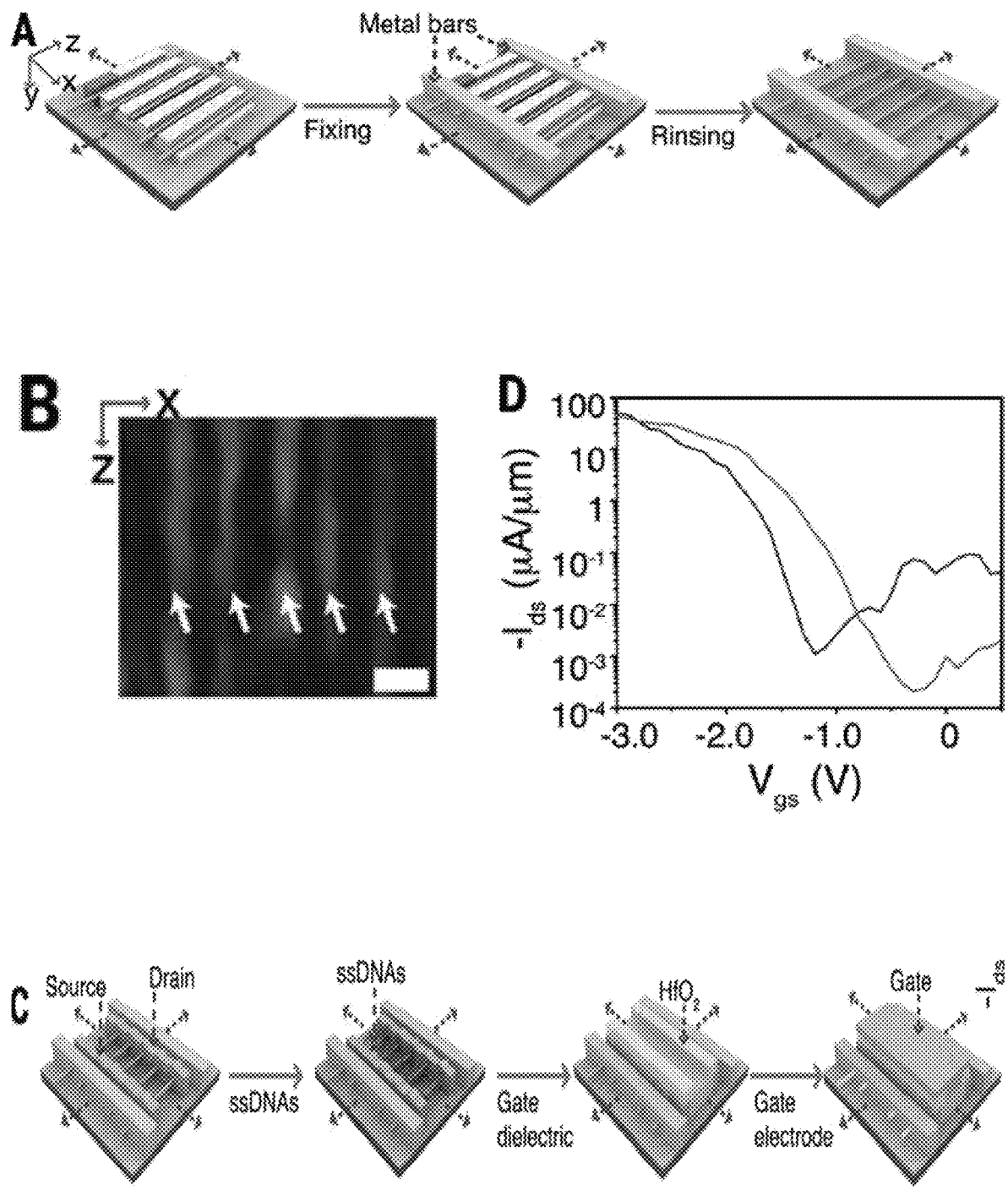
FIG. 39 shows multichannel CNT FETs with ssDNAs at channel interface. (A) Design schematic for the rinsing-after-fixing approach. Arrows indicate the extension direction of DNA templates and the assembled CNTs. (B) Zoomed-in AFM image along the x and z projection direction for CNT arrays after template removal. Arrows indicate the assembled CNTs. Scale bar, 25 nm. (C) Design schematic for introducing ssDNAs at channel interface and FET fabrication. (D) The $I_{ds}$-$V_{gs}$ curves [drain-to-source current density ($I_{ds}$) versus $V_{gs}$ plotted in logarithmic at a $V_{ds}$ of −0.5 V] for a multichannel DNA-containing CNT FET before and after thermal annealing.
Figure 47:
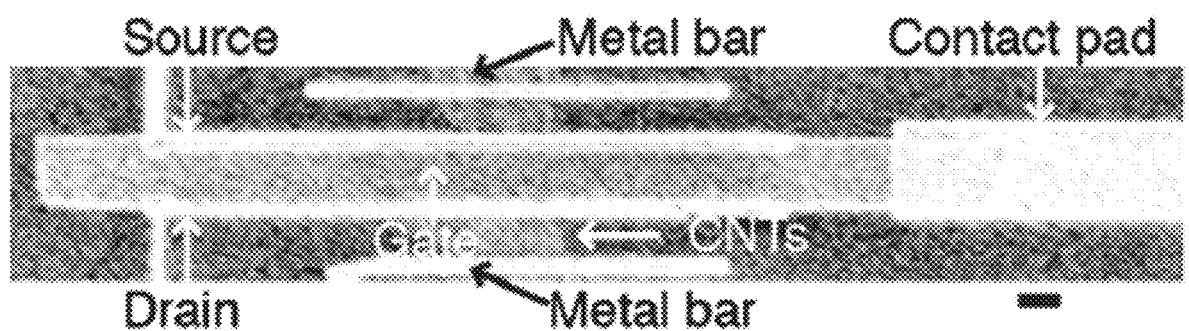
FIG. 47 shows zoomed-out SEM image of the constructed multichannel DNA-containing CNT FET. The scale bar is 200 nm.

To explore the effect of single-stranded DNAs (ssDNAs) at the channel interface, we first fabricated the source and drain electrodes onto the rinsed CNT arrays (FIG. 39C, left). Next, ssDNAs were introduced exclusively into the pre-defined channel area (first step in FIG. 39C; channel length ~200 nm). Finally, a gate dielectric of $HfO_2$ and a gate electrode of Pd were sequentially fabricated (second and third steps in FIG. 39C and FIG. 47).

Figure 48:
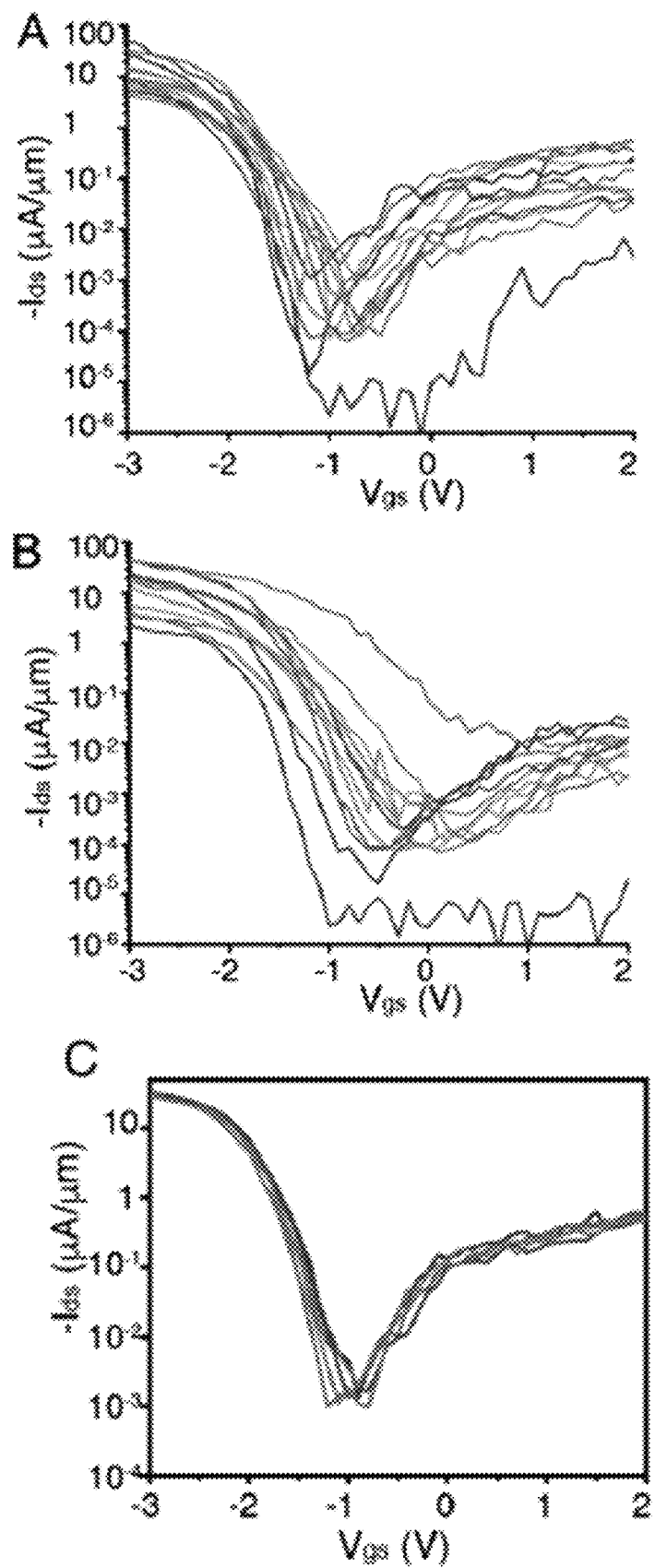
FIG. 48 shows $I_{ds}$-$V_{gs}$ curves for multichannel DNA-containing CNT FETs. The CNT FETs before (A) and after (B) thermal annealing. Different lines represent distinct CNT FETs. Lines in (A) and (B) represent the CNT FETs. (C) One DNA-containing CNT FET in (A) under repeated measurements from 2 to −3 V. Different lines represent distinct measurements. The $V_{ds}$ in (A), (B), and (C) were all set at −0.5 V. $I_{ds}$ was normalized to the inter-CNT pitch.

Out of 19 FETs we constructed, 63% (12 of 19) showed typical gate modulation (on-state current density divided by off-state current density, $I_{on}/I_{off}$, exceeded $10^3$ FIG. 48). The other seven devices exhibited $I_{on}/I_{off}$<5, which was caused by the presence of metallic CNTs within the array. At a drain-to-source bias ($V_{ds}$) of −0.5 V one typical multichannel DNA-containing CNT FET (FIG. 39D) exhibited a threshold voltage ($V_{th}$) of ~−2 V, an $I_{on}$ of 50 µA/µm (normalized to the inter-CNT pitch) at a gate-to-source bias ($V_{gs}$) of −3 V, a subthreshold swing of 146 mV per decade, a peak transconductance ($g_m$) of 23 µS/µm, and an on-state conductance ($G_{on}$) of 0.10 mS/µm. Statistics over all of the 12 operational FETs exhibited a $V_{th}$ distribution of −2±0.10 V, an $I_{on}$ of 4 to 50 µA/µm, and a subthreshold swing of 164±44 mV per decade (FIG. 48A). The transport performance was stable during repeated measurements (FIG. 48C).

Figure 57:
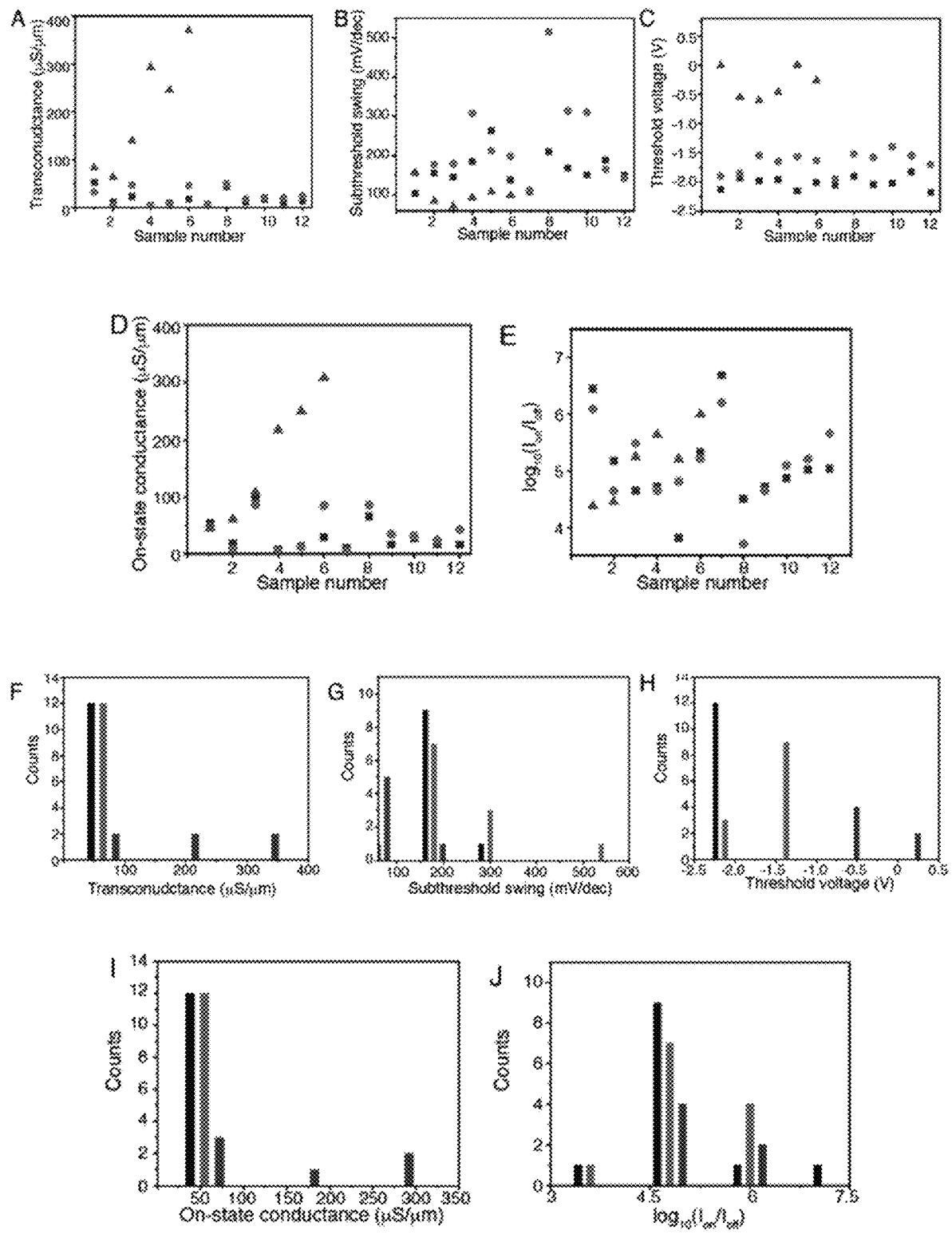
FIG. 57 shows performance comparisons for the constructed multichannel CNT FETs with different interfacial compositions. From (A) to (E), transconductance, subthreshold swing, threshold voltage, on-state conductance, and $I_{on}/I_{off}$ are compared for different FET samples. Squares represent multichannel DNA-containing CNT FETs before annealing. Circles represent thermal-annealed multichannel DNA-containing CNT FETs. Triangles represent multichannel DNA-free CNT FETs. Sample number was the assigned testing number for each FET. From (F) to (J), statistics of transconductance, subthreshold swing, threshold voltage, on-state conductance, and $I_{on}/I_{off}$ for different channel compositions. Bars represent multichannel DNA-containing CNT FETs before annealing. Other bars represent thermal-annealed multichannel DNA-containing CNT FETs. Yet other bars represent multichannel DNA-free CNT FETs. All the performance data were acquired at the $V_{ds}$ of −0.5 V. For multichannel DNA-containing CNT FETs before and after annealing, the performance data were acquired at the $V_{gs}$ of −3.0 V. For multichannel DNA-free CNT FETs, the performance data were acquired at the $V_{gs}$ of −1.5 V.

We annealed the above DNA-containing FETs at 400° C. for 30 min under vacuum to thermally decompose ssDNAs, and we then recharacterized the transport performance. Compared with the unannealed samples, thermal annealing (FIG. 39D and FIGS. 48 and 57) slightly shifted the average $V_{th}$ (~0.35 V, for a $V_{th}$ of −1.65±0.17 V after annealing) and increased the average subthreshold swing by ~70 mV per decade (subthreshold swing of 230+112 mV per decade after annealing) Other on-state performance metrics, including $g_m$ and $G_{on}$, as well as FET morphology, did not substantially change after annealing.

Figure 40:
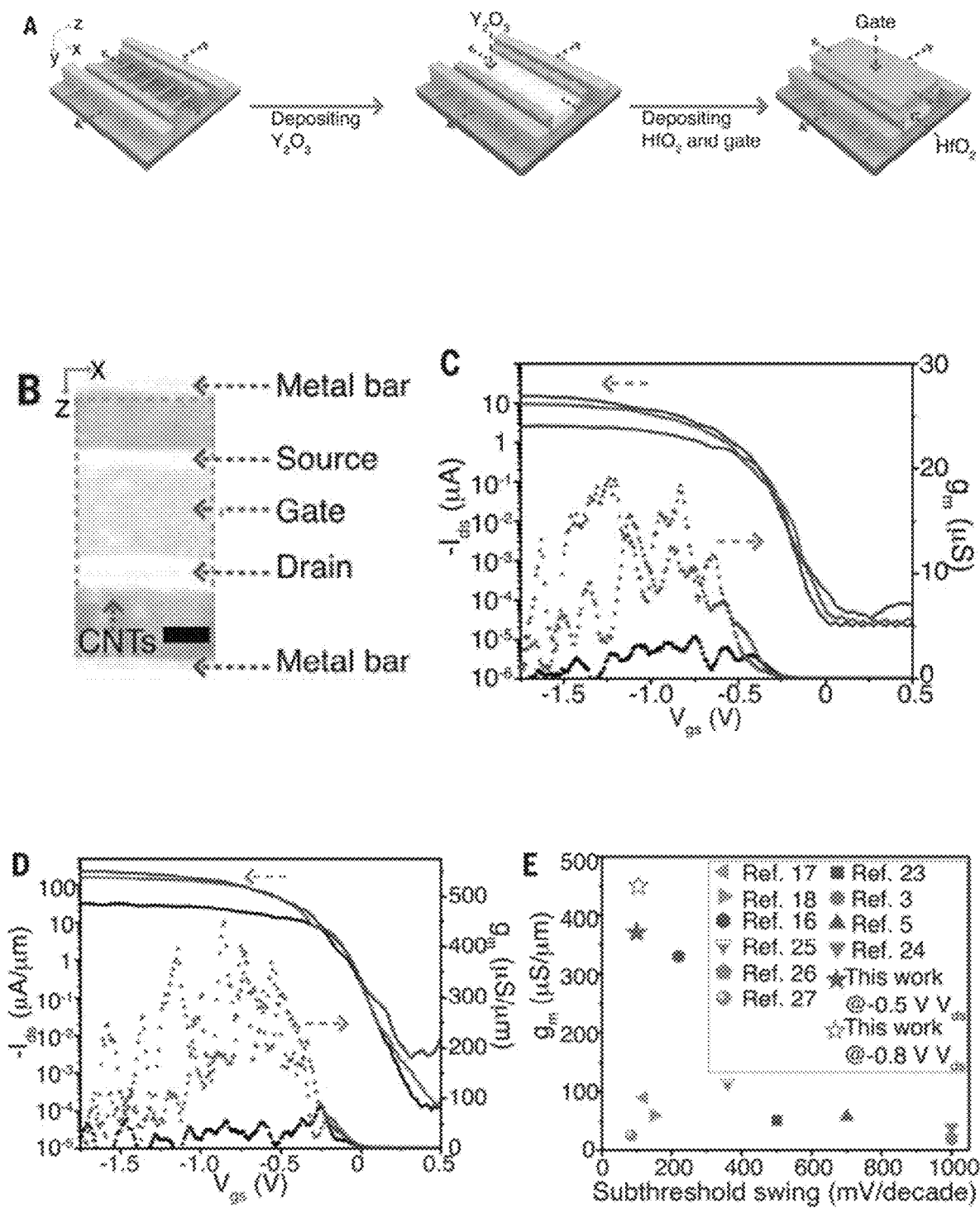
FIG. 40 shows constructing top-gated high-performance CNT FETs. (A) Design schematic for the fabrication of top-gated DNA-free FETs. (B) Zoomed-in SEM image along the x and z projection direction for the constructed multichannel CNT FET. Scale bar, 100 nm. (C and D) The $I_{ds}$-$V_{gs}$ curves (solid lines, plotted in logarithmic scale corresponding to left axis) and gm-$V_{gs}$ curves (dotted lines, plotted in linear scale corresponding to right axis) for single-channel (C) and multichannel (D) CNT FETs. Shown (C) and (D) are $V_{ds}$ of −0.8, −0.5, and −0.1 V. Arrows indicate the corresponding axes. (E) Benchmarking of the current multichannel CNT FET in (D) with other reports of high-performance CNT FETs.
Figure 49:
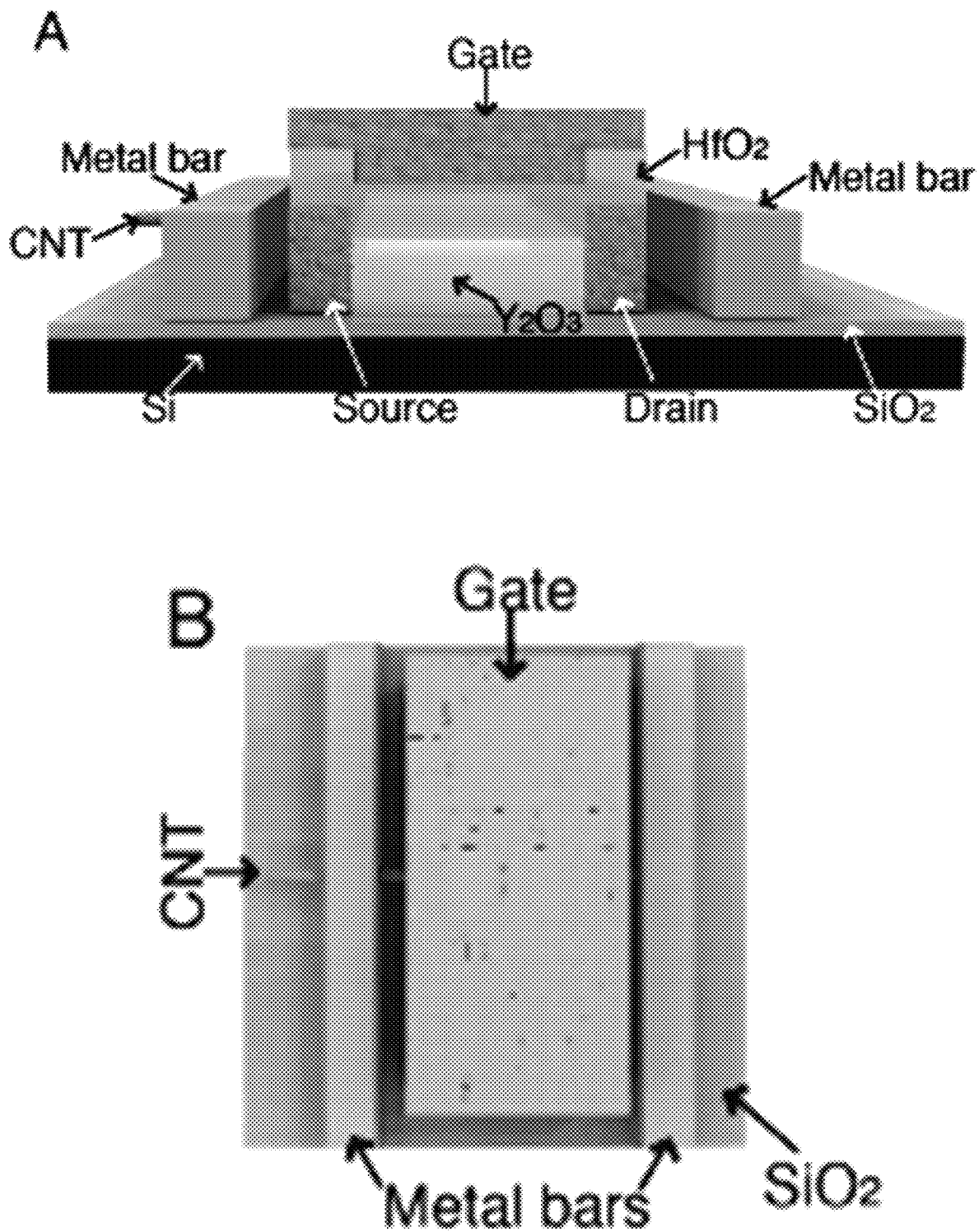
FIG. 49 shows design schematics of the constructed single-channel DNA-free CNT FET. (A) side view and (B) top view of the FET design.
Figure 50:
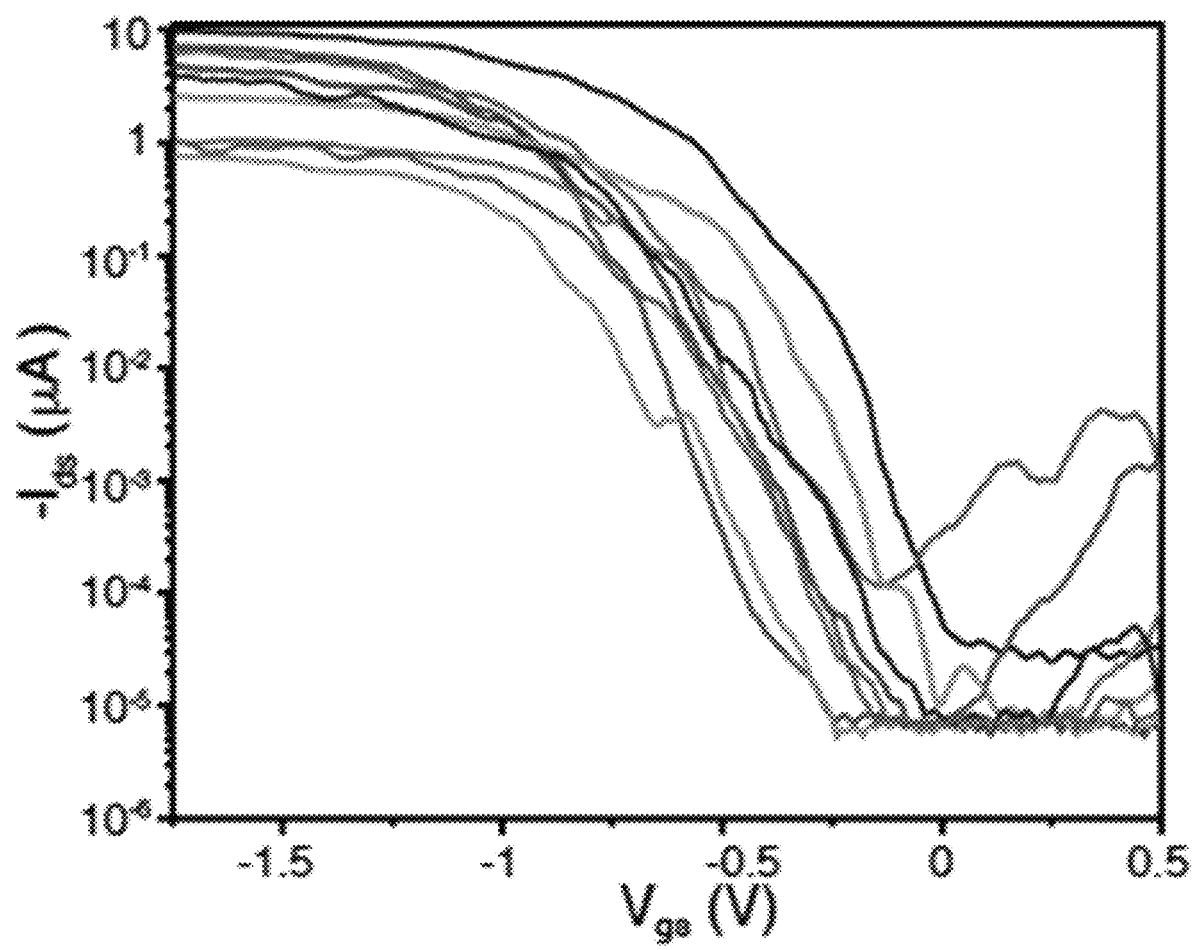
FIG. 50 shows $I_{ds}$-$V_{gs}$ curves for all the operational single-channel DNA-free CNT FETs. Different lines represent distinct CNT FETs. The $V_{ds}$ was set at −0.5 V.
Figure 51:
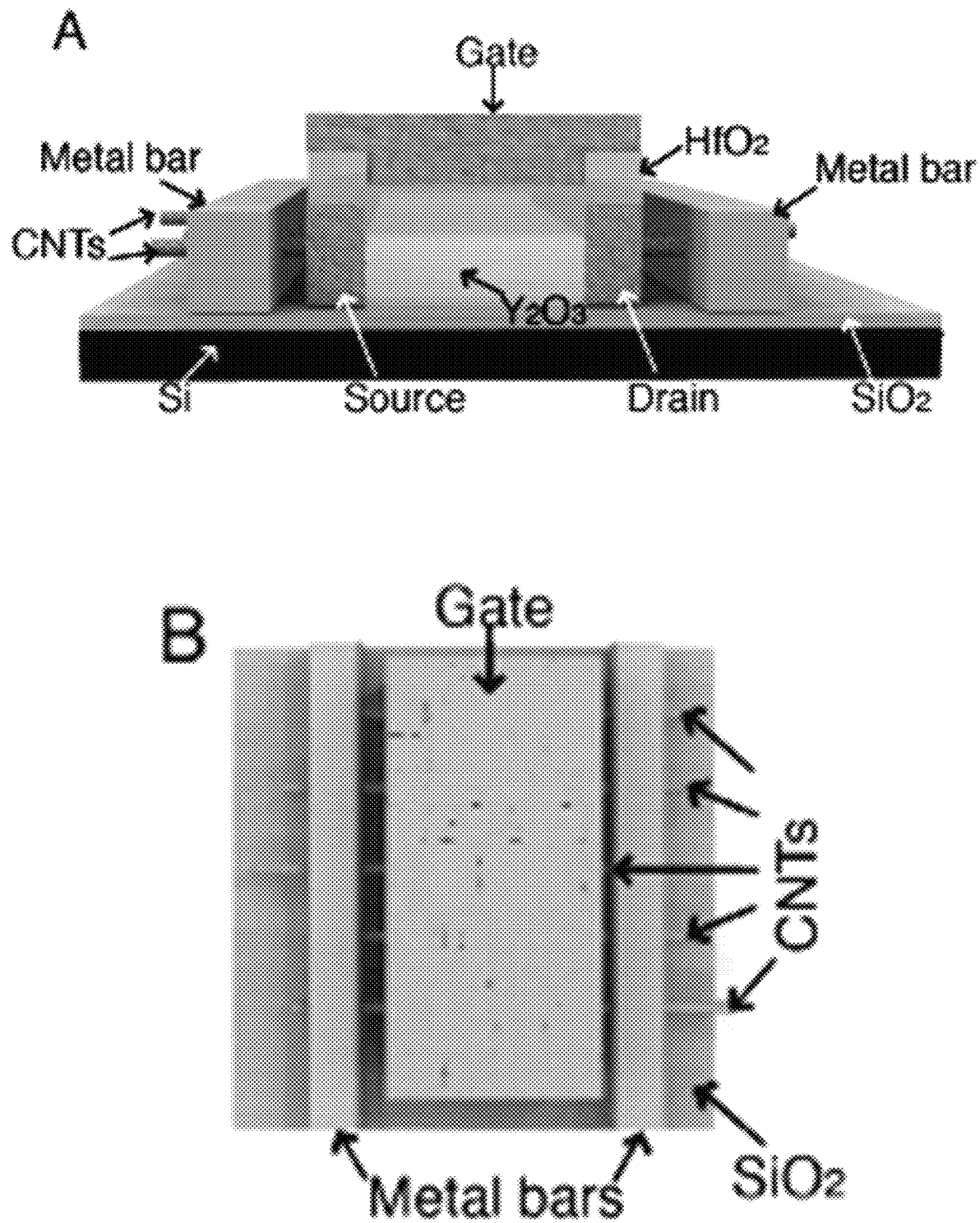
FIG. 51 shows constructed multichannel DNA-free CNT FET. (A) side view and (B) top view of the FET design.
Figure 52:
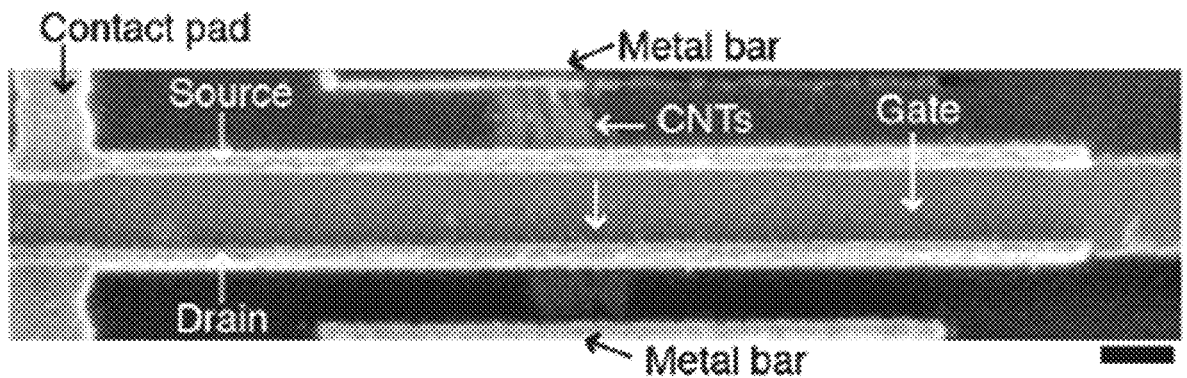
FIG. 52 shows a zoomed-out SEM image of the constructed multichannel DNA-free CNT FET. The scale bar is 200 nm.
Figure 53:
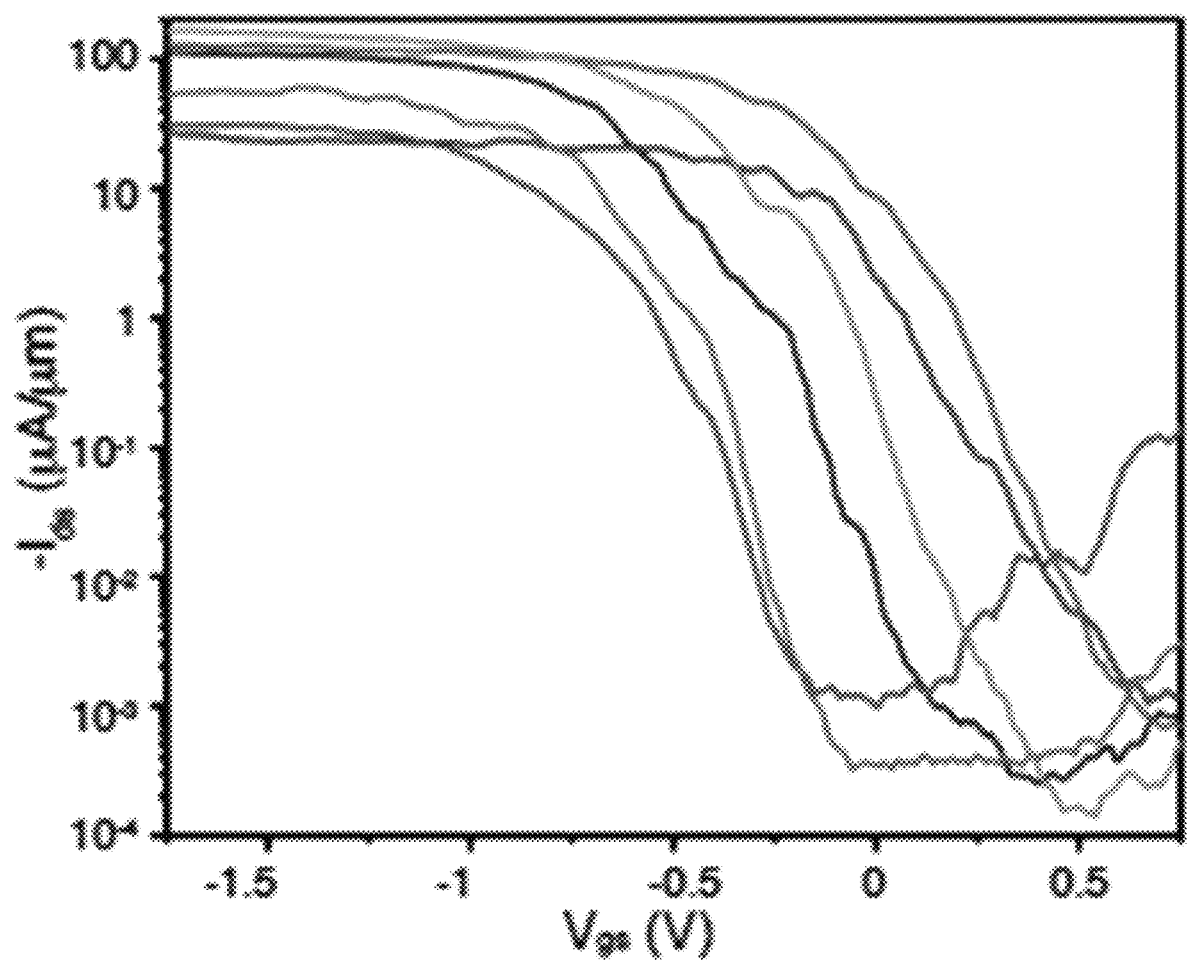
FIG. 53 shows $I_{ds}$-$V_{gs}$ curves for the all the operational multichannel DNA-free CNT FETs. Different lines represent distinct CNT FETs. $I_{ds}$ was normalized to the inter-CNT pitch. The $V_{ds}$ was set at −0.5 V.
Figure 56:
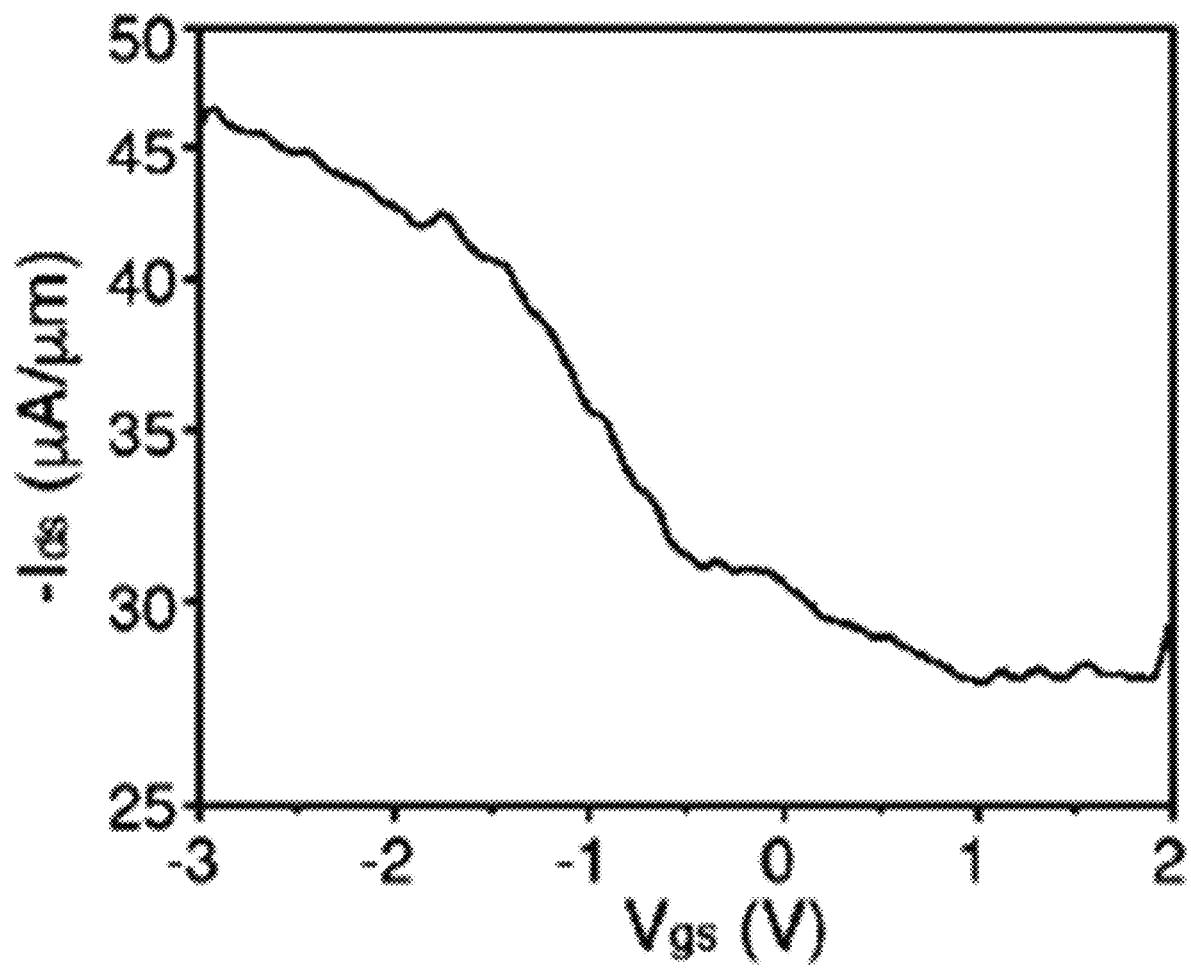
FIG. 56 shows $I_{ds}$-$V_{ds}$ curve for the multichannel DNA-free CNT FET containing metallic CNT impurity. The Vds was set at −0.5 V. $I_{ds}$ was normalized to the inter-CNT pitch.

To build high-performance CNT FETs from biotemplates, we deposited a composite gate dielectric ($Y_2O_3$ and $Hf_2$) into the rinsed channel area instead of introducing ssDNAs (FIGS. 40, A and B, and FIGS. 51 and 52). Of all the FETs constructed, 54% (6 of 11) showed gate modulation (FIG. 53). The other 5 of 11 FETs contained at least one metallic CNT within the channel (FIG. 56). Using an identical fabrication process, we also constructed another nine operational single-channel DNA-free CNT FETs for comparing transport performance (FIG. 49). The single-channel CNT FET (channel length ~200 nm) with the highest on-state performance exhibited an on-state current of 10 µA per CNT ($V_{ds}$ of −0.5 V) at the thermionic limit of subthreshold swing (i.e., 60 mV per decade; FIG. 40C and FIG. 50).

Figure 54:
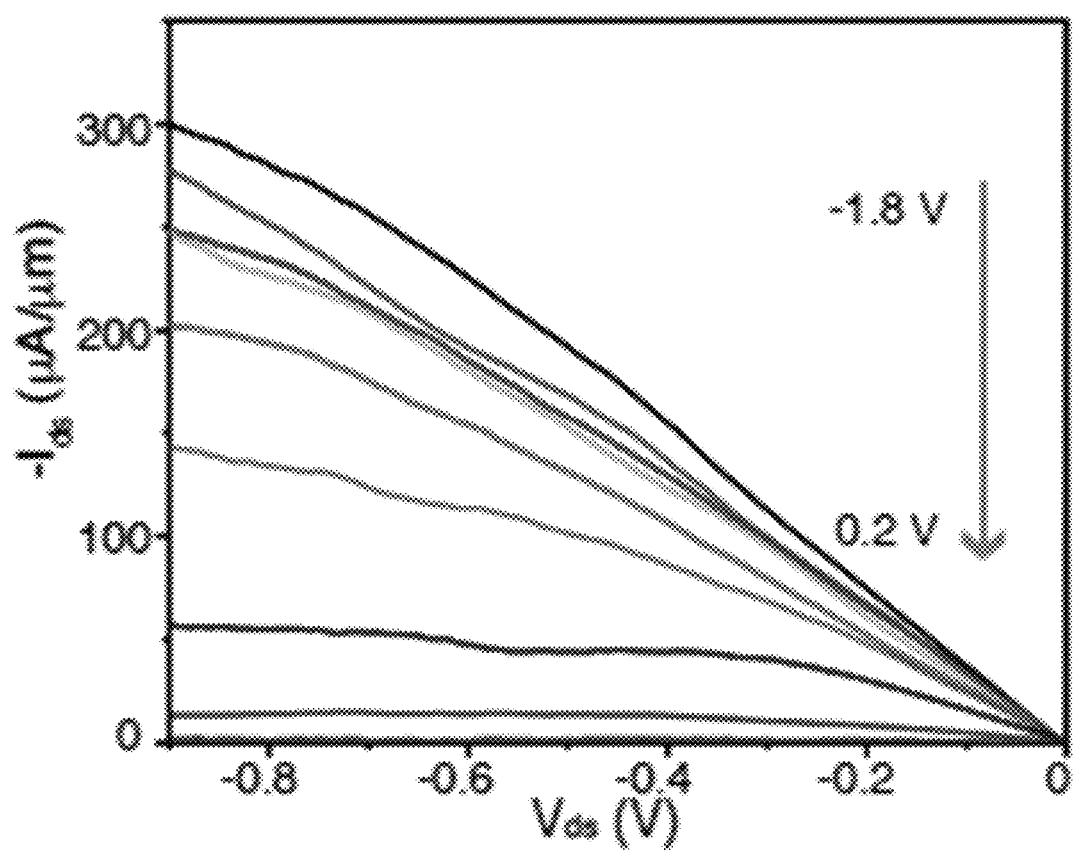
FIG. 54 shows Is-V& curves for the multichannel DNA-free CNT FET with highest on-current density at 200 nm channel length. Different lines represent distinct $V_{gs}$. $V_{gs}$ was ranging from −1.8 V to 0.2 V, at a step of 0.2 V. $I_{ds}$ was normalized to the inter-CNT pitch.

At a $V_{ds}$ of −0.5 V, the multichannel DNA-free CNT FET (channel length ~200 nm, inter-CNT pitch of 24 nm) with the highest on-state performance (FIG. 40D and FIG. 54) exhibited a $V_{th}$ of −0.26 V, an $I_{on}$ of 154 µA/µm (at a $V_{gs}$ of −1.5 V), and a subthreshold swing of 100 mV per decade. The $g_m$ and $G_{on}$ values were 0.37 and 0.31 mS/µm, respectively. The noise in the $g_m$-$V_{gs}$ curves may originate from thermal noise, or disorder and scattering within the composite gate construct. The on-state current further increased to ~250 µA/µm, alongside a $g_m$ of 0.45 mS/µm and a subthreshold swing of 110 mV per decade, at a $V_{ds}$ of −0.8 V.

Figure 58:
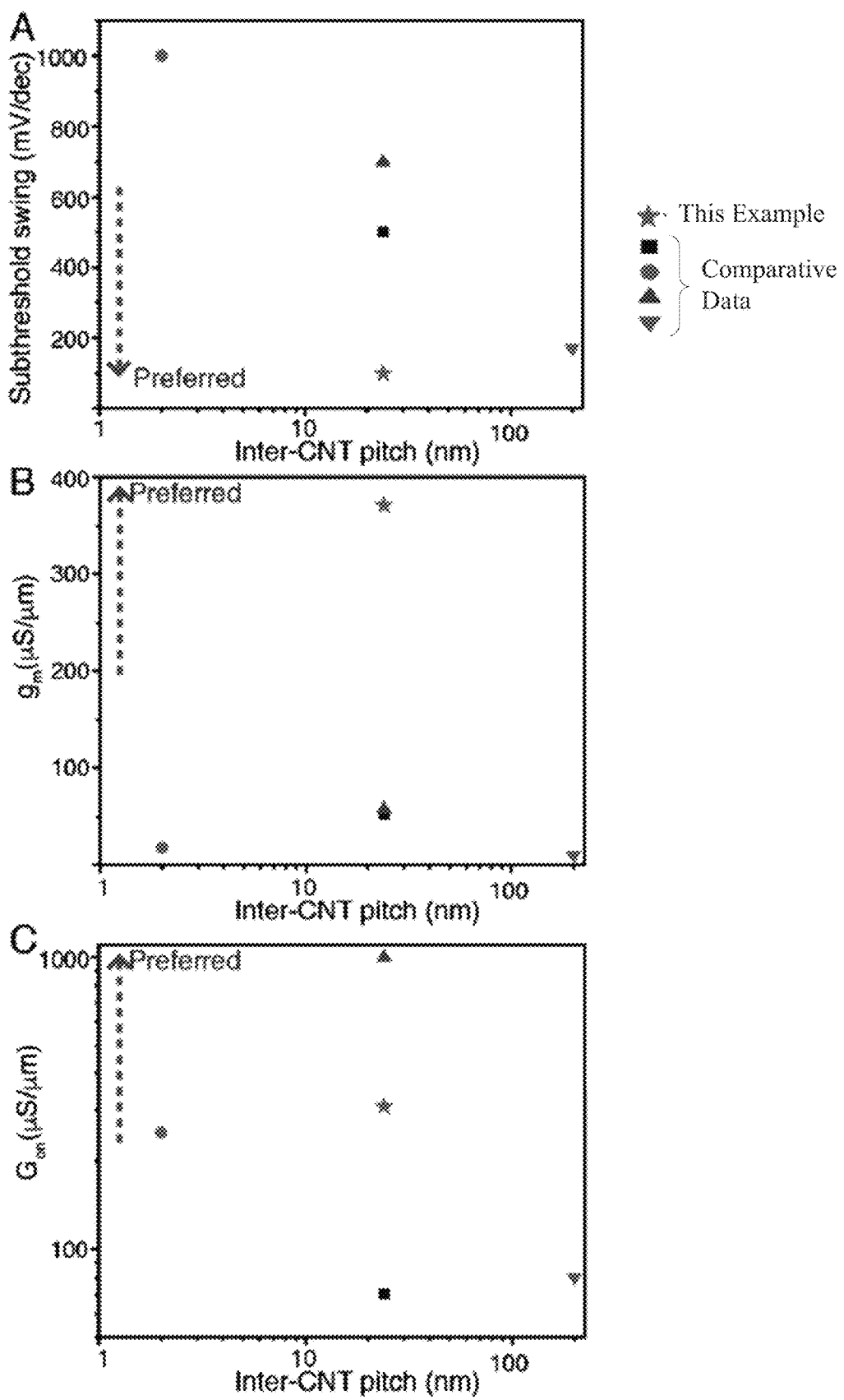
FIG. 58 shows benchmarking of CNT FETs with different inter-CNT pitches. Benchmarking of our multichannel CNT FET with other reports (evenly spaced inter-CNT pitches) regarding: (A), subthreshold swing, (B), transconductance (gm), and (C), on-state conductance (Gon). Channel lengths are ranging from 100 nm to 500 nm. In each panel, transport performance (i.e., subthreshold swing, on-state conductance, and transconductance) are plotted versus structural parameter (inter-CNT pitch). High transport performance requires the demonstration of small subthreshold swing, high transconductance, and high on-state conductance simultaneously. Multichannel CNT FET exhibits smallest subthreshold swing, highest transconductance, and 2nd highest on-state conductance, compared to other FETs with different inter-CNT pitches.
Figure 59:
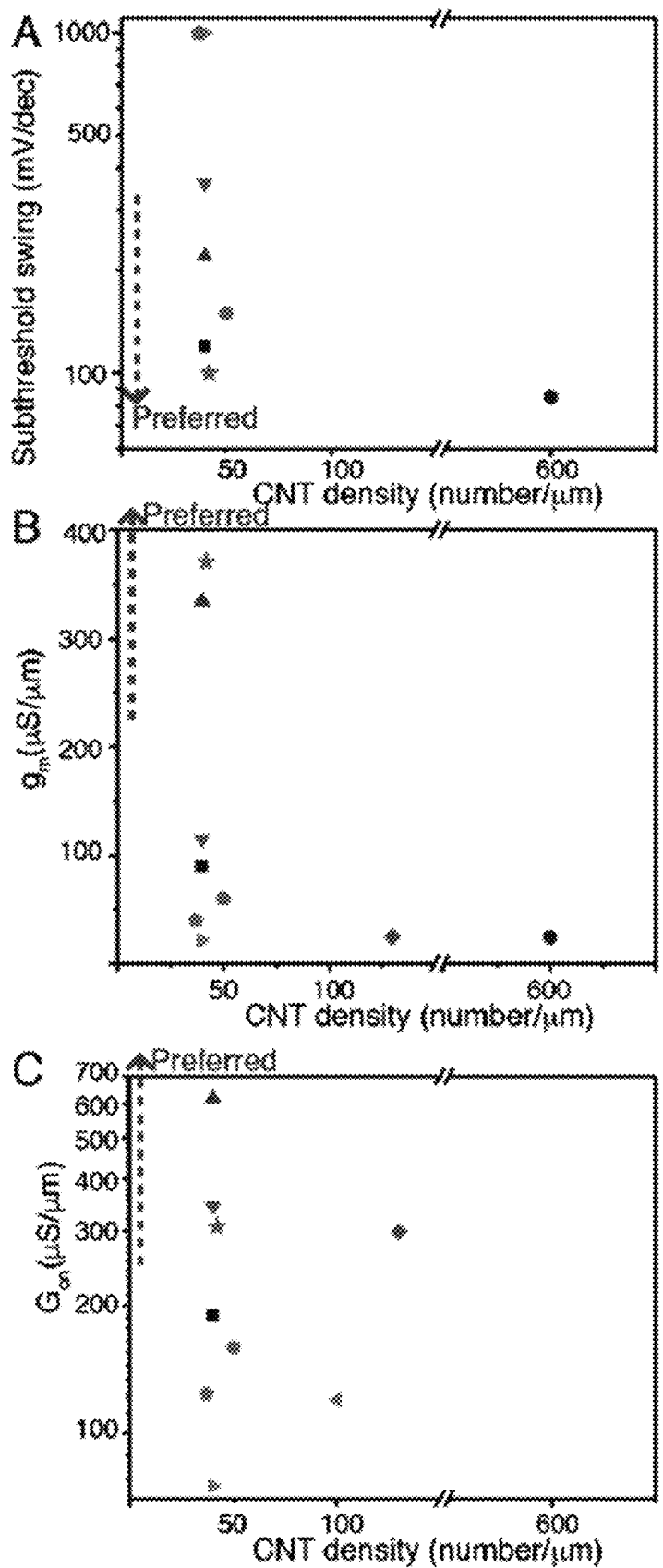
FIG. 59 shows benchmarking of CNT FETs with different CNT densities. Benchmarking of our multichannel CNT FET with other reports using high-density CNT thin films (uneven inter-CNT pitch) regarding: (A), subthreshold swing, (B), transconductance (gm), and (C), on-state conductance (Gon). Channel lengths are ranging from 100 nm to 500 nm. In each panel, transport performance (i.e. subthreshold swing, on-state conductance, and transconductance) are plotted versus structural parameter (CNT density). High transport performance requires the demonstration of small subthreshold swing, high transconductance, and high on-state conductance simultaneously. Our multichannel CNT FET exhibits 2nd smallest subthreshold swing, highest transconductance, and 3rd highest on-state conductance, compared to other FETs with different CNT densities. Notably, FET with smallest subthreshold swing exhibits an on-current density less than 5 μA/pm, which does not meet the transport requirements of high-performance CNT FET.

At a similar channel length and $V_{ds}$ (−0.5 V), we benchmarked the transport performance ($g_m$ and subthreshold swing) against that of conventional thin-film FETs using chemical vapor deposition (CVD)-grown or polymer-wrapped CNTs (FIG. 40E and FIGS. 58 and 59). Both high on-state performance (a $g_m$ of ~0.37 mS/µm) and fast on-off switching (a subthreshold swing of ~100 mV per decade) could be simultaneously achieved within the same solid-state FET, whereas thin-film CNT FETs with a similar subthreshold swing (~100 mV per decade) exhibited a >50% smaller $g_m$.

Figure 55:
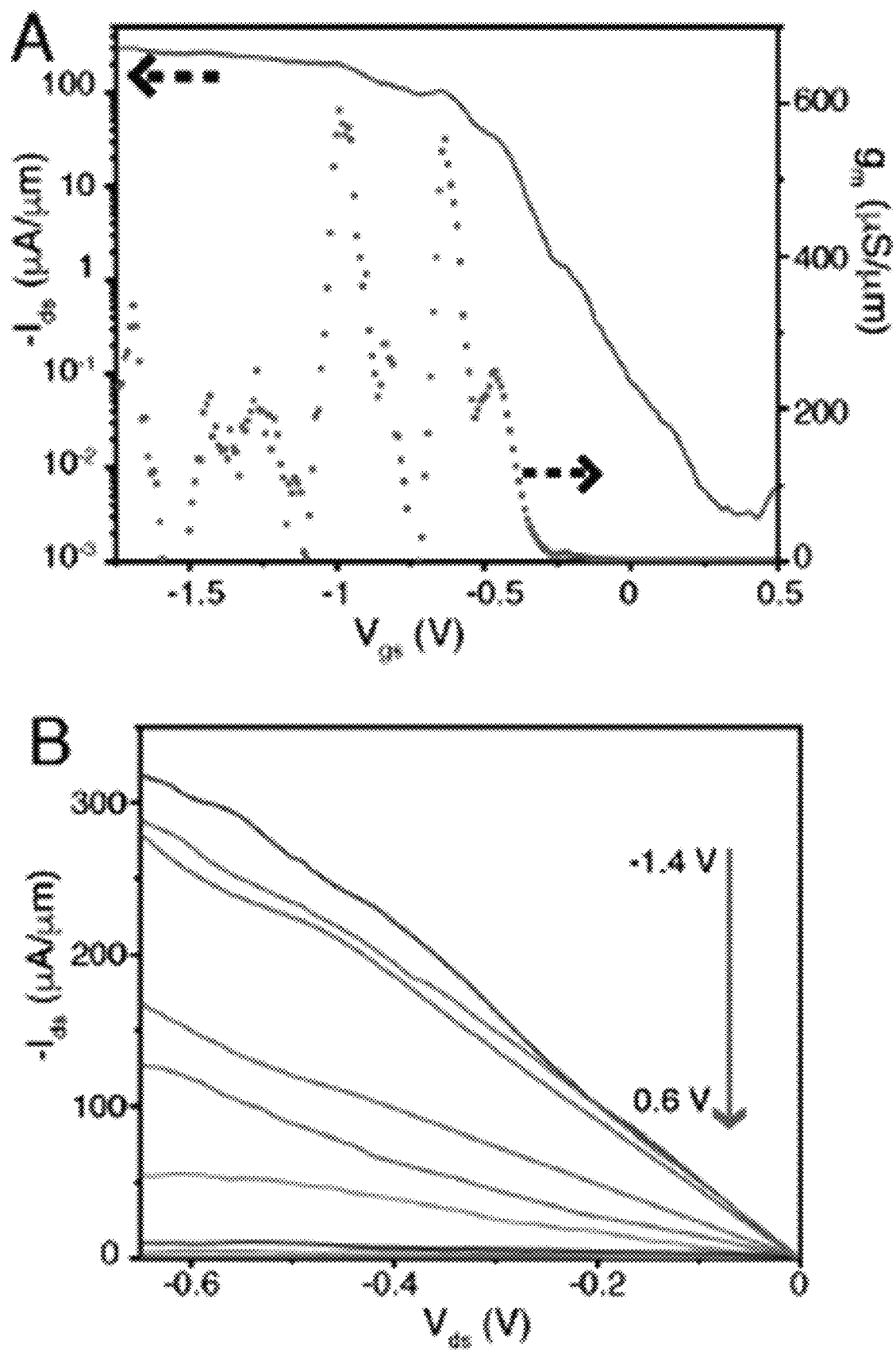
FIG. 55 shows transport performance for the multichannel DNA-free CNT FET with 100-nm channel length. (A) $I_{ds}$-$V_{gs}$ curve (left axis, plotted in logarithmic scale) and gm-$V_{gs}$ curve (right axis, plotted in linear scale) at Vds of −0.5 V. Both $I_{ds}$ and gm were normalized to the inter-CNT pitch. (B) $I_{ds}$-$V_{gs}$ curve. Different colored lines represent distinct $V_{gs}$. $V_{gs}$ was ranging from −1.4 V to 0.6 V, at a step of 0.2 V.

When the channel length was scaled to 100 nm, we achieved an $I_{on}$ of 300 µA/µm (at a $V_{ds}$ of −0.5 V and a $V_{gs}$ of −1.5 V) and a subthreshold swing of 160 mV per decade (FIG. 55). Both the $G_{on}$ and the $g_m$ values were thus promoted to 0.6 mS/µm. The DNA-free CNT FETs exhibited comparable $I_{on}$ to that of thin-film FETs from aligned CVD-grown CNT arrays, even at 60% smaller CNT density [~40 CNTs/pm versus >100 CNTs/µm in]. The effective removal of the contaminations, such as DNA and metal ions, and the shorter channel length contributed to the high $I_{on}$. Notably, a previous study had fixed CNTs directly with the source and drain electrodes. Because contamination could not be fully removed from the electrode contact areas, the on-state performance ($g_m$ and $G_{on}$) decreased by a factor of 10.

Figure 42:
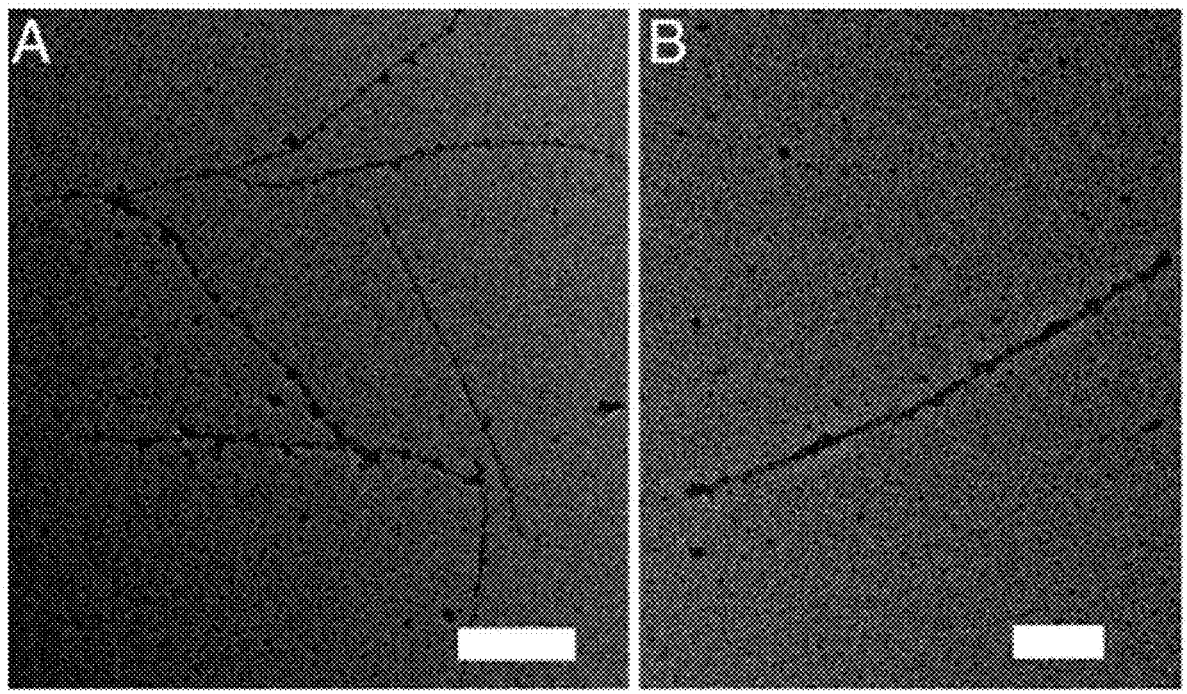
FIG. 42 shows zoomed-out (A) and zoomed-in (B) TEM images of the DNA-wrapped CNTs. The scale bar in A is 200 nm. The scale bar in B is 100 nm.
Figure 43:
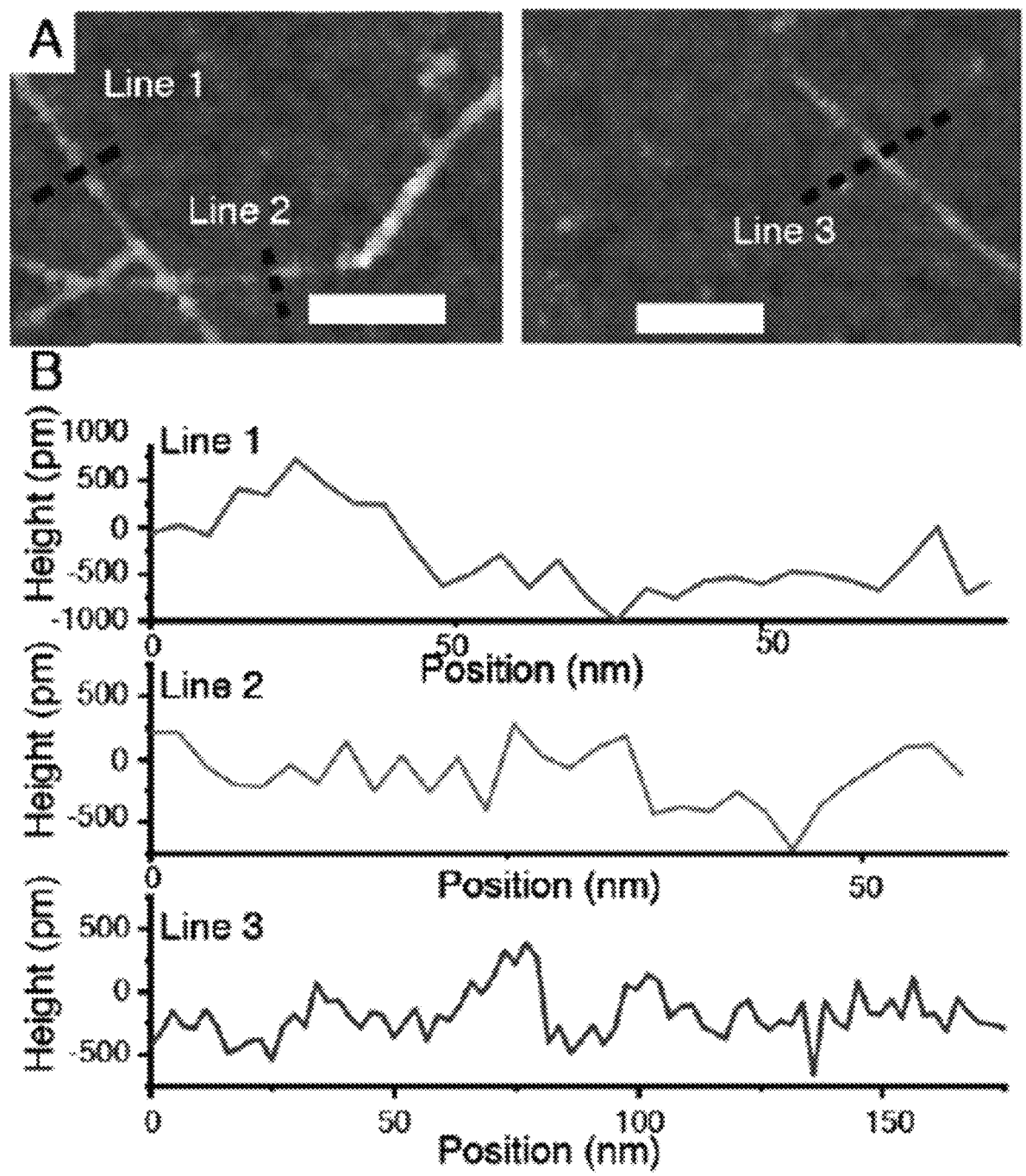
FIG. 43 shows height profiles of CNTs. AFM images (A) and corresponding height profiles (B) for three different CNTs. Dashed lines in (A) represent the positions for the height profiles in (B). The scale bar is 100 nm. As shown in the height profiles, the CNT diameter distribution is ranging from less than 1 nm to ~1.5 nm.

Furthermore, the subthreshold swing difference between the multichannel (average value of 103 mV per decade) and the single-channel CNT FETs (average value of 86 mV per decade in FIG. 50) was reduced to 17 mV per decade. Theoretical simulations suggest that, under identical gate constructs, the uneven diameter of CNTs and the alignment disorder (including crossing CNTs) raise the subthreshold swing We observed a wide diameter distribution of the DNA-wrapped CNTs in atomic force microscopy (AFM) images (FIG. 43) and transmission electron microscopy images (FIG. 42) Hence, the small subthreshold swing difference above indicated that effective gate modulation and evenly spaced CNT alignment were achieved using SHINE (i.e., the absence of crossing or bundling CNTs within the channel area).

Statistics across all the operational multichannel DNA-free FETs exhibited a $V_{th}$ of −0.32±0.27 V, an $I_{on}$ of 25 to 154 µA/µm (at a $V_{ds}$ of −0.5 V and a $V_{gs}$ of −1.5 V), and a subthreshold swing of 103±30 mV per decade. Different amounts of narrow CNTs (i.e., those with diameters<1 nm) within FETs led to the wide distribution of $I_{on}$. Because the Schottky barrier and the bandgap increase with narrower CNT diameters, lower CNT conductance is often observed in narrow CNTs than in those with diameters>1.4 nm.

When comparing the transport performance differences between DNA-containing and DNA-free FETs (FIG. 57), we observed a largely negatively shifted $V_{th}$ (−2 versus −0.32

V), a higher drain-to-source current density ($I_{ds}$) at a positive $V_{gs}$ (mostly 10 to 200 versus 0.1 to 10 nA/μm), and a more than one order of magnitude smaller $g_m$ (4 to 50 versus 70 to 370 μS/μm). Thus, high-concentration ssDNAs and metal ions within multichannel FETs deteriorated the transport performance. Thermal annealing did not fully eliminate the adverse effect because of the presence of insoluble and nonsublimable annealing products, such as metal phosphates.

Figure 60:
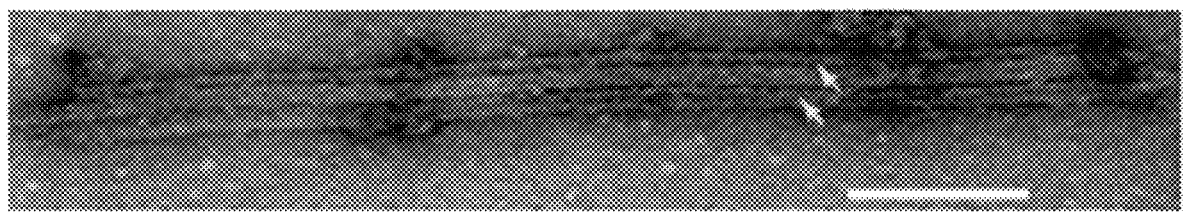
FIG. 60 shows a zoomed-out TEM image for the assembled fixed-width CNT array with 16 nm inter-CNT pitch. Fixed-width DNA template exhibited a prescribed width around 34 nm. Yellow arrows indicate the assembled CNTs on DNA templates. The scale bar is 100 nm.
Figure 61:
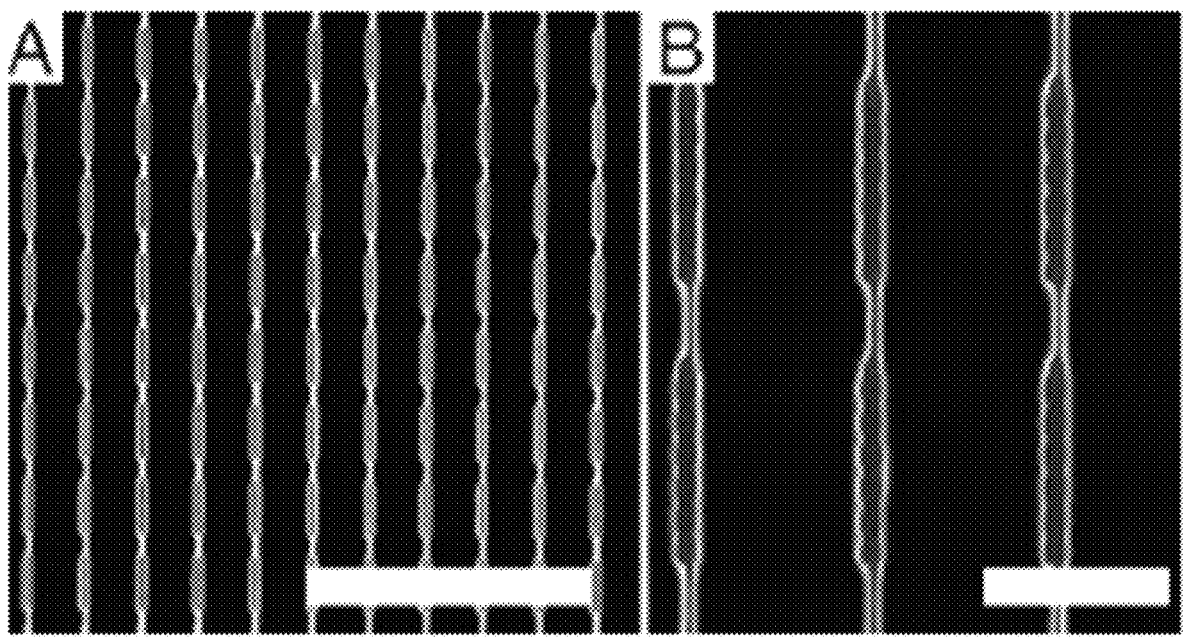
FIG. 61 shows a zoomed-out (A) and zoomed-in (B) SEM images for the PMMA cavities on flat Si substrate. The scale bars are 10 μm in (A) and 2 μm in (B)

When CNT-decorated DNA templates were deposited onto a flat Si wafer, random orientations of DNA templates were formed through unconfined surface rotation We solved this issue by using 3D polymeric cavities to confine the surface orientation during large-area placement. We first assembled fixed-width CNT arrays (FIG. 60) with a prescribed inter-CNT pitch of 16 nm (two CNTs per array). Next, in a typical 500 μm-by-500 μm write-field on the PMMA-coated Si substrate (with >20 write-fields on a 0.35-cm² substrate), we fabricated densely aligned crenelated parapet-like PMMA cavities (cavity density of ~2×10⁷ cavities/cm²; FIG. 61). The minimum and the maximum designed widths of an individual cavity along the z direction were 180 and 250 nm, respectively.

Figure 41:
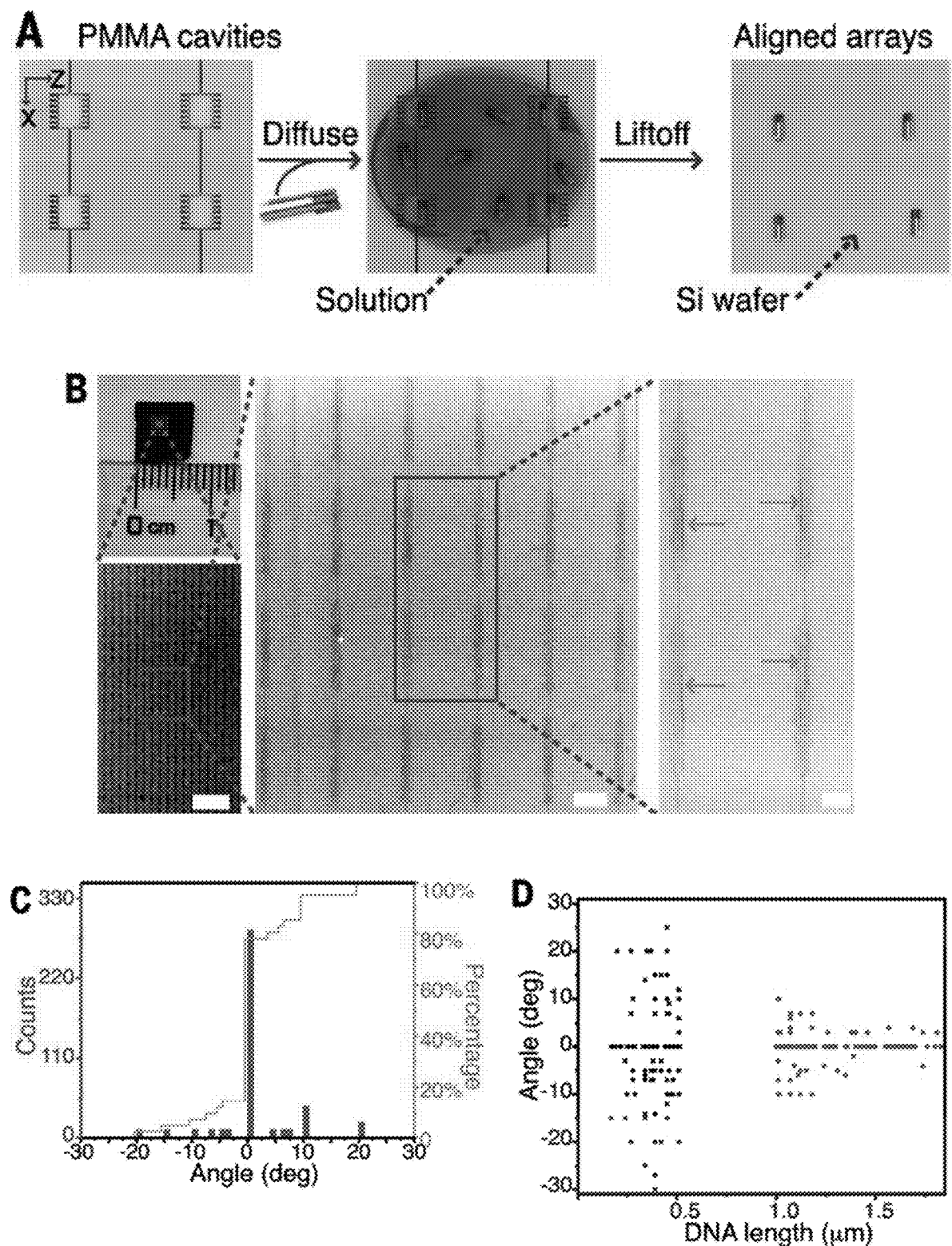
FIG. 41 shows a centimeter-scale oriented placement of fixed-width arrays. (A) Design schematic for the oriented placement of the fixed-width CNT-decorated DNA templates on a Si substrate. From left to right, the panels show fabricating cavities on a spin-coated PMMA layer, depositing CNT-decorated DNA templates onto the PMMA cavities, and liftoff to remove the PMMA layer. (B) From left to right, zoomed-out and zoomed-in optical and SEM images of the aligned structures on the Si wafer after PMMA liftoff. The scale bars in the bottom left, middle, and right images are 10, 1, and 0.5 μm, respectively. The rectangles indicate the selected areas for zoomed-in views. The arrows in the right panel indicate the aligned arrays. (C) The statistics of counts (left axis) and the cumulative percentages (right axis) for the aligned structures in (B) at each specific orientation. (D) Plot of angular distributions of the aligned arrays versus the lengths of the DNA templates.
Figure 62:
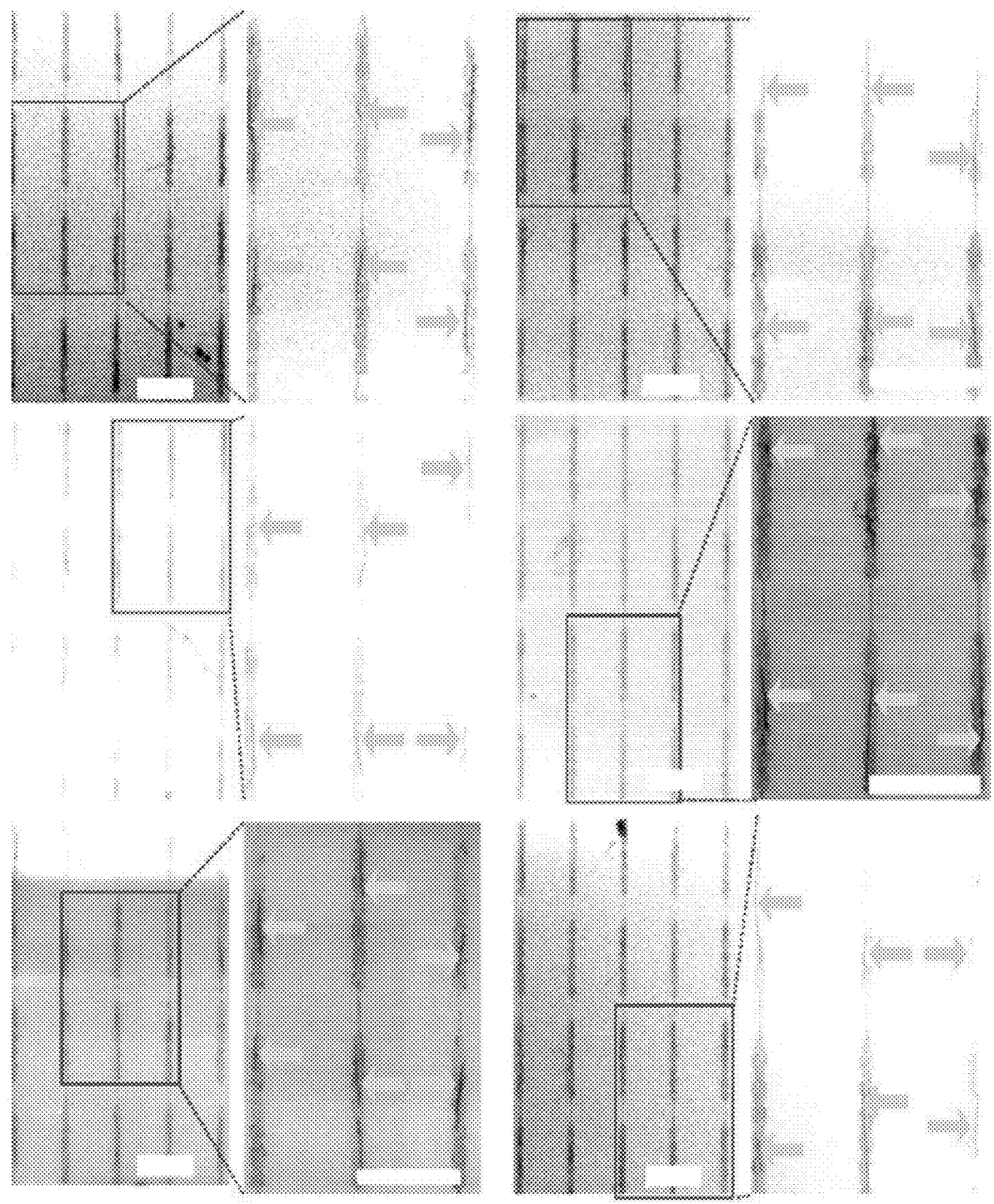
FIG. 62 shows SEM images for CNT-decorated DNA templates aligned on 120 cavities. The circles in the zoomed-out SEM images indicate the zoomed-in positions. The arrows in the zoomed-in SEM images indicate the aligned DNA templates. The scale bars are 2 μm.

After DNA deposition and PMMA liftoff (FIG. 41A), >85% of the initial cavities (~600 cavities were counted) were occupied by DNA templates (FIG. 41B and FIG. 62) The measured angular distribution-defined as the difference between the longitudinal axis of the DNA templates and the x direction of the substrate—was 56% within ±1° and 90% within ±7° (FIG. 41C), per scanning electron microscopy (SEM)-based counting of all of the remaining DNA templates within the 600 cavity sites. This value included improvable effects from the fabrication defects of PMMA cavity sites, the variation during DNA placement, and any disturbance from PMMA liftoff. Notably, the angular distribution was still improved compared with previous large-scale placement of DNA-templated materials. CNTs were not visible under SEM because they were embedded within the DNA trenches and shielded from the SEM detector by DNA helices.

Figure 63:
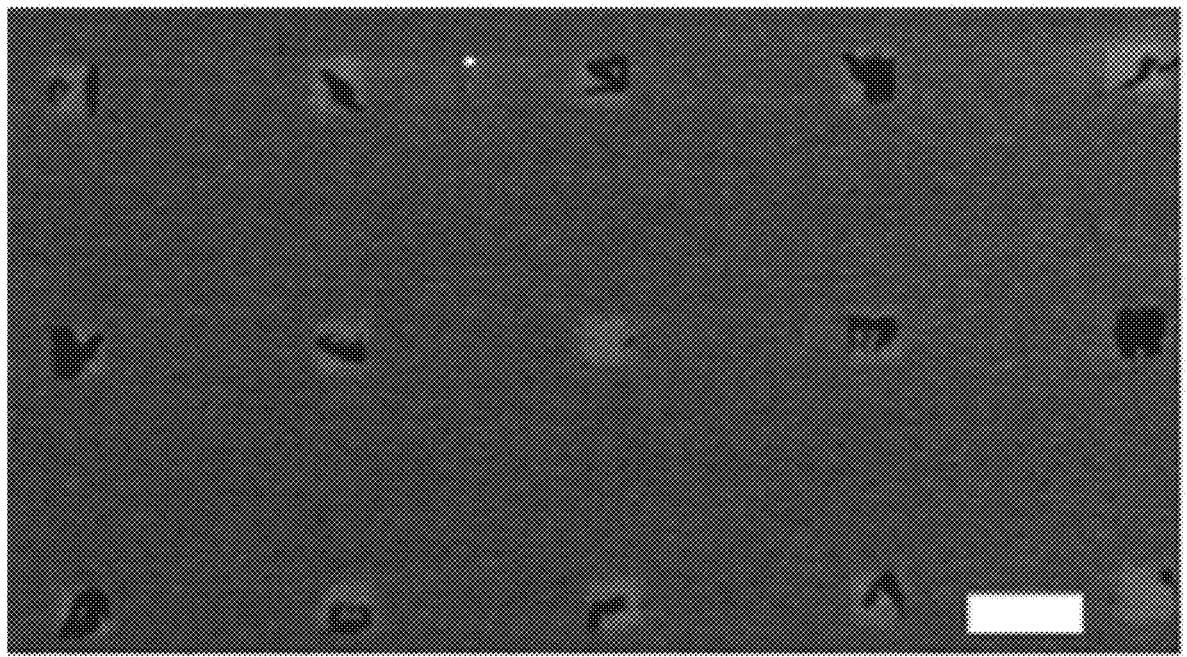
FIG. 63 shows SEM image for DNA templates placed within the rectangular PMMA cavity sites. The width of the PMMA cavities was designed as 2 μm at a length-to-width aspect ratio of 1. The scale bar is 4 μm.

Both the lengths of the DNA templates and the aspect ratio of the PMMA cavities affected the angular distribution. Longer DNA templates (with lengths>1 μm) exhibited narrower angular distribution (0°±3.4° in FIG. 41D) than those of shorter DNA templates (with lengths<500 nm, 1°±11° in FIG. 41D) Additionally, PMMA cavities with a higher length-to-width aspect ratio (i.e., 10 in FIG. 41B and FIG. 61) provided better orientation controllability than those with a lower aspect ratio (i.e., 1 in FIG. 63). Hence, longer DNA templates, as well as a higher length-to-width aspect ratio of PMMA cavities, were beneficial in improving the angular distribution. Because PMMA cavities were wider than the DNA templates, we observed up to three DNA templates, as well as the offset of DNA templates along the x and z directions, within a few PMMA cavities. Notably, DNA templates did not fully cover the individual PMMA cavities, even for a saturated DNA solution.

Figure 64:
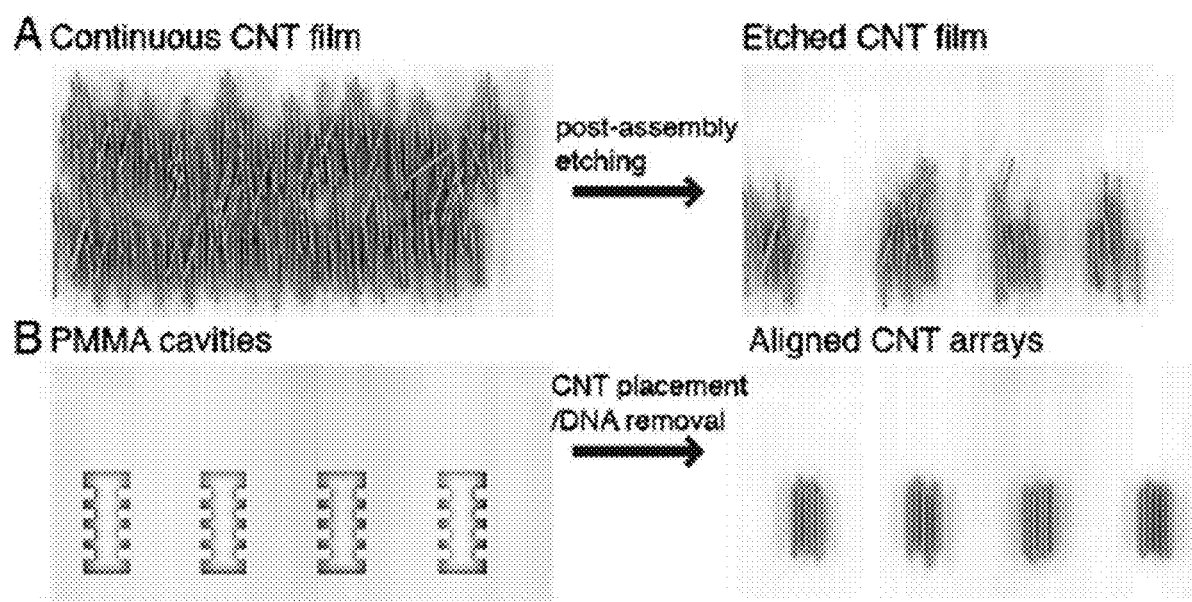
FIG. 64 shows different approaches for preparing CNT arrays with designer array width, inter-array spacing and CNT counts over centimeter-scale. (A) continuous CNT film (with random orientations) is processed with a post-assembly etching step to produce designer array width, inter-array spacing, and CNT counts. (B) placing fixed-width CNT arrays (assembled using 3D DNA nanotrenches) within the pre-fabricated PMMA cavities, followed by PMMA liftoff and DNA removal, can produce array geometries without a post-assembly etching.

Two-dimensional hydrophilic surface patterns, with shape and dimensions identical to those of the DNA structures, could direct the orientation of the deposited DNA structures. However, it is difficult to design patterns adaptive to DNA templates with variable lengths. In contrast, effective spatial confinement relies mainly on the lengths of the DNA templates and the aspect ratio of PMMA cavities and is applicable to irregular template lengths. Therefore, the anisotropic biotemplated CNT arrays with uneven lengths could be aligned along the longitudinal direction of the cavities (supplementary text section S4.1 and FIG. 64).

To further promote the on-state performance, scaling the inter-CNT pitch into <10 nm may be beneficial. However, at 2-nm inter-CNT pitch, the enhanced electrostatic interactions may affect the on-off switching. Therefore, the correlation between the inter-CNT pitch and performance metrics of CNT FETs needs to be verified. Combined with large-area fabrications through conventional lithography and directed assembly of block copolymers, biomolecular assembly could provide a high-resolution paradigm for programmable electronics over large areas. The hybrid electronic-biological devices may also integrate electrical stimuli and biological inputs and outputs, producing ultra-scaled sensors or bioactuators.

A 7 μL as-prepared CNT-decorated DNA template solution was deposited onto a 1-cm2 sized silicon substrate followed by stepwise rinsing in 50%, 95%, and 99.5% ethanol. The sample was imaged on a Multimode SPM (Vecco) via tapping mode.

A 7 μL as-prepared CNT-decorated DNA template solution was deposited onto a 1-cm2 sized silicon substrate followed by stepwise rinsing in 50%, 95%, and 99.5% ethanol. The dried silicon substrate was imaged on a HITACHI S-4800 system operated at 5 kV under high vacuum.

A 0.6 μL as-prepared (without purification) CNT-decorated DNA template was diluted into 5 μL water and adsorbed onto glow discharged carbon-coated TEM grids for 4 min. Then the remaining solution was wiped away, followed by negative staining using 6 μL 2% aqueous uranyl formate solution (7 sec) and a quick water rinsing. Imaging was performed using an JEOL 2100 operated at 120 kV.

A 0.35-cm2 sized silicon substrate was firstly spin-coated with polymethyl methacrylate (PMMA) resist (Allresist AR-P 672.045) and patterned using electron-beam lithography (Raith Voyager, with an exposure dose of 325 μC/cm2 at 0.9 nA current). The patterned PMMA layer was developed in a 1:3 mixture of methylisobutyl ketone (MIBK) and isopropyl alcohol (IPA), followed by rinsing with IPA and drying with nitrogen. The solution of CNT-decorated DNA templates was dipped onto the lithography defined patterns. Then the silicon substrate was kept in a sealed chamber for 2 hours. During this process, the DNA templates diffused into the PMMA cavities. Si substrate was then dried, followed by PMMA liftoff, leaving only the aligned DNA templates on the flat Si substrate. Finally, we imaged the sample with SEM.

We applied the following process to remove the assembled DNA templates while retaining CNT alignment: (1) fabricating alignment markers on Si wafer with electron-beam lithography; (2) depositing the CNT-decorated DNA templates onto Si wafer and registering the positions with low-magnification SEM; (3) fabricating metal bars to fix the assembled CNT arrays onto Si wafer; and (4) removing DNA templates by continuously water and H2O2 rinsing. We used the length-sorted CNTs (semiconducting purity ~95%) from NIST, and the length range was 300 to 1000 nm.

A 230-nm thick PMMA layer was spun onto Si wafer (with 300-nm thick SiO2 on top) and the fine alignment marker pattern was written using Raith Voyager system (at a current of 9 nA and a dose of 780 μC/cm2). The alignment marker pattern was developed in a 1:3 mixture of MIBK and IPA. A stacking titanium/gold film (5-nm thick titanium and 45-nm thick gold) was deposited using DE400 e-beam evaporation system. Liftoff was performed at room temperature in acetone without sonication, followed by an ethanol rinsing. The sample was dried with nitrogen.

A 9 µL solution of the assembled CNT-decorated DNA templates was dipped onto the oxygen plasma-cleaned marked Si wafer, followed by the incubation at room temperature for 1 hour. After that, the remaining solution was blown away with nitrogen. The Si wafer was sequentially rinsed with 75%, 95%, and 99% ethanol, followed by air drying. The Si wafer was then imaged under SEM at low magnification (operated at 1 kV). The positions of the CNT-decorated DNA templates were registered relative to the alignment markers.

A 230-nm thick PMMA layer was spun onto the CNT-deposited Si wafer. The metal bar pattern was written using Raith Voyager system (at a current of 400 µA and a dose of 750 µC/cm2). The metal bar pattern was developed in a 1:3 mixture of MIBK and IPA. A stacking film of 5-nm thick titanium and 60-nm thick gold was deposited using DE400 e-beam evaporation system. Liftoff was performed at room temperature in acetone without sonication, followed by an ethanol rinse. The sample was dried with nitrogen. DNA removal was then performed by sequential water and H2O2 (5%) rinsing For FET construction, we used electron-beam lithography for fabricating the source, drain, and gate electrodes onto the assembled CNT arrays and constructing the electrical contact pads.

Source/drain electrodes. A 230-nm thick PMMA layer was spun onto the cleaned CNT arrays, followed by writing the source and the drain electrodes patterns with Raith Voyager system (at a current of 400 pA and a dose of 750 µC/cm2). The source and the drain electrodes patterns were developed in a 1:3 mixture of MIBK and IPA. A stacking film of 0.5-nm thick titanium, 30-nm thick palladium, and 40-nm thick gold was deposited using DE400 e-beam evaporation system. Liftoff was performed at room temperature in acetone without sonication, followed by an ethanol rinsing. The sample was dried with nitrogen.

Gate electrode. Next, a layer of 230-nm thick PMMA layer was spun onto the Si wafer, followed by writing the channel patterns with Raith Voyager system (at a current of 400 pA and a dose of 750 µC/cm2). One-nanometer thick yttrium metal film was first deposited using DE400 e-beam evaporation system Liftoff was performed at 70° C. in acetone. Then, the yttrium film was oxidized in air at 250° C.

A 230-nm thick PMMA layer was then spun onto the $Y_2O_3$-coated Si wafer, followed by writing the gate electrode pattern with Raith Voyager system (at a current of 400 pA and a dose of 750 µC/cm2). The gate electrode pattern was developed in a 1:3 mixture of MIBK and IPA. Eight-nanometer thick HfO2 was next deposited using atomic layer deposition at 90° C. A 15-nanometer thick palladium film was finally deposited using DE400 e-beam evaporation system. Liftoff was performed at room temperature in acetone without sonication, followed by ethanol rinsing. The sample was dried with nitrogen.

Contact pads. For fabricating large electrical contact pads connecting to the electrodes, a 230-nm thick PMMA layer was first spun onto the sample. Contact pad pattern was exposed using Raith Voyager system (at a current of 9 nA and a dose of 750 µC/cm2). The contact pad pattern was developed in a 1.3 mixture of MIBK and IPA, then dried with nitrogen A stacking film of 5-nm thick titanium and 70-nm thick gold was deposited using DE400 e-beam evaporation system. Liftoff was performed at room temperature in acetone without sonication, followed by ethanol rinsing. And the sample was dried with nitrogen.

Electrical measurements for CNT FETs. The electrical measurements for the constructed CNT FETs were performed at room temperature in a probe station connected to a Keithley 4200 SCS Semiconductor Device Analyzer.

Introducing ssDNAs at channel interface. After fabricating the source and drain electrodes, we applied the following processes to introduce ssDNAs at channel interface and construct the gate dielectric accordingly: (1) a 230-nm thick PMMA layer was spun onto the wafer, followed by writing the gate electrode pattern with Raith Voyager system (at a current of 400 pA and a dose of 750 µC/cm2). The gate electrode pattern was developed in a 1:3 mixture of MIBK and IPA; (2) 10 µL solution of L1 (1 µM) was dipped onto the fixed CNT arrays, and incubated at room temperature for 1.5 h; (3) the remaining solution was blown away with nitrogen, followed by sequential rinsing with 75%, 95%, and 99%, ethanol, (4) 9-nanometer thick HfO2 medium was grown within the developed pattern through atomic layer deposition (Savannah) at 90° C.; and (5) a 15-nanometer thick palladium film was then deposited using DE400 e-beam evaporation system. Liftoff was performed at room temperature in acetone without sonication, followed by ethanol rinsing. The sample was dried with nitrogen.

After that, constructing contact pads and the electrical measurements were performed using identical approaches in Supplementary Sect. S1.6.

To further improve the FET performance, it is necessary to increase the on-state conductance while lower the subthreshold swing. Towards higher on-state conductance, several strategies have been suggested in previous reports. For example, when applying the gate overdrive (Vgs-Vth) up to 6 V, on-current density around 0.5 mA/pm has been reported (at 100 nm Lch). However, at ultra-scaled technology nodes, the supply voltage (Vdd) is typically below 1 V, which limits the available voltage range of Vgs. Meanwhile, raising CNT density to 500 CNTs/µm, as well as scaling the channel length to 10 nm, could also provide on current density of 0.8 mA/µm (at gate overdrive around 3 V). But high CNT density also presents challenges in promoting the conductance per CNT, because of the strong inter-CNT screening effect at high CNT density. As a result, the on-state conductance per CNT is lowered to less than 2 µA/CNT, around 10% of the single-channel CNT FET at identical channel length. Besides, subthreshold swing around 500 mV/decade is produced due to the destructive crossing CNTs and diameter distribution at high CNT density. Using 3D DNA nanotrenches, the formation of crossing CNTs could be minimized. Hence, by exploring the correlation between inter-CNT pitch and the on-state conductance, the optimized inter-CNT pitch could balance the competing needs on higher CNT density and lower inter-CNT interactions. Together with the short channel design, the on-state conductance of multichannel CNT FETs will be maximized.

Decreasing the subthreshold swing to 60 to 80 mV/decade is recommended by the International Technology Roadmap for Semiconductors. Notably, decreasing the subthreshold swing should not degrade the on-state conductance. In the CNT FETs constructed from CNT thin films, subthreshold swing of 60 mV/decade has been reported. However, the on-current density is as small as 100 nA/µm, which does not meet the requirements of high-performance electronics. Based on our demonstration in the manuscript, the subthreshold swing of the multichannel CNT FETs is slightly higher than that of single-channel CNT FETs. Because of the absence of crossing CNTs, the small difference value (17 mV/decade) is ascribed to the diameter distribution. Hence, when CNTs with uniform diameter are available, 31) DNA nanotrenches could in principle build multichannel CNT FETs with subthreshold swing identical to the single-channel CNT FETs. Further decreasing the subthreshold swing to the thermionic limit of 60 mV/decade or even smaller relies on the gate efficiency. For instance, using a graphene-contacted design, single-channel CNT FETs have been demonstrated with both subthreshold swing of sub-60 mV/decade and on-state current of 8 µA/CNT Integrating the graphene-contacted design within multichannel CNT FETs may promote the on/off switching than current metal contacts.

Higher CNT purity is also necessary for improving the successful rate of FET construction. For the projected CNT FET architecture, 95% semiconducting CNT purity produces 73% successful rate in the six-channel CNT FETs, and 54% successful rate in the twelve-channel FETs. Considering high-performance micro-processors contain up to 1 billion FETs, a semiconducting CNT purity higher than 99.99999998% is necessary to ensure all the FETs are operational.

In digital circuits, it is quite common to have larger spacing values outside individual FETs than the semiconductor channel pitch. In Si circuits, for example, Samsung's 14 nm technology node has a uniform fin pitch of 49 nm (FET width is less than 250 nm); whereas the spacing between two nearest fins in neighboring FETs can be as large as 700 nm, 13 times larger than the fin pitch. Similar spacing differences have also been observed in Intel's 22 nm, 14 nm, and 10 nm Si technology nodes. The larger spacing between two nearest FETs may accommodate the interconnect metal wires And the larger inter-FET spacing is adjustable tailored to different circuit architectures.

Existing thin-film approaches employ a post-assembly etching approach to prepare arrays with designer width, inter-array spacings, and CNT counts over centimeter-scale. Continuous CNT film first covers the entire surface of the substrate. Then a post assembly etching (via oxygen plasma) is introduced to etch away CNTs out of the channel area (FIG. 64A). Hence, both array width and inter-array spacing could be fabricated tailored to FET/circuit layouts. Importantly, inter-array spacing is necessary to prevent stray conducting pathways and accommodate metal contacts. It has been reported that the presence of CNTs beneath the contacts lowers the adhesion of metal contacts to the substrate surface. After the post-assembly etching, full surface coverage CNT films are etched into several individual arrays with width around 50 nm to a few hundred nanometers, tailored to FET layouts.

In comparison, we demonstrate a different strategy to achieve the designer width, inter-array spacings, and CNT counts in the manuscript (FIG. 64B). Using 3D DNA nanotrenches, CNT arrays are assembled with designer inter-CNT pitches and CNT counts on fixed-width 3D DNA templates And the CNT counts per array could be programmed by different template widths. The assembled CNT arrays are then placed within the pre-fabricated PMMA cavities, followed by PMMA liftoff and DNA removal. Without post-assembly etching, prescribed inter-array spacing is demonstrated after the centimeter-scale oriented placement. Because the inter-array spacing is defined by lithography of PMMA cavities, in principle, it could be further scaled to sub-200 nm. Therefore, the maximum array density is around 105 arrays/cm, close to that of Si fins at 10-nm technology node (less than 3×105 arrays/cm). The array width and inter-array spacing from our approach are also similar to those fabricated from the post-assembly etching approach.

While one or more embodiments have been shown and described, modifications and substitutions may be made thereto without departing from the spirit and scope of the invention. Accordingly, it is to be understood that the present invention has been described by way of illustrations and not limitation Embodiments herein can be used independently or can be combined.

All ranges disclosed herein are inclusive of the endpoints, and the endpoints are independently combinable with each other. The ranges are continuous and thus contain every value and subset thereof in the range Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A nanotube spectrometer array comprising:
a substrate comprising a plurality of block receivers;
a plurality of photodetectors arranged in an array, each photodetector comprising:
a single wall carbon nanotube disposed on the substrate in a block receiver, such that the single wall carbon nanotube is disposed laterally along the block receiver;
a source electrode disposed on a first terminus of the single wall carbon nanotube;
a drain electrode disposed on a second terminus of the single wall carbon nanotube, such that the source electrode and the drain electrode are separated from each other by a photoreceiver portion of the single wall carbon nanotube; and
a gate electrode disposed on the substrate such that substrate is interposed between the gate electrode and the single wall carbon nanotube,
wherein the single wall carbon nanotube in each photodetector comprises a different chirality, so that each photodetector absorbs light with a maximum photon absorptivity at a difference wavelength that is based on the chirality of the single wall carbon nanotube of the photodetector.

2. The nanotube spectrometer array of claim 1, wherein the substrate comprises an element from Group III, Group IV, or Group V of the periodic table of elements.

3. The nanotube spectrometer array of claim 1, wherein the single wall carbon nanotubes in adjacent photodetectors are arranged parallel to one another.

4. The nanotube spectrometer array of claim 1, wherein the single wall carbon nanotubes comprise an E11 to E44 photoabsorption from 200 nm to 2000 nm.

5. The nanotube spectrometer array of claim 1, wherein a separation pitch of the single wall carbon nanotubes in adjacent photodetectors is from 10 nm to 100 nm.

6. The nanotube spectrometer array of claim 1, wherein the nanotube spectrometer array includes from 2 to 200 different chiralities of single wall carbon nanotubes.

7. The nanotube spectrometer array of claim 1, wherein the photodetectors cover a surface area from 0.1 $\mu m^2$ to 100 $\mu m^2$.

8. A process for making a nanotube spectrometer array, the process comprising:
providing a composition comprising a plurality of nanocomposites disposed in a solvent, individual nanocomposites comprise a single wall carbon nanotube and a surfactant disposed on the single wall carbon nanotube, and the single wall carbon nanotube of the nanocomposites in the composition comprise a plurality of chiralities;
subjecting the composition to compositional separation such that the nanocomposites are separated based on chirality of the single wall carbon nanotubes into separate single chirality products, such that each single chirality product:
comprises single wall carbon nanotubes consisting essentially of a single chirality disposed in solvent, and
has a different chirality of single wall carbon nanotubes than other single chirality products;
independently, for each or a selected single chirality product:
adding single stranded DNA and surfactant solubilizing agent to the single chirality product, wherein a nucleobase sequence of the single stranded DNA added is different for each single chirality product so that each different chirality is present with single stranded DNA that has different nucleobase sequence;
removing the surfactant from the single wall carbon nanotube with the surfactant solubilizing agent; and
disposing, after removing the surfactant, the single stranded DNA on the single wall carbon nanotube to form ssDNA-wrapped SWCNT comprising the single stranded DNA disposed on the single wall carbon nanotube,
such that each different chirality has disposed on the single wall carbon nanotube the single stranded DNA with different nucleobase sequence;
making a scaffold that comprises-DNA arranged in alternating walls separated by a trench between neighboring walls, the trench bounded by walls and a floor;
forming single stranded DNA anchor disposed on the floor;
contacting the floor with the single chirality products;
hybridizing the ssDNA-wrapped SWCNT to the single stranded DNA anchor when a nucleotide base sequence of the ssDNA-wrapped SWCNT complements a nucleotide base sequence of single stranded DNA anchor;
forming a duplex DNA from hybridizing the ssDNA-wrapped SWCNT to the single stranded DNA anchor to anchor the ssDNA-wrapped SWCNT to the floor through the duplex DNA, such that the ssDNA-wrapped SWCNT is laterally disposed along the floor in the trench to form a unit cell; such that a DNA nanotube block is formed and comprises an array of unit cells;

forming a plurality of photodetectors arranged in array by:
  disposing the DNA nanotube block on a substrate, the substrate comprising a block receiver;
  receiving the DNA nanotube block in the block receiver;
  removing the scaffold and DNA nanotube block from the single wall carbon nanotube to provide the single wall carbon nanotube disposed in the block receiver;
  forming a source electrode on a first terminus of the single wall carbon nanotube;
  forming a drain electrode on a second terminus of the single wall carbon nanotube, the first terminus separated from the second terminus by a photoreceiver portion of the single wall carbon nanotube,
wherein each photodetector comprises the single wall carbon nanotube, the source electrode, and the drain electrode disposed on the substrate,
to make the nanotube spectrometer array that comprises the plurality of photodetectors arranged in the array.

9. The process of claim 8, wherein the substrate comprises an element from Group III, Group IV, or Group V of the periodic table of elements.

10. The process of claim 8, wherein the single wall carbon nanotubes in adjacent photodetectors are arranged parallel to one another.

11. The process of claim 8, wherein the single wall carbon nanotubes comprise an E11 to E44 photoabsorption from 200 nm to 2000 nm.

12. The process of claim 8, wherein a separation pitch of the single wall carbon nanotubes in adjacent photodetectors is from 10 nm to 100 nm.

13. The process of claim 8, wherein the nanotube spectrometer array includes from 2 to 200 different chiralities of single wall carbon nanotubes.

14. The process of claim 8, wherein the photodetectors cover a surface area from 0.1 $\mu m^2$ to 100 $\mu m^2$.

15. The process of claim 8, further comprising forming a gate electrode on the substrate.

\* \* \* \* \*

SEQUENCE LISTING

```
<160> NUMBER OF SEQ ID NOS: 2

<210> SEQ ID NO 1
<211> LENGTH: 56
<212> TYPE: DNA
<213> ORGANISM: Artificial Sequence
```

```
<220> FEATURE:
<223> OTHER INFORMATION: Lab synthesized, Single strand DNA

<400> SEQUENCE: 1
gatgcgaggc tattctgtgt gtgtgtgtgt gtgtgtgtgt gtgtgtgtgt gtgtgt        56

<210> SEQ ID NO 2
<211> LENGTH: 30
<212> TYPE: DNA
<213> ORGANISM: Artificial Sequence
<220> FEATURE:
<223> OTHER INFORMATION: Single strand DNA Lab synthesized

<400> SEQUENCE: 2
agaatagcct cgcatcccac ttaccactta                                    30
```